United States Patent
Yoshizawa et al.

(10) Patent No.: US 6,804,153 B2
(45) Date of Patent: Oct. 12, 2004

(54) SEMICONDUCTOR MEMORY DEVICE INTERNALLY GENERATING INTERNAL DATA READ TIMING

(75) Inventors: Tomoaki Yoshizawa, Hyogo (JP); Koji Nii, Hyogo (JP); Susumu Imaoka, Hyogo (JP)

(73) Assignees: Renesas Technology Corp., Tokyo (JP); Renesas Device Design Corp., Hyogo (JP)

( * ) Notice: Subject to any disclaimer, the term of this patent is extended or adjusted under 35 U.S.C. 154(b) by 0 days.

(21) Appl. No.: 10/445,934

(22) Filed: May 28, 2003

(65) Prior Publication Data

US 2004/0042275 A1 Mar. 4, 2004

(30) Foreign Application Priority Data

Aug. 30, 2002 (JP) ..................................... 2002/254526

(51) Int. Cl.[7] .............................................. G11C 16/04
(52) U.S. Cl. .................... 365/189.07; 365/210; 365/205
(58) Field of Search ........................... 365/189.07, 210, 365/205, 230.06, 203

(56) References Cited

U.S. PATENT DOCUMENTS 6,069,831 A * 5/2000 Jang et al. .................. 365/210

FOREIGN PATENT DOCUMENTS

| JP | 5-504848 | 7/1993 |
| JP | 9-259589 | 10/1997 |
| WO | WO 92/03824 | 3/1992 |

* cited by examiner

*Primary Examiner*—David Lam
(74) *Attorney, Agent, or Firm*—McDermott Will & Emery LLP

(57) ABSTRACT

A dummy circuit including a plurality of dummy cells is provided in correspondence to a predetermined number of word lines. When either one of corresponding word lines are selected, a dummy bit line equal in load to a normal bit line is driven using the plurality of dummy cells included in this dummy circuit. A potential of this dummy bit line is detected by a dummy sense amplifier, and a sense enable signal is generated. Therefore, it is possible to accurately detect a sense timing irrespectively of array architecture.

20 Claims, 29 Drawing Sheets

F I G. 2 1
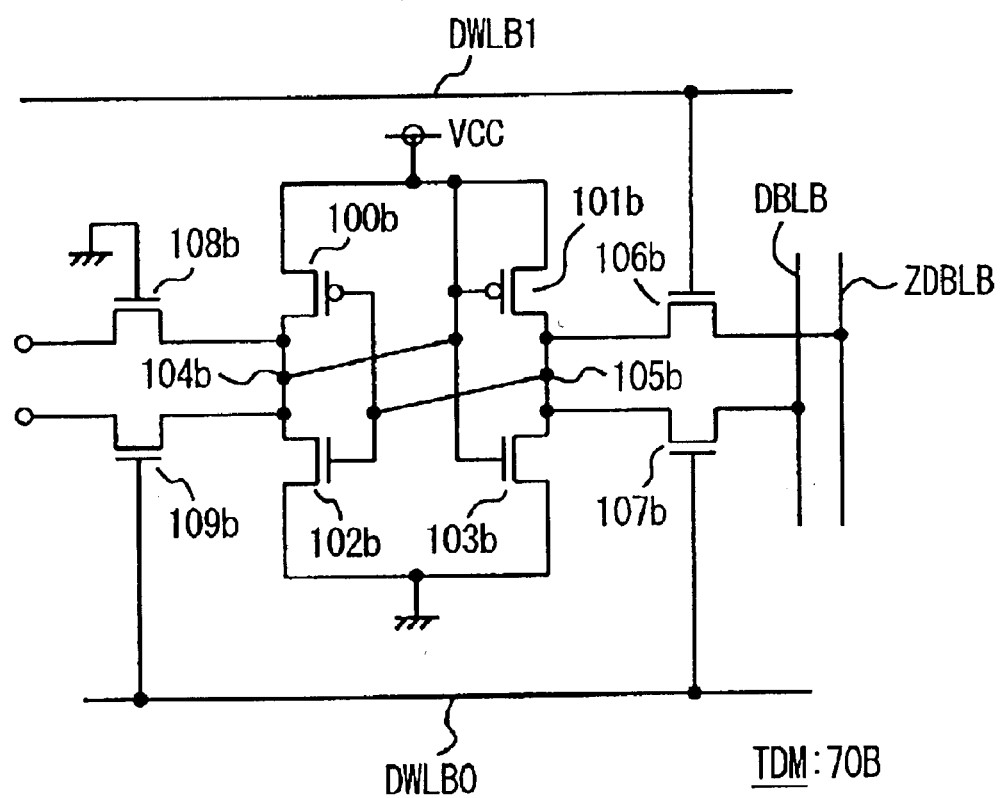

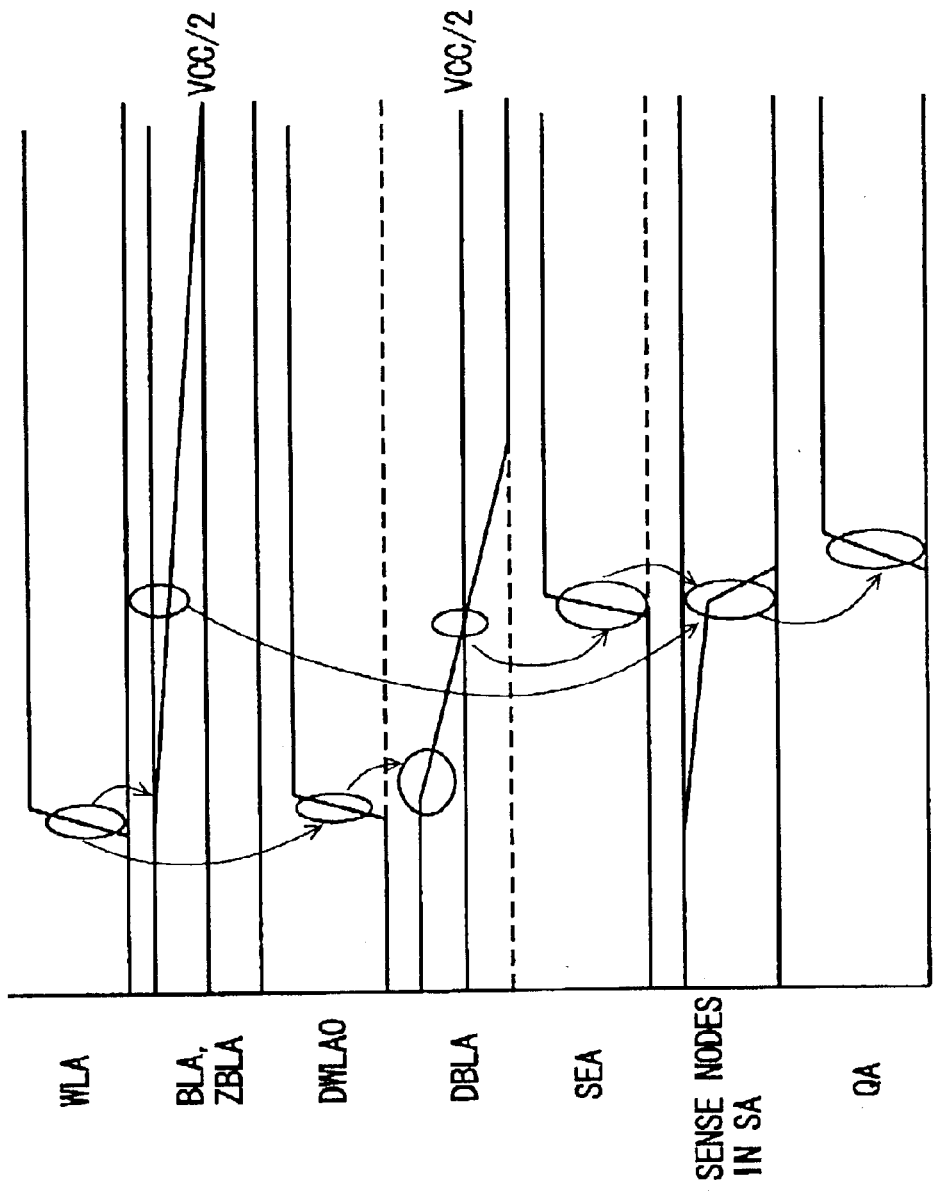

2-PORT SRAM MAY BE USED

SEMICONDUCTOR MEMORY DEVICE INTERNALLY GENERATING INTERNAL DATA READ TIMING

BACKGROUND OF THE INVENTION

1. Field of the Invention

The present invention relates to a semiconductor memory device, and more particularly to a semiconductor memory device having data of a selected memory cell read internally using a sense amplifier. More specifically, the present invention relates to the configuration for optimizing an activation timing of the sense amplifier.

2. Description of the Background Art

There is known, as a semiconductor memory device, a static memory (SRAM: Static Random Access Memory) having internal circuitry operating statically. Since the internal circuitry of the SRAM operates statically, and a memory cell row and a memory cell column are selected substantially at the same time, the SRAM can ensure high speed access and is widely used for high speed processing.

FIG. 34 is a schematic diagram showing the configuration of a main part of a conventional SRAM. In FIG. 34, SRAM cells MC are arranged in rows and columns in a memory array. In FIG. 34, SRAM cells MC are arranged in (m+1) rows and (n+1) columns. Word lines WL0 to WLm are arranged in correspondence to the respective rows of SRAM cells MC, and bit line pairs BL0, ZBL0 to BLn, ZBLn are arranged in correspondence to the respective columns of SRAM cells MC.

Word line drivers WD0 to WDm are arranged in correspondence to word lines WL0 to WLm, respectively, and column select gates CSG0 to CSGn are arranged in correspondence to bit line pairs BL0, ZBL0 to BLn, ZBLn, respectively.

Word line drivers WD0 to WDm, each of which is formed of an inverter, drive word lines WL0 to WLm in accordance with word line select signals WX0 to WXm generated on the basis of an X address signal, respectively. Accordingly, when selected, word line select signals WX0 to WXn are at L level (logical low level) and a selected word line is driven to H level (logical high level).

Column select gates CSG0 to CSGn are made conductive in accordance with column select signals Y0 to Yn generated on the basis of a Y address signal, respectively, and couple corresponding bit line pairs BL0, ZBL0 to BLn, ZBLn to an internal bus DB, respectively, when made conductive. Internal bus DB includes internal bus lines DBL and ZDBL transferring complementary data signals, respectively.

A sense amplifier SA that differentially amplifies signals on complementary data bus lines DBL and ZDBL of internal data bus DB, is provided to internal data bus DB. Sense amplifier SA differentially amplifies complementary data signals transferred from selected bit lines to internal data bus DB and generates internal read data DO in response to activation of a sense enable signal SE from a delay adjustment element DLE.

Delay adjustment element DLE, which is formed of, for example, cascaded delaying inverters, adjusts the delay time of a sense trigger signal SATR and generates sense enable signal SE. Sense trigger signal SATR applied to delay adjustment element DLE is generated on the basis of either a bit line precharge signal or a word line activation signal when data is read.

Sense amplifier SA is provided in correspondence to a predetermined number of bit line pairs. Specifically, this memory cell array is divided into a plurality of column blocks in accordance with the number of internal read data bits. Sense amplifiers SA are arranged in correspondence to the respective column blocks, and sense enable signal SE from delay adjustment element DLE is commonly applied to sense amplifiers SA which are arranged in correspondence to the respective column blocks. Now, the operation of the SRAM shown in FIG. 34 in data read will be briefly described.

In accordance with an X address signal, one of word line select signals WX0 to WXm is driven into a selected state. Word line WL designated by this X address signal is driven into a selected state by corresponding one of word line drivers WD0 to WDm, and the stored data of SRAM cells MC connected to selected word line WL is read to corresponding bit line pairs BL0, ZBL0 to BLn, ZBLn. SRAM cell MC has the configuration as will be described later, and stores complementary data at internal storage nodes, respectively. The potential of one bit line of each of bit line pairs BL0, ZBL0 to BLn, ZBLn becomes lower than a precharge potential in accordance with L level data. Here, all of bit line pairs BL0, ZBL0 to BLn, ZBLn are precharged to power supply voltage level in a standby state.

In SRAM, the X address signal and the Y address signal are applied in parallel. A column select operation is performed in parallel to a word line select operation. In accordance with the Y address signal, one of column select signals Y0 to Yn is driven into a selected state, one of column select gates CSG0 to CSGn corresponding to a selected column is made conductive responsively, and the bit line pair on the selected column are connected to data bus lines DBL and ZDBL of internal data bus DB, respectively.

When a certain time passes since selection of the word line, the potential difference between the selected bit lines is developed and the potential difference in internal data bus DB is developed accordingly and reaches a potential difference which can be sensed by sense amplifier SA. Delay adjustment element DLE adjusts the sense timing of sense amplifier SA. When the potential difference of internal data bus DB becomes sufficiently large, delay adjustment element DLE activates sense enable signal SE to start the sensing operation of sense amplifier SA. Sense amplifier SA differentially amplifies the complementary data signals on internal data bus DB and generates internal read data DO.

FIG. 35 shows an example of the configuration of sense amplifier SA shown in FIG. 34. In FIG. 35, sense amplifier SA includes: cross-coupled P-channel MOS transistors (insulating gate field effect transistors) PQa and PQb; cross-coupled N-channel MOS transistors NQa and NQb; a P-channel MOS transistor PQc for coupling a sense node SNa to internal data bus line DBL in response to sense enable signal SE; a P-channel MOS transistor PQd for coupling a sense node SNb to an internal data bus line ZDBL in response to sense enable signal SE; and an N-channel MOS transistor NQc for coupling the sources of MOS transistors NQa and NQb to a ground node in accordance with sense enable signal SE.

P-channel MOS transistor PQa is connected between a power supply node and sense node SNa, and has a gate thereof connected to sense node SNb. P-channel MOS transistor PQb is connected between the power supply node and sense node SNb, and has a gate thereof connected to sense node SNb. N-channel MOS transistor NQa is connected between sense node SNa and MOS transistor NQc, and has a gate thereof connected to sense node SNb. N-channel MOS transistor NQb is connected between sense node SNb and MOS transistor NQc, and has a gate thereof connected to sense node SNa.

Internal data bus lines DBL and ZDBL are 1-bit data bus lines included in data bus DB shown in FIG. 34, and coupled to a selected bit line pair through the column select gate in data read, respectively.

Sense amplifier SA further includes a holding circuit HK for latching the signals at sense nodes SNa and SNb and generating internal read data DO. The operation of sense amplifier SA shown in FIG. 35 will now be described with reference to a timing chart shown in FIG. 36.

When data is read, bit lines BBL and ZBL are precharged to power supply voltage level by a bit line load circuit, not shown. In accordance with the X address signal, the potential of word line WL corresponding to an addressed row rises to H level, the data of memory cells MC connected to this selected word line is read to bit lines BL and ZBL. In SRAM cell MC, complementary data of H-level data and L-level data are stored in a pair of storage nodes, respectively. The bit line connected to the storage node storing the L-level data is discharged through the driver transistor of memory cell MC and the voltage level of the bit line is lowered.

In parallel to this word line select operation, a column select operation is performed. Bit lines BL and ZBL corresponding to a selected column are connected to internal data bus lines DBL and ZDBL, respectively. Since sense enable signal SE is at L level, MOS transistors PQc and PQd are rendered conductive and the potential changes of bit lines BL and ZBL are transmitted to sense nodes SNa and SNb, respectively. As indicated at time ta, if the potential difference between sense nodes SNa and SNb is small, a sense margin is small and sense amplifier SA may possibly malfunction.

However, at time tb, the potential difference between bit lines BL and ZBL is sufficiently developed and the potential difference between sense nodes SNa and SNb is sufficiently developed, accordingly. Then, sense enable signal SE is activated. Accordingly, in sense amplifier SA, MOS transistors PQc and PQd enter a nonconductive state, sense enable signal SE applied at the gate of MOS transistor NQc attains H level, and sense amplifier SA is activated.

When sense amplifier SA is activated, sense nodes SNa and SNb are disconnected from internal data bus lines DBL and ZDBL, respectively. Accordingly, sense amplifier SA performs a sensing operation at high speed in accordance with a "charge confinement" scheme, and differentially amplifies the potential difference generated between sense nodes SNa and SNb, whereby the sense node at high voltage level is driven to power supply voltage level and that at low voltage level is driven to ground voltage level. While sense enable signal SE is active, sense amplifies SA latches the amplified data at sense nodes SNa and SNb.

Holding circuit HK latches the data of sense nodes SNa and SNb and generates internal read data DO. Holding circuit HK may latch the data of sense nodes SNa and SNb in response to, for example, a timing signal such as sense enable signal SE, or may be formed of a latch circuit such as an inverter latch. By utilizing holding circuit HK, it is intended to adjust a data output timing and to secure an output data definite period.

When activated, sense amplifier SA latches the amplified data at nodes SNa and SNb. Therefore, sense amplifier SA is referred to as "latch type sense amplifier". Where this latch type sense amplifier is employed in place of a general current mirror type sense amplifier, the following advantages can be obtained. As the integration degree of a semiconductor integrated circuit is improved following the development of a processing technique to miniaturization, it is strongly demanded to reduce power consumption in view of prevention of malfunction caused by heat generation and other(s). This is true for a memory such as SRAM. If a current mirror type sense amplifier is utilized, a current source is necessary. While data is held, a steady current flows to increase current consumption. However, latch type sense amplifier SA causes a current flow only during a sensing operation of differentially amplifying the voltages of sense nodes SNa and SNb. No current flows after sense nodes SNa and SNb are driven to the levels of a power supply voltage VCC and a ground voltage. Therefore, compared with a current mirror type sense amplifier, latch type sense amplifier SA can greatly reduce power consumption.

Further, during the sensing operation, sense amplifier SA is only required to drive sense nodes SNa and SNb due to isolation of sense nodes SNa and SNB from internal data bus DB. Therefore, sense amplifier SA can drive small load at high speed, and therefore, can perform the sensing operation at high speed with low current consumption.

To optimize the operation timing of sense amplifier SA for performing a sensing operation at a faster timing with a sufficient sense margin, delay adjustment element DLE shown in FIG. 34 is provided.

Latch type sense amplifier SA has a feature of large gain, in addition to the advantage that no direct current flows after data amplification operation. As the gain is larger, sense amplifier SA can sense the potential difference between the bit lines even if the potential difference is very small. However, once sense amplifier SA senses and amplifies data, latch type sense amplifier SA turns into a latching state and, therefore, the sensed/amplified data cannot be corrected.

Therefore, if a sensing operation is started at, for example, time ta shown in FIG. 36 before the potential difference between the bit lines, i.e., between sense nodes SNa and SNb becomes sufficiently large, latch type sense amplifier SA might possibly sense data accurately due to a variation in the characteristics of the transistors constituting sense amplifier SA, and the influence of noise generated on a bit line. To prevent such erroneous reading, delay adjustment element DLE activates sense enable signal SE at time tb at which the potential difference between the bit lines is sufficiently developed. However, if time tb at which this sensing operation starts is late, the data read rate decreases and high rate data reading cannot be achieved.

Therefore, a method of finely adjusting the activation timing of sense enable signal SE by using delay adjustment element DLE shown in FIG. 34 is generally employed. However, with delay adjustment element DLE, if the potential difference between the bit lines changes due to variation in memory cell transistor characteristics after manufacturing, a correct sense timing cannot be set. If such a variation is considered, it is necessary to determine an activation timing for activating sense enable signal SE on the assumption of the worst case. If the worst case is assumed, the sense activation timing is delayed and high speed data read cannot be achieved, To solve such problem, there is proposed a method of reflecting a variation in memory cell transistor characteristics in generation of sense enable activation timing utilizing dummy cells, as disclosed in, for example, Japanese Patent Laying-Open No. 9-259589. According to this prior art reference, dummy cells are arranged corresponding to the rows of normal memory cells, and the load (parasitic capacitance) of the bit line arranged for the dummy cells are made equal to that of the bit line connected to the normal memory cells. Word lines are common to the normal memory cells and the dummy memory cells.

Therefore, the potential changing rate of a dummy bit line becomes equal to that of a normal bit line, so that the potential of the dummy bit line is sensed for activating a sense amplifier. A dummy cell and a normal memory cell share a word line and are equal in delay time required until selection of a word line. Thus, when the sensing operation of the sense amplifier starts, the potential difference between a normal bit line pair is, for example, VDD/2 similar to that between the dummy bit lines, and is transmitted to the sense amplifier. Thus, the sense amplifier can perform a sensing operation while securing a sufficient sense margin.

However, by employing latch type sense amplifier SA, an accurate sensing operation can be achieved to differentially amplify the potential difference between the bit lines even if the potential difference is not more than VCC/2 because of the large gain of sense amplifier SA. Therefore, according to the method of the prior art reference, the sense margin becomes unnecessarily great, making it impossible to generate internal data at high speed. Besides, since the amplitude of each bit line is made unnecessarily large, a bit line charging current increases and current consumption increases.

Accordingly, in order to set an optimum sense timing, it is necessary to adjust the activation timing for activating sense enable signal SE in accordance with the configuration of a memory cell array. If the number of word lines and that of bit lines change (word-bit configuration changes), it is necessary to individually adjust the activation timing of a sense amplifier for various bit and word configurations. Where an automatic generation tool such as a memory compiler is used, circuit design is made while assuming the worst case. Thus, the sense timing of the sense amplifier cannot be optimized, and it is necessary to individually adjust the activation timing of the sense amplifier, disadvantageously deteriorating design efficiency.

Further, there is disclosed in National Patent Publication No. 5-504648 the architecture in which a dummy word line is provided separately from normal word lines, and is used to drive a plurality of dummy cells simultaneously driven into a selected state for discharging the potential of a dummy bit line. According to this configuration, the dummy bit line is driven by a plurality of dummy cells, the potential change rate of the dummy bit line can be set higher than that of a normal bit line, and a sense amplifier can be activated at a timing at which the potential difference of the normal bit line pair is small.

However, with the configuration of this prior art reference, the dummy word line is provided separately from the normal word lines, and a dummy word line decoder is activated at the same timing as that for activating a normal word line decoder, to drive the dummy word line into a selected state. Therefore, it is difficult to make the selection timing equal to each other for the dummy word line and for a normal word line, and the delay time generated until the dummy cells are driven into a selected state deviates from that until the normal memory cells are driven into a selected state. This results in a disadvantage in that the sense timing of the sense amplifier cannot be accurately set.

Further, the position of the dummy word line is fixed irrespectively of the position of a selected normal word line and the potential change rate of the dummy word line is always the same. Therefore, even if a normal word line near the sense amplifier is selected and the potential change of this bit line is transmitted to the sense amplifier relatively faster, the activation timing of the sense amplifier cannot be adjusted. Thus, the sense amplifier is activated under the state of a larger potential difference between the bit lines.

Particularly in this case, the sense amplifier is activated at a different timing for a different potential difference between the sense nodes of the sense amplifier according to the position of a selected normal word line. To sufficiently secure a sense margin, therefore, it is necessary to set the sense timing at a timing for activating the sense amplifier at a minimum potential difference. This results in a disadvantage that the potential difference between the bit lines becomes larger than required when a normal word line near the sense amplifier is selected.

Therefore, the method of this prior art reference, similarly to the former prior art reference, is required to adjust variation in individual circuits after manufacturing. In addition, the method of this prior art reference has the following disadvantages. The dummy word line is extended in the same direction as the extending direction of the normal word lines. A different number of dummy cells from that of the memory cells connected to each normal word line are connected to the dummy word line. The load of each normal word line differs from that of the dummy word line. As a result, the dummy bit lines and the normal bit lines cannot be driven at the same timing, and the sense timing cannot be accurately detected.

Thus, this prior art needs to individually adjust a dummy word line drive timing if the number of bit lines is made different, i.e., a bit configuration is made different and the load of the normal word line is changed.

SUMMARY OF THE INVENTION

It is an object of the present invention to provide a semiconductor memory device capable of readily, accurately and automatically generating a sensing operation activation timing within the semiconductor memory device.

It is another object of the present invention to provide a semiconductor memory device capable of automatically generating an optimum sense enable timing irrespectively of the word-bit configuration of the semiconductor memory device.

It is still another object of the present invention to provide a semiconductor memory device capable of accurately activating a sense amplifier at an optimum timing irrespectively of variation in transistor characteristics after manufacturing.

A semiconductor memory device according to a first aspect of the present invention includes: a plurality of normal memory cells arranged in rows and columns; a plurality of normal word lines arranged in correspondence to rows of the normal memory cells, and connecting to the normal memory cells in the corresponding rows, respectively; and a plurality of dummy cells arranged in correspondence to the normal word lines separately from the corresponding normal word lines, and arranged in alignment in at least one column in a column direction. Each of the dummy cells stores data of predetermined logic level.

The semiconductor memory device according to the first aspect of the present invention further includes: a dummy bit line arranged in correspondence to the column(s) of the plurality of dummy cells, and connecting to the plurality of dummy cells; a plurality of dummy cell select circuits each arranged in correspondence to a predetermined number of the normal word lines, and each driving a corresponding predetermined number of the dummy cells arranged correspondingly into a selected state when one of a corresponding predetermined number of normal word lines is selected; and a dummy sense circuit detecting a potential of the dummy bit line, and generating a sense activation signal for providing a sense timing for sensing the data of a selected normal memory cell.

A semiconductor memory device according to a second aspect of the present invention includes: a plurality of normal memory cells accessible through a plurality of ports and arranged in rows and columns; and a plurality of first port normal word lines arranged in correspondence to rows of the normal memory cells, and connecting to the normal memory cells in the corresponding rows, respectively. A first port normal word line is selected in accordance with an address signal in an access through a first port among the plurality of ports.

The semiconductor memory device according to the second aspect of the present invention further includes: a plurality of second port normal word lines arranged in correspondence to the rows of the normal memory cells, and connecting to the normal memory cells in the corresponding rows, respectively. A second port normal word line is selected in accordance with the address signal in an access through a second port among the plurality of ports.

The semiconductor memory device according to the second aspect of the present invention further includes: a plurality of first dummy cells arranged in correspondence to and isolatedly from the first port normal word lines, and arranged being aligned in at least one column in a column direction; a plurality of second dummy cells arranged in correspondence to and being isolated from the second port normal word lines, and arranged being aligned in at least one column in the column direction; a first dummy bit line arranged in correspondence to the first dummy cells, and having the first dummy cells commonly connected thereto; a second dummy bit line arranged in correspondence to the second dummy cells, and having the second dummy cells commonly connected thereto; a plurality of first dummy cell select circuits each arranged in correspondence to a predetermined number of the first port normal word lines, and each driving a corresponding set of the first dummy cells into a selected state when one of the corresponding first port normal word lines is selected; a plurality of second dummy cell select circuits each arranged in correspondence to a predetermined number of the second port normal word lines, and each driving a corresponding set of the second dummy cells into the selected state when one of the corresponding second port normal word lines is selected; a first dummy sense circuit for detecting a voltage on the first dummy bit line and generating a first sense amplifier activation signal for activating a sense amplifier for reading data of the memory cells accessed through the first port; and a second dummy sense circuit detecting a voltage on the second dummy bit line and generating a second sense amplifier activation signal for activating a sense amplifier for reading the data of the memory cells accessed through the second port.

A set of dummy cells is provided for each predetermined number of normal word lines, and a corresponding set of dummy cells is driven into a selected state in accordance with selection of a corresponding normal word line, and the dummy bit line is driven. Therefore, it is possible to always generate a voltage change accommodating for the array configuration on the dummy bit line, and to stably set a sensing operation start timing irrespectively of the array configuration. In particular, since the voltage changing rate of the dummy bit line is higher than that of the normal bit line, it is possible to activate the sense amplifier at a faster timing and to achieve high speed data access.

Further, the dummy cells at positions corresponding to the position of a selected normal word line are driven into a selected state. Therefore, it is possible to make the voltage changing of the dummy bit line corresponding to that of the normal bit line, to accurately generate a voltage change corresponding to voltage change in the sense amplifier on the dummy bit line, and to generate a sense activation timing for this sense amplifier.

Moreover, even in a multi-port memory, by arranging dummy cells in correspondence to a predetermined number of normal word lines for each port and arranging a dummy bit line in correspondence to each port, it is possible to accurately set a sense timing for each port.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 21 shows an example of the configuration of a 2-port dummy cell shown in FIG. 20;

FIG. 22 is a signal waveform diagram representing an operation of the semiconductor memory device according to the seventh embodiment of the present invention;

DESCRIPTION OF THE PREFERRED EMBODIMENTS

First Embodiment

Figure 1:
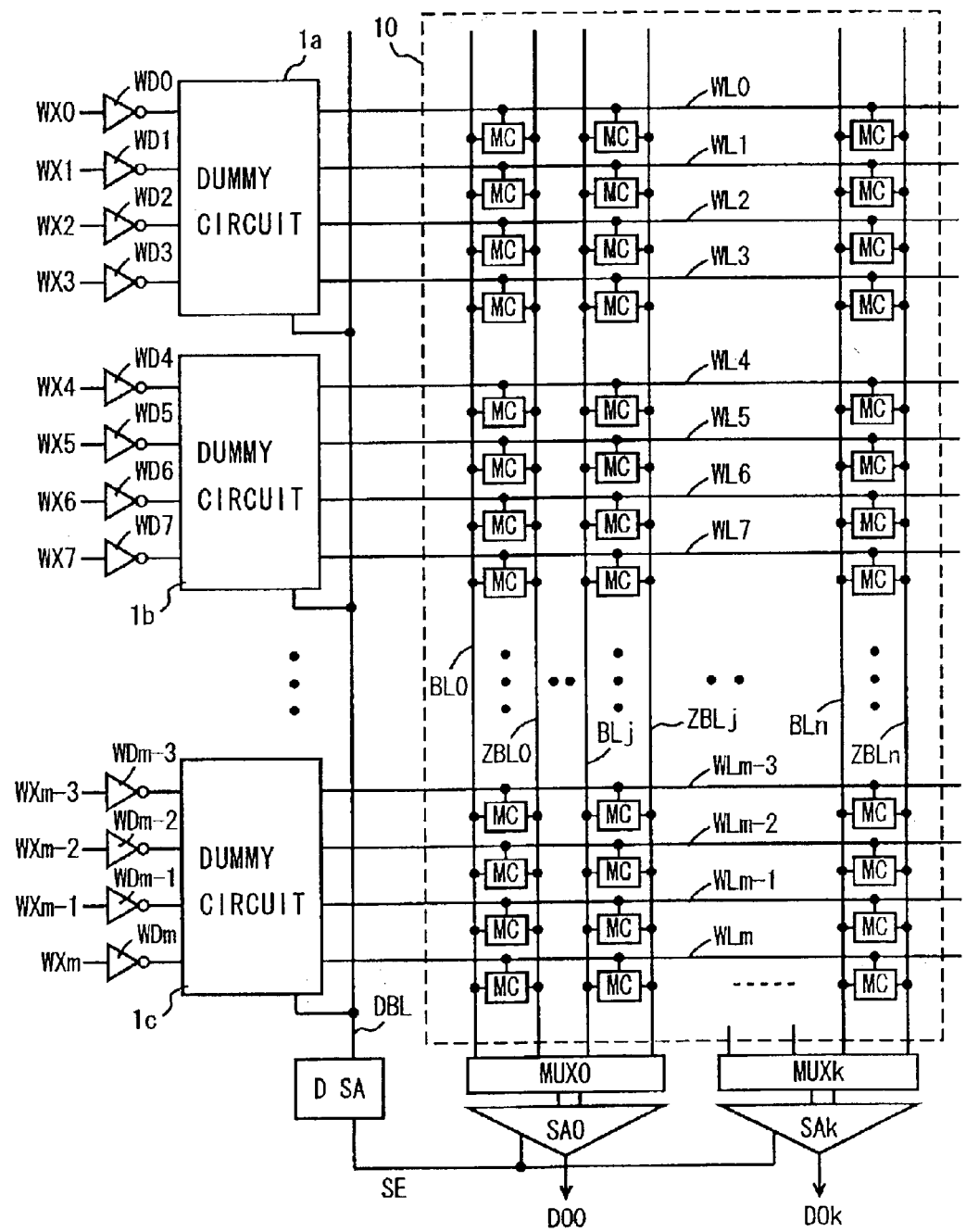
FIG. 1 is a schematic diagram showing the configuration of a main part of a semiconductor memory device according to the present invention.

FIG. 1 is a schematic diagram showing the configuration of a main part of a semiconductor memory device according to a first embodiment of the present invention. In FIG. 1, normal memory cells MC are arranged in rows and columns in a normal memory array 10. Word lines WL0 to WLm are arranged in correspondence to the respective rows of normal memory cells MC, and bit line pairs BL0, ZBL0 to BLn, ZBLn are arranged in correspondence to the respective columns of normal memory cells MC.

Each of multiplexers MUX0 to MUXk is provided in correspondence to a predetermined number of bit line pairs. Multiplexers MUX0 to MUXk include column select gates (CSG) provided in correspondence to bit line pairs BL, ZBL, respectively. Column select gates CSG are selectively made conductive in accordance with column select signal Y, not shown, and couple the bit line pairs arranged in correspondence to selected columns to corresponding sense amplifiers SA0 to SAk, respectively.

Sense amplifiers SA0 to SAk are provided in correspondence to multiplexers MUX0 to MUXk, respectively. Sense amplifiers SA0 to SAk sense, amplify and latch the memory cell data of the selected columns transmitted through multiplexers MUX0 to MUXk, and generate internal read data DO0 to DOk in response to activation of sense enable signal SE, respectively. Each of sense amplifiers SA0 to SAk has the configuration of the latch type sense amplifier shown in FIG. 35, and differentially amplifies a potential difference transferred from the bit line pair of the corresponding selected column when activated.

Word line drivers WD0 to WDm, which drive corresponding word lines WL0 to WLm into a selected state in accordance with word line select signals WX0 to WXm, are provided in correspondence to word lines WL0 to WLm, respectively. A dummy circuit 1 is provided in correspondence to a predetermined number of word lines. In FIG. 1, there is shown typically the configuration in which each dummy circuit is arranged in correspondence to a group of four word lines. Dummy circuit 1a is provided in correspondence to word lines WL0 to WL3, dummy circuit 1b is provided in correspondence to word lines WL4 to WL7, and dummy circuit 1c is provided in correspondence to word lines WLm-3 to WLm.

A dummy bit line DBL is commonly provided to dummy circuits 1a to 1c. Dummy bit line DBL is coupled to a dummy sense amplifier DSA. Dummy sense amplifier DSA generates sense enable signal SE in accordance with the voltage level of dummy bit line DBL.

Dummy sense amplifier DSA activates sense enable signal SE when the potential of dummy bit line DBL reaches a predetermined potential. Therefore, it suffices that dummy sense amplifier DSA has a voltage level detection function, and is formed of an inverter having the input logic threshold voltage set at predetermined voltage level, or a comparison circuit comparing a predetermined voltage with the voltage of dummy bit line DBL. This comparison circuit may have the configuration of the latch type sense amplifier, similarly to sense amplifier SA. By utilizing the configuration of the latch type sense amplifier, current consumption can be decreased. Further, by utilizing diode-connected MOS transistors as a circuit for generating the predetermined voltage, it is possible to reflect a variation in transistor characteristics in the voltage level of this predetermined voltage, and accordingly sense enable signal SE can be accurately activated when the potential of dummy bit line DBL reaches the predetermined voltage level.

Each of dummy circuits 1a to 1c discharges dummy bit line DBL at a higher rate than a discharging rate of normal bit line BL or ZBL when a word line of the corresponding group of word lines are driven to be selected. Each of dummy circuits 1a to 1c is formed of dummy cells equal in configuration to normal memory cells MC and these dummy cells are connected to dummy bit line DBL. Thus, the parasitic capacitance of dummy bit line DBL is made equal to that of normal bit line BL or ZBL. Accordingly, irrespectively of variation in a manufacturing step, the variation is reflected in the operation characteristics of dummy circuits 1a to 1c, and sense enable signal SE can be activated at an accurate timing without the influence of variation in process parameters.

Further, by arranging a plurality of dummy cells in each of dummy circuits 1a to 1c and driving dummy bit line DBL by the plurality of dummy cells, sense enable signal SE can be activated in accordance with the potential of dummy bit line DBL when the potential swing of the normal bit line is small. It is therefore possible to secure a sufficient margin for the activation timing of sense amplifier SA.

Moreover, since the dummy circuit corresponding to a selected word line is activated, it is possible to set a potential change propagation distance from dummy bit line DBL to dummy sense amplifier DSA to be substantially equal to that from the normal bit line to sense amplifier SA, and it is possible to accurately cause a potential change imitating the potential difference between the normal bit lines, on dummy bit line DBL.

Figure 2:
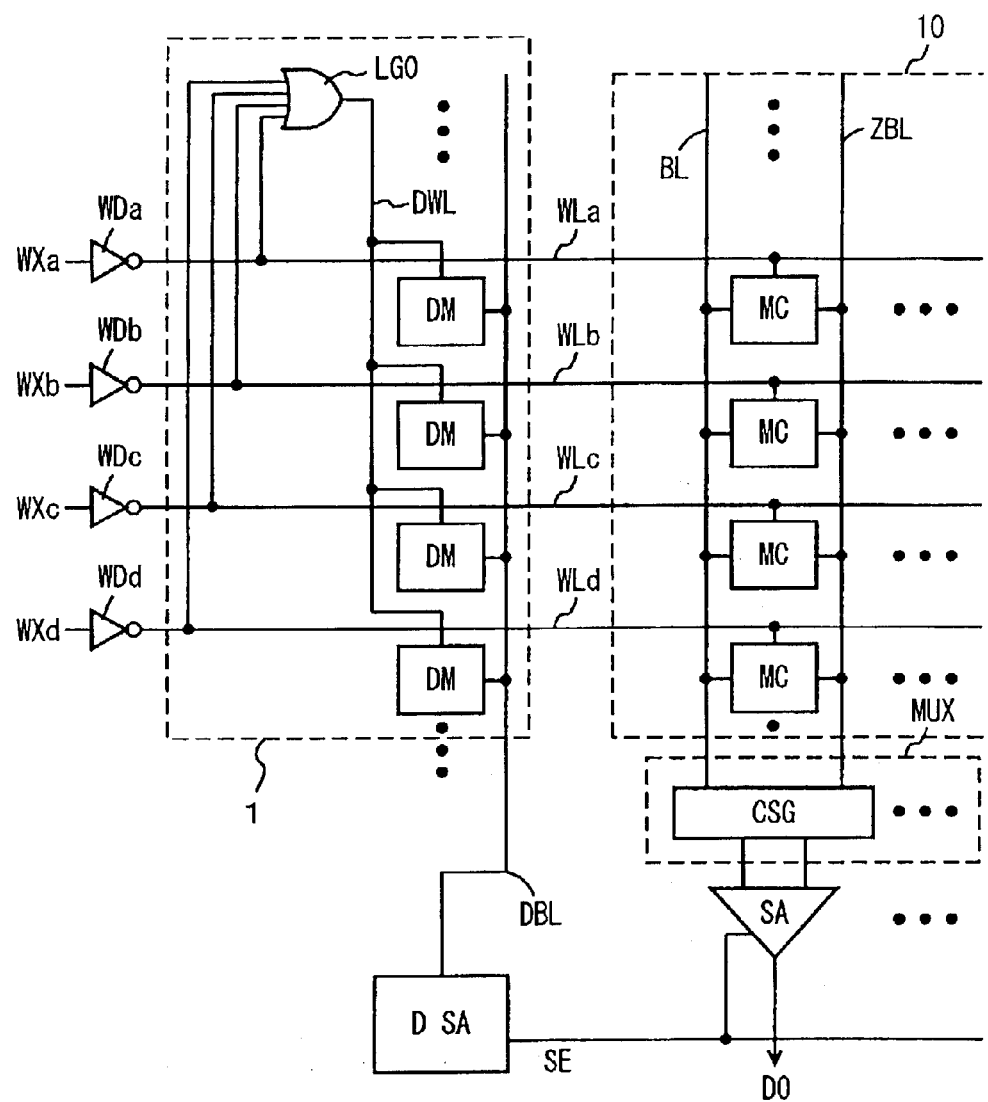
FIG. 2 is a schematic diagram showing the configuration of a dummy circuit according to a first embodiment of the present invention.

FIG. 2 is a schematic diagram showing the configuration of the dummy circuit shown in FIG. 1. Since dummy circuits 1a to 1c shown in FIG. 1 are equal in configuration, the configuration of dummy circuit 1 which is arranged in correspondence to word lines WLa to WLd is representatively shown in FIG. 2. Word line drivers WDa to WDd each formed of, for example, an inverter, are provided in correspondence to word lines WLa to WLd, respectively. Word line drivers WDa to WDd receive word line select signals WXa to WXd, and drive corresponding word lines WLa to WLd into a selected state (H level) when corresponding word line select signals WXa to WXd are selected (at L level), respectively. Therefore, word line select signals WXa to WXd are at L level when selected, while word line drive signals from word line drivers WDa to WDd are at H level when selected.

In normal memory array 10, bit lines BL and ZBL are disposed in correspondence to the column of normal memory cells MC. Bit lines BL and ZBL are coupled to sense amplifier SA through column select gate CSG included in multiplexer MUX.

Dummy circuit 1 includes: dummy cells DM arranged in correspondence to word lines WLa to WLd, respectively; a dummy word line DWL commonly coupled to dummy cells DM; and a logic circuit LG0 for driving word line DWL in accordance with signals on word lines WLa to WLd. Logic circuit LG0, which is formed of, for example, an OR circuit, drives dummy word line DWL into a selected state when one of word line drive signals on word lines WLa to WLd is in a selected state of H level.

Dummy cells DM are equal in configuration to normal memory cells MC, and are commonly coupled to dummy bit line DBL. Each dummy cell DM stores fixed data by interconnection, and discharges dummy bit line DBL when dummy word line DWL is selected.

Sense amplifier SA is a latch type sense amplifier as in the conventional sense amplifier SA. Dummy sense amplifier DSA is merely required to detect that the voltage level of dummy bit line DBL attains to lower than a predetermined voltage. As described above, dummy sense amplifier DSA may be formed of an inverter having the input logic threshold set at, for example, VCC/2, with VCC being the dummy bit line precharge voltage, or a comparison circuit comparing a reference voltage with the potential of dummy bit line DBL and a buffer circuit which buffers the output signal of this comparison circuit. In the following description, it is assumed that when the potential of dummy bit line DBL reaches the level of intermediate voltage VCC/2, dummy sense amplifier DSA drives the output signal thereof to H level.

Figure 3:
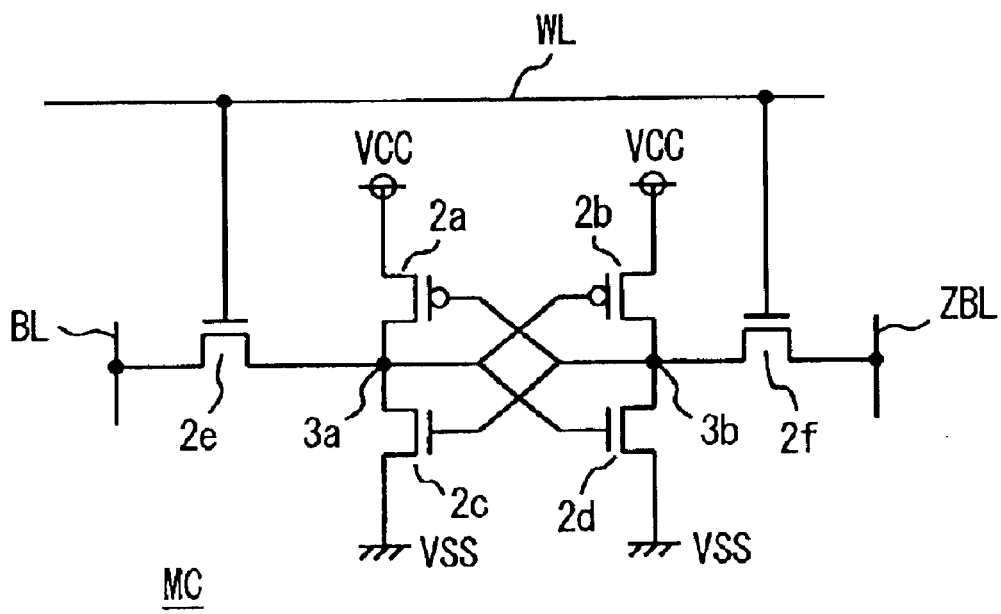
FIG. 3 shows an example of the configuration of a normal memory cell.

FIG. 3 shows an example of the configuration of normal memory cell MC shown in FIG. 2. In FIG. 3, normal memory cell MC includes: a P-channel MOS transistor 2a connected between a power supply node and a storage node 3a and having a gate connected to a storage node 3b; a P-channel MOS transistor 2b connected between the power supply node and storage node 3b and having a gate connected to storage node 3a; an N-channel MOS transistor 2c connected between storage node 3a and a ground node and having a gate connected to storage node 3b; and an N-channel MOS transistor 2d connected between storage node 3b and a ground node and having a gate connected to storage node 3a.

Storage nodes 3a and 3b store complementary data of H level (VCC level) and L level (ground voltage VSS level).

Normal memory cell MC further includes: an N-channel MOS transistor 2e selectively made conductive in response to a signal on word line WL and connecting storage node 3a to bit line BL when made conductive; and an N-channel MOS transistor 2f selectively made conductive in response to the signal on word line WL and connecting storage node 3b to bit line ZBL when made conductive.

In the configuration of normal memory cell MC shown in FIG. 3, storage nodes 3a and 3b store complementary data, respectively. Bit lines BL and ZBL are precharged at power supply voltage VCC level in a standby state. When word line WL is selected, MOS transistors 2e and 2f are made conductive, and storage nodes 3a and 3b are electrically connected to bit lines BL and ZBL, respectively. When storage node 3a stores L-level data and storage node 3b stores H-level data, a current flows from bit line BL to the ground node through MOS transistors 2e and 2c and the potential of bit line BL lowers. The potential of bit line ZBL does not lower since storage node 3b is at power supply voltage VCC level. The potential difference between bit lines BL and ZBL is differentially amplified by sense amplifier SA.

Figure 4:
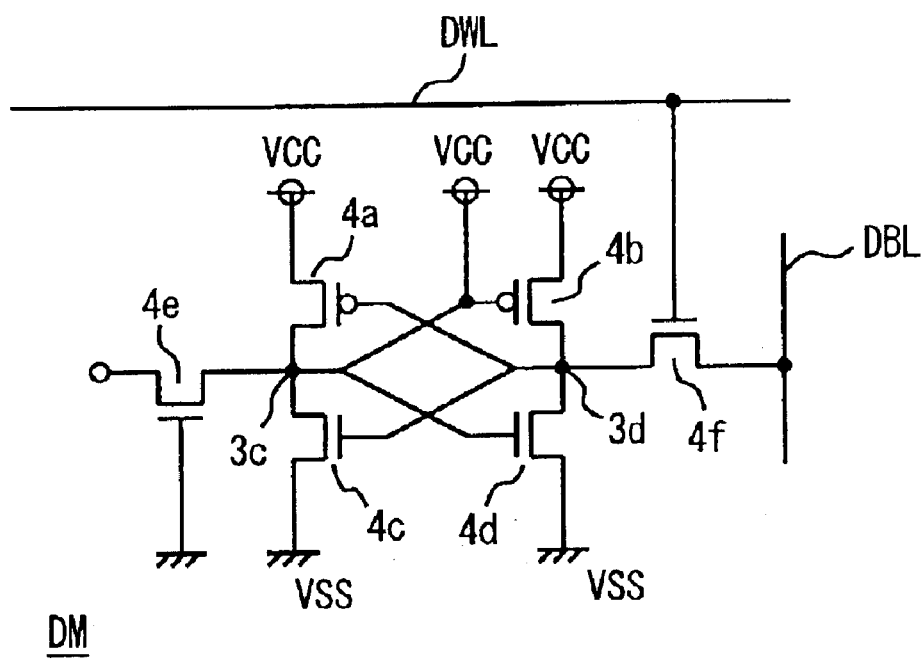
FIG. 4 shows an example of the configuration of a dummy cell shown in FIG. 2.

FIG. 4 shows an example of the configuration of dummy cell DM shown in FIG. 2. In FIG. 4, dummy cell DM includes: a P-channel MOS transistor 4a connected between a power supply node and an internal node 3c and having a gate connected to an internal node 3d; a P-channel MOS transistor 4b connected between the power supply node and node 3d and having a gate connected to internal node 3c; an N-channel MOS transistor 4c connected between internal node 3c and a ground node and having a gate connected to internal node 3d; and an N-channel MOS transistor 4d connected between internal node 3d and ground node and having a gate connected to internal node 3d. The gate of P-channel MOS transistor 4b is connected to a power supply node.

Dummy cell DM further includes: an N-channel MOS transistor 4f selectively made conductive in response to a signal on dummy word line DWL and connecting internal node 3d to dummy bit line DBL when made conductive; and an N-channel MOS transistor 4e connected to internal node 3c and having a gate connected to ground node.

MOS transistors 4a to 4f of dummy cell DM are equal in size (channel width to channel length) to MOS transistors 2a to 2f of normal memory cell MC. Therefore, a parasitic capacitance provided from dummy cell DM to dummy bit line DBL is equal to that provided from normal memory cell MC to bit lines BL and ZBL. In addition, the operation characteristics of normal memory cell MC and dummy cell DMC are substantially equal.

In dummy cell DM, the gate of MOS transistor 4b and internal node 3c are fixed to power supply voltage VCC level. Internal node 3d is fixed to ground voltage VSS level by MOS transistor 4d, accordingly. Therefore, when dummy word line DWL is selected, dummy bit line DBL is discharged through MOS transistors 4f and 4d. In a standby state, dummy bit line DBL is precharged at power supply voltage level by a dummy bit line load circuit, not shown.

MOS transistor 4e receives a ground voltage at the gate thereof, and is normally nonconductive. Alternatively, MOS transistor 4e may be formed to receive a power supply voltage at the gate thereof for connecting internal node 3c to a power supply line transmitting power supply voltage VCC. Therefore, it suffices that dummy cell DM is formed such that a parasitic capacitance provided from dummy cell DM to dummy bit line DBL is equal to that provided from normal memory cell MC to bit lines BL and ZBL. Further, the internal connection of dummy cell DM may be any except that internal node 3d is fixed to ground voltage level.

Dummy cell DM is arranged in correspondence to each word line WL, and the number of dummy cells DM connected to dummy bit line DBL is equal to the number of normal memory cells MC connected to bit lines BL and ZBL. It is therefore possible to set the parasitic capacitance connected to dummy bit line DBL equal to that of normal bit lines BL and ZBL. In normal memory array 10, even if the characteristics of normal memory cells MC varies and the parasitic capacitance of bit lines BL and ZBL varies due to variation in manufacturing parameters, the variation is similarly reflected in dummy bit line DBL. As a result, even if the discharging rates of bit lines BL and ZBL vary according to variation in the transistor characteristics of normal memory cells MC, the fluctuation is reflected in dummy bit line DBL through dummy cells DM.

Accordingly, even if variation in discharging rates of bit lines BL and ZBL occur in normal memory array 10 due to variation in manufacturing parameters, it is possible to accurately reflect the variation in the discharging rate of dummy bit line DBL. It is thereby possible to activate sense enable signal SE at an accurate, intended timing, irrespectively of the variation in parameters in manufacturing steps.

Figure 5:
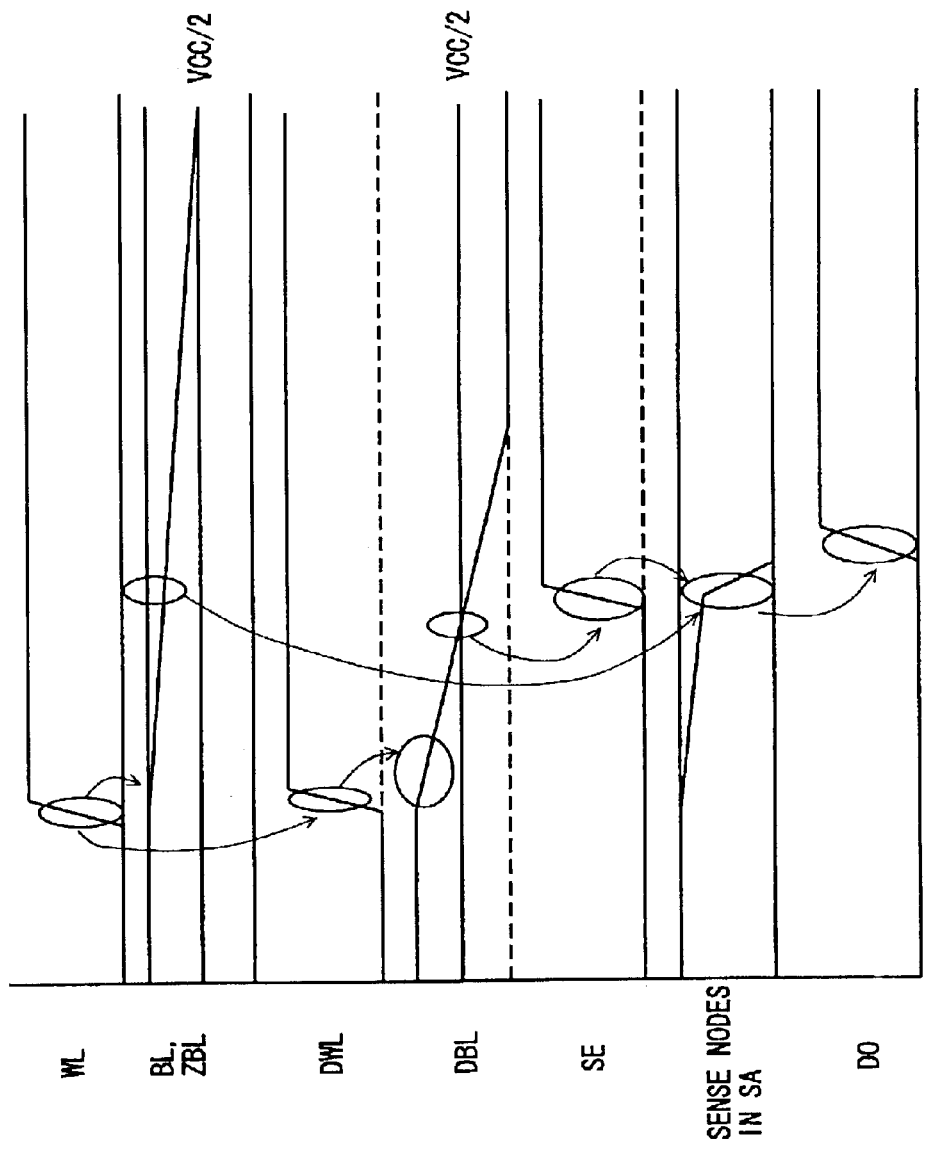
FIG. 5 is a signal waveform diagram representing an operation of the dummy circuit shown in FIG. 2.

FIG. 5 is a timing chart representing an operation of the semiconductor memory device having the architecture shown in FIGS. 1 to 4 when data is read. Referring to FIG. 5, the data read operation of the semiconductor memory device having the architecture shown in FIGS. 1 to 4 will be described.

In a standby cycle, bit lines BL and ZBL and dummy bit line DBL are precharged at power supply voltage VCC level by a precharge circuit, not shown. When an active cycle for selecting a memory cell starts, one of word line select signals WX0 to WXm is driven into a selected state in accordance with an applied X address signal and corresponding word line WL is driven to H level by word driver WD, accordingly.

When selected word line WL is driven to H level, MOS transistors 2e and 2f of normal memory cell MC are made conductive as shown in FIG. 3 and bit lines BL and ZBL are electrically connected to storage nodes 3a and 3b of normal memory cell MC, respectively. In accordance with the stored data of normal memory cell MC, one of bit lines BL and ZBL is discharged and the voltage level of the discharged bit line lowers.

On the other hand, when word line WL is driven into a selected state, the output signal of logic circuit LG0 shown in FIG. 2 attains H level and dummy word line DWL is also driven to H level, responsively. In dummy cell DM shown in FIG. 4, MOS transistor 4f is made conductive and dummy bit line DBL is discharged, responsively. In this case, dummy cells DM of 4 bits are arranged in one dummy circuit 1, and dummy cells DM are commonly coupled to dummy word line DWL. Therefore, dummy bit line DBL is discharged by dummy cells DM of 4 bits, so that the discharging rate of dummy bit line DBL is about four times as high as that of bit lines BL and ZBL.

Where dummy sense amplifier DSA is configured to raise the output signal thereof to H level when dummy bit line DBL reaches the voltage level of VCC/2, as shown in FIG. 5, the voltage drop amount of bit line BL or ZBL is VCC/8. If sense amplifier SA operates best at a voltage difference of this VCC/8, by activating sense enable signal SE at this timing, the potential difference between bit lines BL and ZBL transmitted to the sense nodes in sense amplifier SA can be amplified at high speed to generate internal read data DO.

What is important is that the ratio of the voltage dropping rate of bit lines BL and ZBL to that of dummy bit line DBL (which ratio is 1 to 4 in the first embodiment) is kept for any bit-word configuration adopted. That is, the load of bit lines BL and ZBL is equal to that of dummy bit line DBL, and the operation characteristics of dummy cell DM are equal to that of normal memory cell MC. Further, an activation timing for activating dummy word line DWL is equal to that for activating a selected word line. These relationships are maintained even if the number of bit lines and that of word lines are changed. Consequently, if a sense amplifier activation timing is adjusted for one array configuration, it is possible to activate sense amplifier SA regularly at an appropriate timing, irrespectively of the bit and word configuration (configuration of rows and columns of the memory cell array).

According to the above-described configuration, four dummy cells DM are arranged in dummy cell circuit 1, and four dummy cells DM are simultaneously driven into a selected state and dummy bit line DBL is discharged. However, the number of dummy cells DM included in one dummy circuit can be any, and dummy circuit 1 can be formed by a desired number of dummy cells and the discharging rate ratio of dummy bit line DBL to bit lines BL and ZBL can be set at a desired value. Accordingly, it is possible to set the potential difference between the bit lines upon activation of sense amplifier SA so that sense amplifier SA can perform a sensing operation in the most sensitive range.

Further, in order to finely adjust the sense amplifier activation timing, a delay element can be added in preceding or subsequent state of dummy sense amplifier DSA.

As described above, according to the first embodiment of the present invention, each dummy circuit including dummy cells arranged in correspondence to word lines are arranged for a predetermined number of word lines, and the dummy bit line is driven by a plurality of dummy cells in response to selection of a corresponding word line. It is therefore possible to activate the sense amplifier at an optimum timing irrespectively of the configuration of the normal memory cell array and to achieve high speed operation.

It is unnecessary to set a timing on the assumption of the worst case, i.e., a largest array architecture, particularly in the case of utilizing an automatic generation tool such as a memory compiler. It is possible to automatically set the sense timing depending on the array configuration and to decrease the overhead of the sense timing.

Moreover, since the sense timing is optimized, it is possible to prevent the bit line from being unnecessarily discharged, to decrease the voltage amplitude of the bit line, accordingly, and to decrease current consumption.

Second Embodiment

Figure 6:
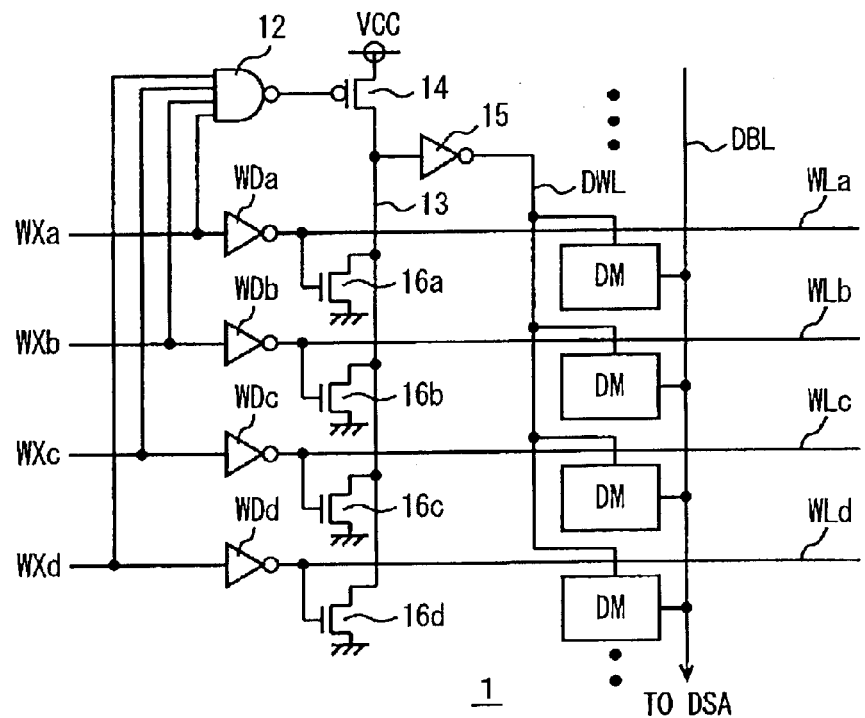
FIG. 6 shows the configuration of a dummy circuit according to a second embodiment of the present invention.

FIG. 6 is a schematic diagram showing the configuration of dummy circuit 1 according to a second embodiment of the present invention. The configurations of memory array 10, dummy sense amplifier DSA and sense amplifier SA are the same as in the first embodiment.

In FIG. 6, dummy circuit 1 includes dummy cells DM arranged in correspondence to word lines WLa to WLd, respectively, and dummy word line DWL commonly coupled to dummy cells DM as in the case of the first embodiment. Word lines WLa to WLd are driven by word line drivers WDa to WDd which receive word line select signals WXa to WXd, respectively.

Dummy circuit 1 further includes: a logic circuit 12 receiving word lie select signals WXa to WXd; a P-channel MOS transistor 14 selectively made conductive in accordance with an output signal of logic circuit 12 and charging a signal line 13 to power supply voltage VCC level when made conductive; and an inversion circuit 15 driving dummy word line DWL in accordance with the voltage of a signal on signal line 13. Logic circuit 12, which is formed of, for example, a NAND circuit, sets MOS transistor 14 nonconductive when one of word line select signals WXa to WXd is in a selected state (at L level).

Dummy circuit 1 further includes N-channel MOS transistors 16a to 16d provided in correspondence to word lines WLa to WLd, and discharging signal line 13 to ground voltage level when corresponding word lines are selected, respectively. Signal line 13 is provided for each dummy circuit 1. The charging/discharging of signal line 13 is executed in units of dummy circuits 1 and the selection/non-selection of dummy word line WDL is executed in units of the dummy circuits, accordingly.

In the configuration of dummy circuit 1 shown in FIG. 6, when one of word lines WLa to WLd is selected, then the output signal of logic circuit 12 attains H level, MOS transistor 14 is rendered nonconductive, and signal line 13 turns into a floating state at power supply voltage VCC level. On the other hand, one of word line drive signals from word line drivers MDa to WDd rises to H level, one of MOS transistors 16a to 16d is made conductive, and signal line 13 is discharged to ground voltage level. At this time, therefore, inversion circuit 15 drives dummy word line DWL to H level, and dummy cells DM of 4 bits discharge dummy bit line DBL.

If all of word lines WLa to WLd are unselected, the output signal of logic circuit 12 is kept at L level. All the word line drive signals on word lines WLa to WLd are at L level, all of transistors 16a to 16d are kept nonconductive, and signal line 13 is kept at power supply voltage VCC level. In this state, the output signal of inversion circuit 15 is at L level, dummy word line DWL is kept at L level, and dummy cells DM are all kept in the unselected state.

In dummy circuit 1 shown in FIG. 6, therefore, the same number of dummy cells as that of the normal memory cells connected to the normal bit line are connected to the dummy bit line and the similar effects to those of the first embodiment can be achieved.

Therefore, in the configuration of the dummy circuit shown in FIG. 6, dummy bit line DBL is discharged at high speed as compared with the normal bit lines in the normal memory array, and the similar operational effects to those of the first embodiment can be achieved.

Furthermore, only MOS transistors 16a to 16d are provided in correspondence to word lines WLa to WLd, respectively. Each of MOS transistors 16a to 16d is only required to drive signal line 13 arranged for corresponding dummy circuit 1, so that it is possible to reduce MOS transistors 16a to 16d in size (ratio of gate width to gate length) sufficiently. Therefore, as compared with the configuration of receiving word line drive signals on word lines WLa to WLd and detecting a selected state, it is possible to mitigate loads on word lines WLa to WLd, respectively.

That is, when a logic circuit such as an OR circuit is employed to detect selection of a word line, at least two MOS transistors are connected to each of word lines WLa to WLd. Therefore, it is possible to mitigate the loads on word lines WLa to WLd, respectively and to charge and discharge the word lines at high speed.

As described above, according to the second embodiment of the present invention, in the dummy circuit provided in correspondence to a predetermined number of word lines, one MOS transistor is connected to each word line, whereby it is possible to mitigate the load on the word line, to charge and discharge the word line at high speed, and to achieve high speed operation.

Third Embodiment

Figure 7:
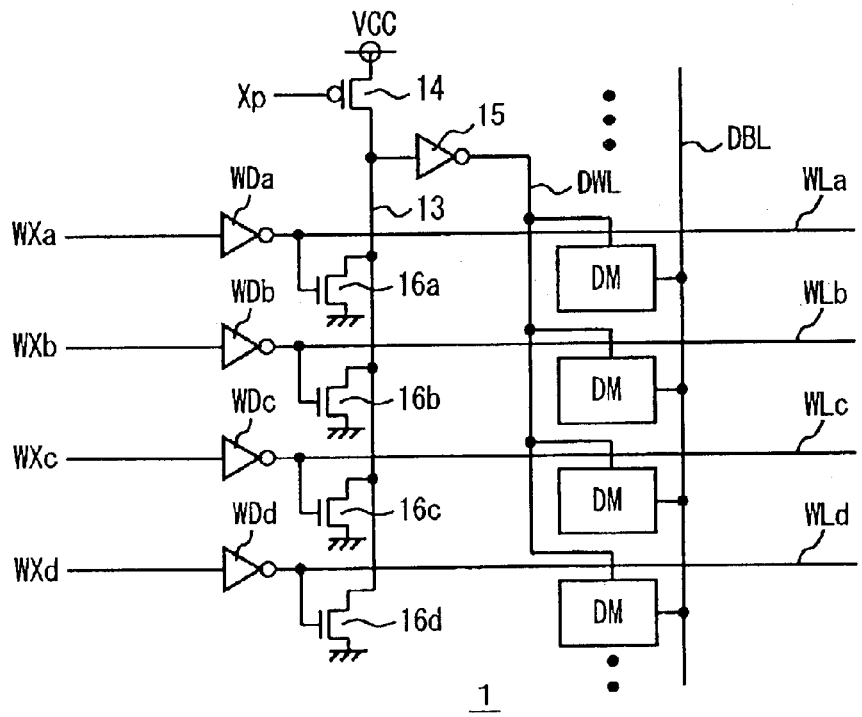
FIG. 7 shows the configuration of a dummy circuit according to a third embodiment of the present invention.

FIG. 7 is a schematic diagram showing the configuration of dummy circuit 1 according to a third embodiment of the present invention. The configuration of dummy circuit 1 shown in FIG. 7 differs from that of dummy circuit 1 shown in FIG. 6 in the following point. A predecode signal (word line group select signal) Xp for specifying a group of four word lines WLa to WLd, is applied to the gate of MOS transistor 14 for precharging signal line 13. The other components of dummy circuit 1 shown in FIG. 7 are the same as those shown in FIG. 6, so that corresponding components are denoted by the same reference numerals, and the detailed description thereof will not be repeated.

In dummy circuit 1 shown in FIG. 7, it is set to maintain/stop charging signal line 13 using predecode signal Xp specifying the group of word lines WLa to WLd. Therefore, logic circuit 12 shown in FIG. 6 is unnecessary, and an area occupied by dummy circuit 1 can be further reduced accordingly. In addition, loads on the signal lines transmitting word line select signals WXa to WXd are mitigated, so that word line select signals WXa to WXd can be charged/discharged at high speed.

Figure 8:
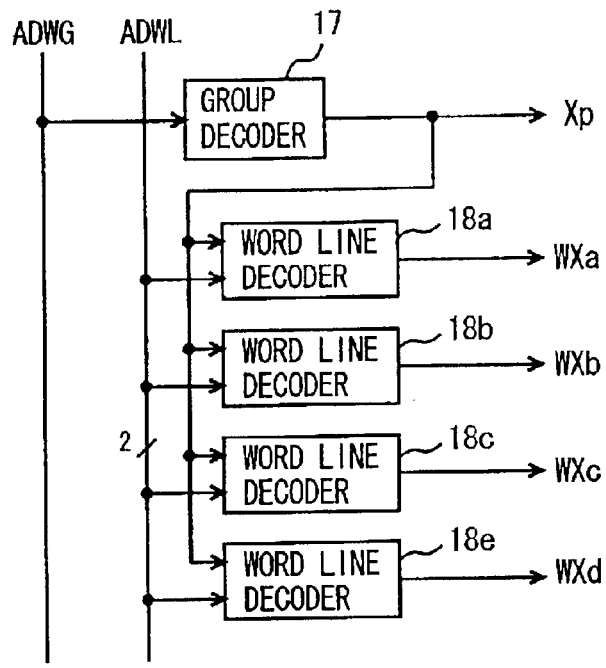
FIG. 8 shows an example of the configuration of a part for generating word line group select signals shown in FIG. 7.

FIG. 8 is a schematic diagram showing the configuration of a row select signal generation section which generates word line select signals WXa to WXd and word line group select signal Xp. In FIG. 8, the row select signal generation section includes: a group decoder 17 for decoding a word line group address signal ADWG and generating predecode signal (word line group select signal) Xp; and word line decoders 18a to 18d enabled when output signal Xp of group decoder 17 is activated, to decode applied word line address signal ADWL.

Word line decoders 18a to 18e generate word line select signals WXa to WXd in accordance of decoding results thereof when enabled. Word line address signal ADWL is a 2-bit address signal and specifies one of the four word lines.

Word line group address signal ADWG applied to group decoder 17 specifies a set of four word lines. Therefore, if word line group select signal (predecode signal) Xp is set in a selected state, one of the corresponding four word lines is selected. Word line group address signal ADWG and word line address signal ADWL are commonly applied to group decoder 17 arranged in correspondence to each set of four word lines and word line decoders 18a to 18e arranged in correspondence to the respective word lines.

In the case of the configuration of arranging the dummy circuit in correspondence to the four word lines as shown in FIG. 8, word line address signal ADWL is a 2-bit address signal irrespective of the configuration of the normal memory array, while the number of bits of word line group address signal ADWG is determined according to the number of normal word lines included in the normal memory array (word configuration).

In the case of a word line predecoding scheme of specifying one word line group on the basis of word line group address signal ADWG, if word line address signal ADWL is a 3-bit address signal, a set of eight word lines is designated by word line group address signal ADWG. In this case, therefore, dummy circuit 1 is provided in correspondence to eight word lines, and dummy bit line DBL is driven by eight dummy cells DM when a corresponding word line is selected.

Alternatively, word line address signal ADWL may be predecoded and applied to word line decoders 18a to 18e as word line select signals of 4 bits, respectively. If word line address signal ADWL is predecoded, word line select signals WXa to WXd are generated on the basis of word line predecode signals (word line designation signals) and word line group select signal Xp.

Word line group address signal ADWG applied to group decoder 17, similarly to word line address signal ADWL, may be predecoded into a signal of a plurality of bits and applied to the respective group decoders 17 as the word line group predecode signals.

As described above, according to the third embodiment of the present invention, the dummy word line is driven in accordance with the word line group select signal specifying a set of a predetermined number of word lines including a selected word line. It is possible to reduce an area occupied by the dummy circuit. It is also possible to achieve the similar effects to those in the second embodiment.

Fourth Embodiment

Figure 9:
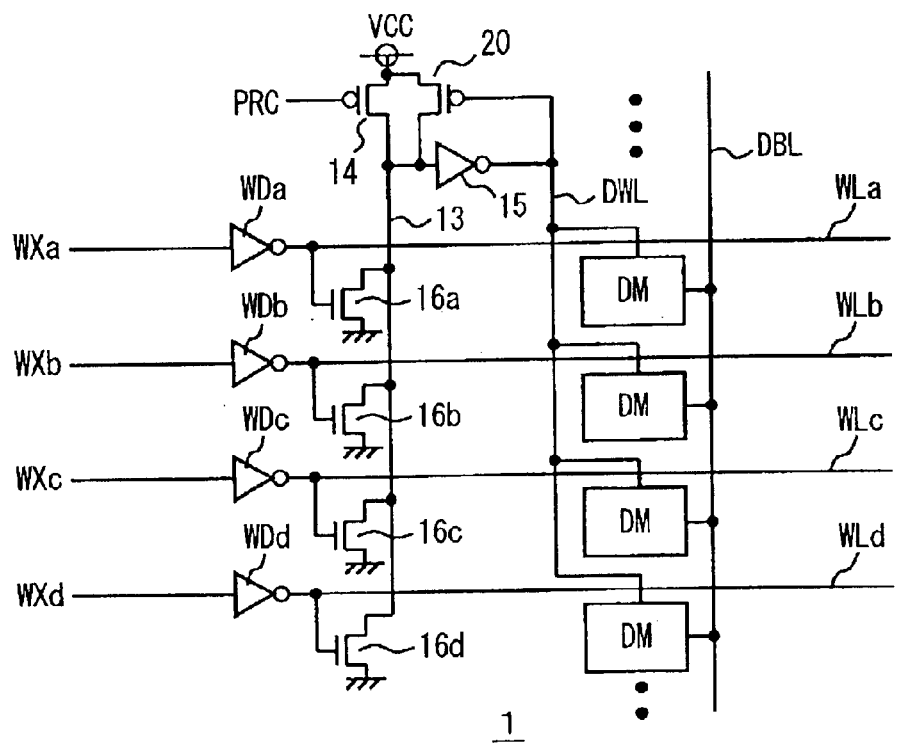
FIG. 9 shows the configuration of a dummy circuit according to a fourth embodiment of the present invention.

FIG. 9 is a schematic diagram showing the configuration of dummy circuit 1 according to a fourth embodiment of the present invention. In the configuration of dummy circuit 1 shown in FIG. 9, precharge signal PRC, instead of word line group select signal Xp, is applied to the gate of MOS transistor 14 for precharging signal line 13. In addition, dummy circuit 1 includes a P-channel MOS transistor 20 that is provided between signal line 13 and a power supply node and is selectively made conductive in accordance with the output signal of inversion circuit 15. Since the other components of dummy circuit 1 shown in FIG. 9 are the same as those of dummy circuit 1 shown in FIG. 7, the corresponding components are denoted by the same reference numerals, and the detailed description thereof will not be repeated.

If data access is made synchronously with clock signal, precharge signal PRC is kept at H level while the clock signal is at H level, for example. During this period of time, a word line enable signal for driving a word line into a selected state is kept active. Therefore, in data access, when precharge signal PRC attains H level, MOS, transistor 14 turns nonconductive. If any of word lines WLa to WLd is selected in accordance with word line select signals WXa to WXd, then signal line 13 is discharged by any of MOS transistors 16a to 16d, dummy word line DWL is driven to H level by inversion circuit 15, accordingly, and dummy bit line DBL is discharged by dummy cells DM of 4 bits.

On the other hand, if all of word lines WLa to WLd are in an unselected state while precharge signal PRC is at H level, all of MOS transistors 14 and 16a to 16b are nonconductive. At this time, the output signal of inversion circuit 15 is at L level, MOS transistor 20 turns conductive and signal line 13 is kept at power supply voltage VCC level. It is thereby possible to prevent signal line 13 from entering a floating state in a data access cycle. It is possible to accurately set dummy circuit 1 arranged for the selected word line to be active and to discharge dummy bit line DBL.

If voltage drop caused by leak current of signal line 13 is sufficiently small in the floating state of signal line 13 because of a fast operation cycle, or the sufficiently high threshold voltages of MOS transistors 16a to 16b, and influence due to the floating state of signal line 13 is negligible, it is unnecessary to provide MOS transistor 20.

Figure 10:
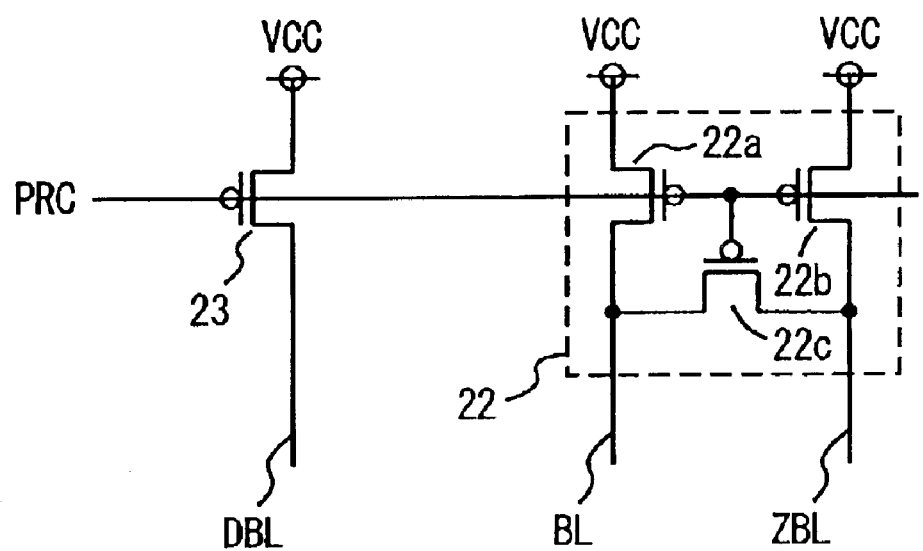
FIG. 10 shows an example of the configuration of a bit line load circuit receiving a precharge signal shown in FIG. 9.

FIG. 10 shows an example of the configuration of a bit line load circuit and a dummy bit line load circuit. In FIG. 10, a bit line load circuit 22 is provided to bit lines BL and ZBL, and a dummy bit line load circuit 23 is provided to dummy bit line DBL. Bit line load circuit 22 includes: P-channel MOS transistors 22a and 22b that are made conductive when precharge signal PRC is at L level and supply power supply voltage VCC to bit lines BL and ZBL when made conductive, respectively; and P-channel MOS transistor 22c that is made conductive when precharge signal PRC is at L level and electrically short-circuit bit lines BL and ZBL when made conductive.

Dummy bit line load circuit 23, which is formed of a P-channel MOS transistor, precharges dummy bit line DBL at power supply voltage VCC level when precharge signal PRC is at L level.

Figure 11:
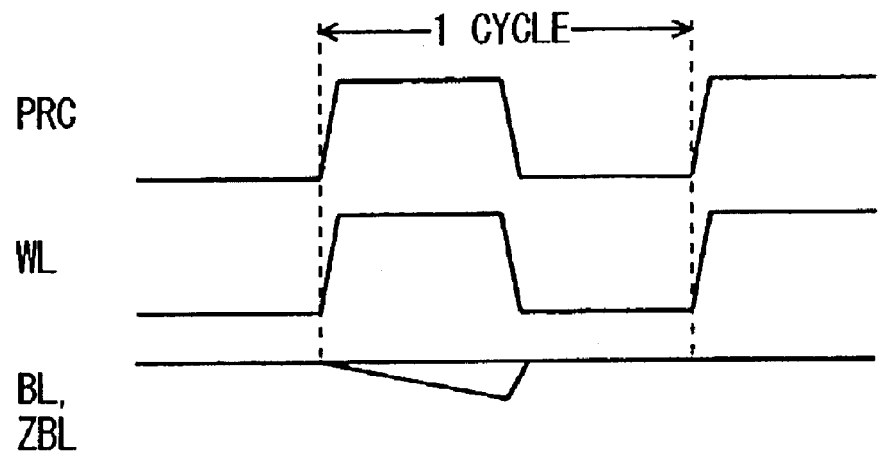
FIG. 11 is a signal waveform diagram representing a precharge signal and word line drive signal shown in FIG. 9 and a change in bit line potential.

As shown in FIG. 11, precharge signal PRC determines the selecting period of word line WL. When word line WL is driven into a selected state, precharge signal PRC is at H level and bit line BL is disconnected from the power supply node.

Where external data reading is performed after sensing of data, precharge signal PRC attains L level. This precharge signal PRC determines a cycle for data access to a memory cell.

Where this semiconductor memory device operates synchronously with a clock signal, precharge signal PRC changes synchronously with a clock signal. For example, when the clock signal is at H level, precharge signal PRC is set at H level.

When word line WL is driven into a selected state, and the potential difference between bit lines BL and ZBL is developed, internal data is sensed and data is read out externally. When precharge signal PRC falls to L level, bit line load circuit 22 is activated and bit lines BL and ZBL are precharged to power supply voltage VCC level. When precharge signal PRC falls to L level, a selected word line WL is driven from a selected state to an unselected state. At this time, the discharging of dummy bit line DBL is completed, and dummy bit line DBL is precharged to power supply voltage level. Besides, dummy word line DWL in a selected state is driven into an unselected state.

According to the operation waveforms shown in FIG. 11, precharge signal PRC determines an access cycle. This is because the semiconductor memory device operates synchronously with the clock signal. However, even for the configuration in which the semiconductor memory device operates asynchronously with a clock signal and an internal operation timing is determined on the basis of an address transition detection signal generated by detecting a change in the address signal, precharge signal PRC is kept at H level in data access (data read), similarly. Accordingly, the similar configuration of bit line load circuits 22 and 23 to that shown in FIG. 10 is employed even in the clock asynchronous memory device.

In the case of a semiconductor memory device having the configuration of holding bit line load circuit 22 active in data read for reducing the bit line voltage amplitude, the precharge operation of the signal line shown in FIG. 9 is controlled by a signal which is generated in accordance with, for example, an address transition detection signal.

By utilizing precharge signal PRC, it is possible to transmit common precharge signal PRC to dummy circuits and interconnection layout is simplified as compared with a case of utilizing the word line group select signal. It is also possible to achieve the similar effects to those in the third embodiment.

As described above, according to the fourth embodiment of the present invention, the signal line for detecting whether a corresponding word line is selected or unselected is charged utilizing bit line precharge signal PRC in the dummy circuit, whereby interconnection layout is simplified.

Fifth Embodiment

Figure 12:
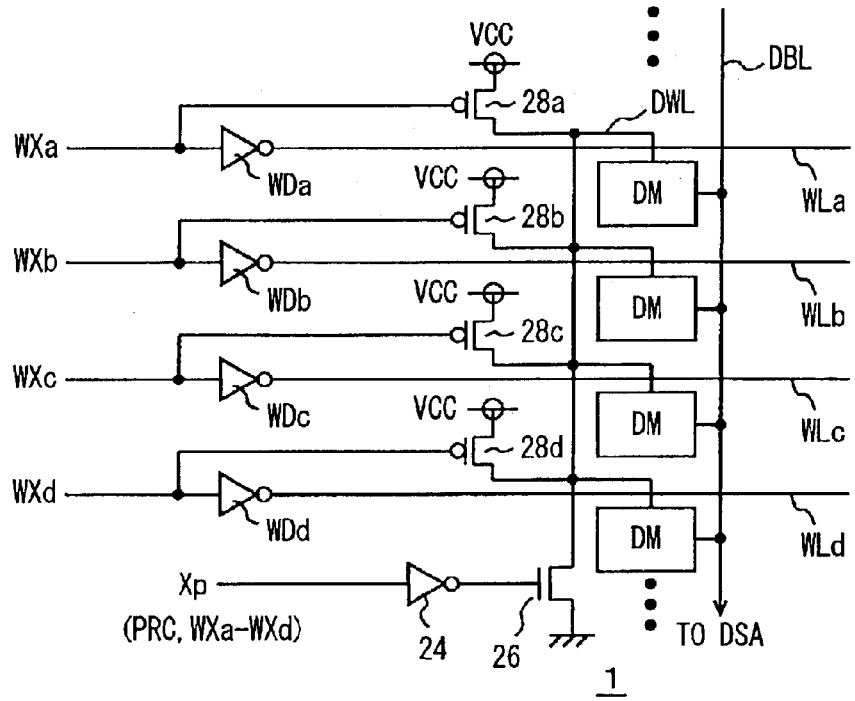
FIG. 12 shows the configuration of a dummy circuit according to a fifth embodiment of the present invention.

FIG. 12 is a schematic diagram showing the configuration of dummy circuit 1 according to a fifth embodiment of the present invention. In FIG. 12, dummy circuit 1 includes: dummy cells DM arranged in correspondence to word lines WLa to WLd, respectively; dummy word line DWL commonly connected to dummy cells DM; an inversion circuit 24 receiving word line group select signal (predecode signal) Xp; an N-channel MOS transistor 26 selectively driving dummy word line DWL to ground voltage level in response to the output signal of inversion circuit 24; and P-channel MOS transistors 28a to 28d provided in correspondence to word lines WLa to WLd, respectively, and selectively made conductive in response to word line select signal WXa to WXd, respectively, to drive dummy word line DWL to power supply voltage VCC level when made conductive.

Word lines WLa to WLd are driven by word line drivers WDa to WDd that receive word line select signals WXa to WXd, respectively.

When word line group select signal XP is at L level of an unselected state, the output signal of inversion circuit 24 is at H level, MOS transistor 26 is made conductive and dummy word line DWL is kept at ground voltage level. In this case, word line select signals WXa to WXd are each unselected and all of word lines WLa to WLd are unselected. In addition, MOS transistors 28a to 28d are each in an unselected state.

When word line group select signal Xp is driven to H level, any one of word lines WLa to WLd is driven into a selected state. In this state, the output signal of inversion circuit 24 attains L level and MOS transistor 26 is nonconductive. Moreover, any one of word line select signals WXa to WXd attains L level and a corresponding one of MOS transistors 28a to 28d turns conductive. As a result, dummy word line DWL is driven to H level, dummy bit line DBL is driven by dummy cells DM of 4 bits, and the potential of dummy bit line DBL lowers at high speed.

In the configuration shown in FIG. 12, therefore, dummy word line DWL is driven into a selected state using word line select signals WXa to WXd. Since word lines WLa to WLd are only provided with word line drivers WDa to WDd, respectively, it is possible to mitigate the loads of word lines WLa to WLd and to charge and discharge word lines WLa to WLd at high speed.

Further, dummy word line DWL itself is driven in accordance with the selection/non-selection of corresponding word lines, so that a signal line for dummy word line selection is unnecessary and it is possible to reduce an area occupied by dummy circuit 1. Besides, it is unnecessary to charge and discharge this signal line for selecting a dummy word line, making it possible to reduce current consumption.

Moreover, since dummy word line DWL only charges and discharges the gates of the access transistors of four dummy cells DM, it is possible to drive dummy word line DWL to power supply voltage VCC level at high speed using MOS transistors 28a to 28d.

In addition, precharge signal PRC or the OR signal of word line select signals WXa to WXd may be employed in place of word line group select signal Xp. If the driving capabilities of word line drivers WDa to WDd are sufficiently large, the OR signal of the signals on word lines WLa to WLd may be employed in place of word line group select signal Xp.

As described above, according to the fifth embodiment of the present invention, the MOS transistors that are selectively made conductive in accordance with the word line drive signals and drive the dummy word line into a selected state, are provided in correspondence to a predetermined number of word lines, respectively. It is therefore unnecessary to separately provide a signal line for detecting word line selection and it is possible to further reduce the layout area of the dummy circuit and current consumption.

Sixth Embodiment

Figure 13:
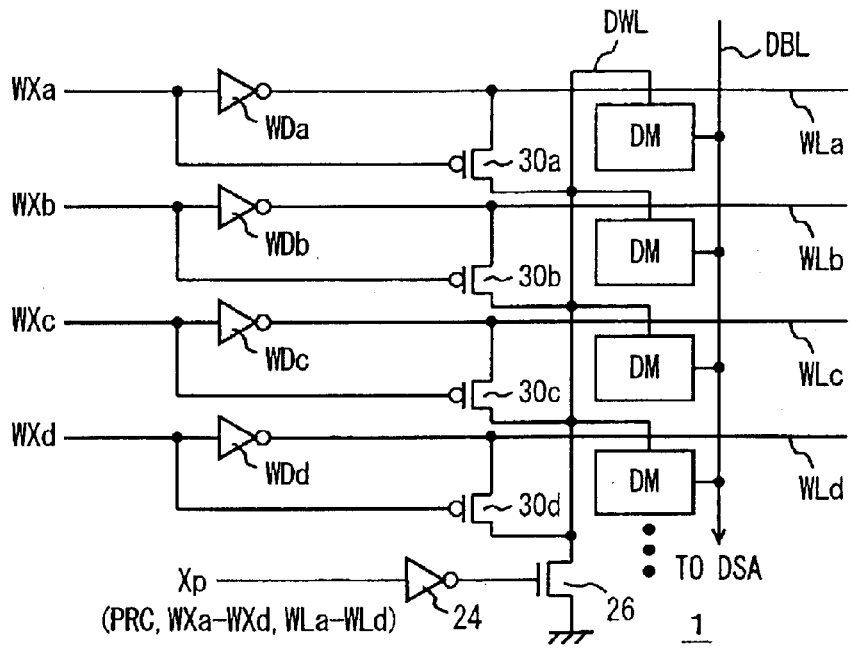
FIG. 13 shows the configuration of a dummy circuit according to a sixth embodiment of the present invention.

FIG. 13 is a schematic diagram showing the configuration of dummy circuit 1 according to a sixth embodiment of the present invention. Dummy circuit 1 shown in FIG. 6 differs from dummy circuit 1 shown in FIG. 12 in the following point. P-channel MOS transistors 30a to 30d electrically coupling word lines WLa to WLd to dummy word line DWL in accordance with word line select signals WXa to WXd, are provided in place of MOS transistors 28a to 28d for driving dummy word line DWL shown in FIG. 12, respectively. Since the other components of dummy circuit 1 shown in FIG. 13 are the same as in dummy circuit 1 shown in FIG. 12, corresponding components are denoted by the same reference numerals, and the detailed description thereof will not be repeated.

In the configuration of dummy circuit 1 shown in FIG. 13, when either of word line select signals WXa to WXd is driven into a selected state, a corresponding one of MOS transistors 30a to 30d is made conductive. In this case, selected word line WL (one of word lines WLa to WLd) is coupled to dummy word line DWL, and the potential change of dummy word line DWL is made equal to that of selected word line WL. Therefore, even if the array architecture is altered and the potential changing rates of word lines WLa to WLd accordingly change, it is possible to accurately cause the same potential change as that of the selected word line on dummy word line DWL.

Accordingly, it is possible to make a period for reading data of normal memory cell MC to bit lines BL and ZBL by word line selection equal to a period from selection of dummy word line DWL until reading data of dummy cells DM to dummy bit line DBL, irrespectively of the array architecture. Therefore, even if, for example, the number of bits is altered and the voltage level rising rate of a selected word line changes, it is possible to accurately reflect the change in the potential change of dummy word line DWL and to enable a sensing operation at an accurate timing.

Alternatively, a CMOS transmission gate formed of P- and N-channel MOS transistors may be employed in place of P-channel MOS transistors 30a to 30d in the configuration shown in FIG. 13.

Further, word line group select signal Xp is employed to drive dummy word line DWL into an unselected state. Alternatively, in this sixth embodiment, the AND signal of word line select signals WXa to WXd or the OR signal of word line drive signals on word lines WLa to WLd may be employed in place of word line group select signal Xp.

Furthermore, the inverted signals of the output signals of word line drivers WDa to WDd may be applied to the gates of MOS transistors 30a to 30d, respectively.

As described above, according to the sixth embodiment of the present invention, the dummy word line that commonly connects to dummy cells provided in correspondence to the respective normal word lines of a predetermined number, is provided, and when a corresponding word line is selected, this selected word line is electrically coupled to the dummy word line. It is therefore possible to change the voltages of the selected word line and the dummy word line at the same rate, irrespectively of the array architecture, and to activate a sensing operation at an accurate timing, irrespectively of the array architecture.

Seventh Embodiment

Figure 14:
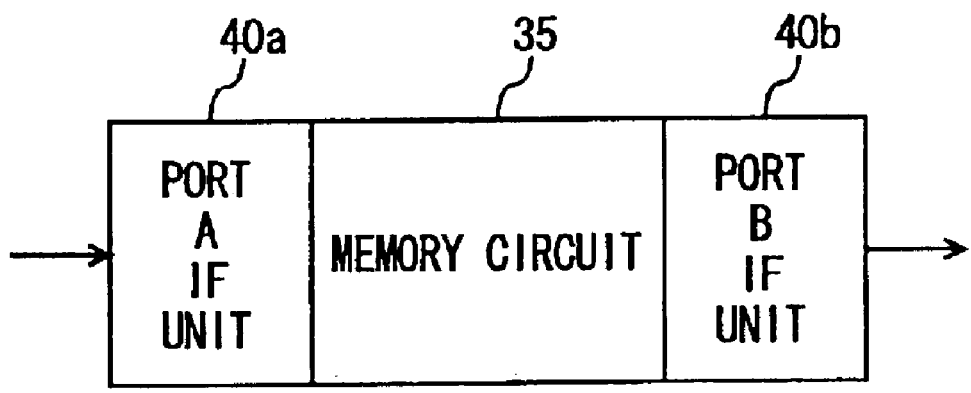
FIG. 14 is a schematic diagram showing the overall configuration of a semiconductor memory device according to a seventh embodiment of the present invention.

FIG. 14 is a schematic diagram showing the overall configuration of a semiconductor memory device according to a seventh embodiment of the present invention. In FIG. 14, the semiconductor memory device according to the present invention includes: a memory circuit 35 that stores data; a port A interface (AIF) unit 40*a* for accessing memory circuit 35 from one port (A port); and a port B interface (BIF) unit 40*b* for accessing memory circuit 35 from the other port (B port).

In other words, the semiconductor memory device shown in FIG. 14 is a 2-port SRAM having two ports. Through port AIF unit 40*a* and port BIF unit 40*b*, it is possible to independently, individually access memory circuit 35. Memory circuit 35 includes a memory array and memory peripheral circuitry for memory cell selection and data write/read operations. Each of port AIF unit 40*a* and port BIF unit 40*b* includes signal and data input/output circuits.

Port AIF unit 40*a* and port BIF unit 40*b* can be coupled to different processors, thereby making it possible to construct an efficient memory system.

Figure 15:
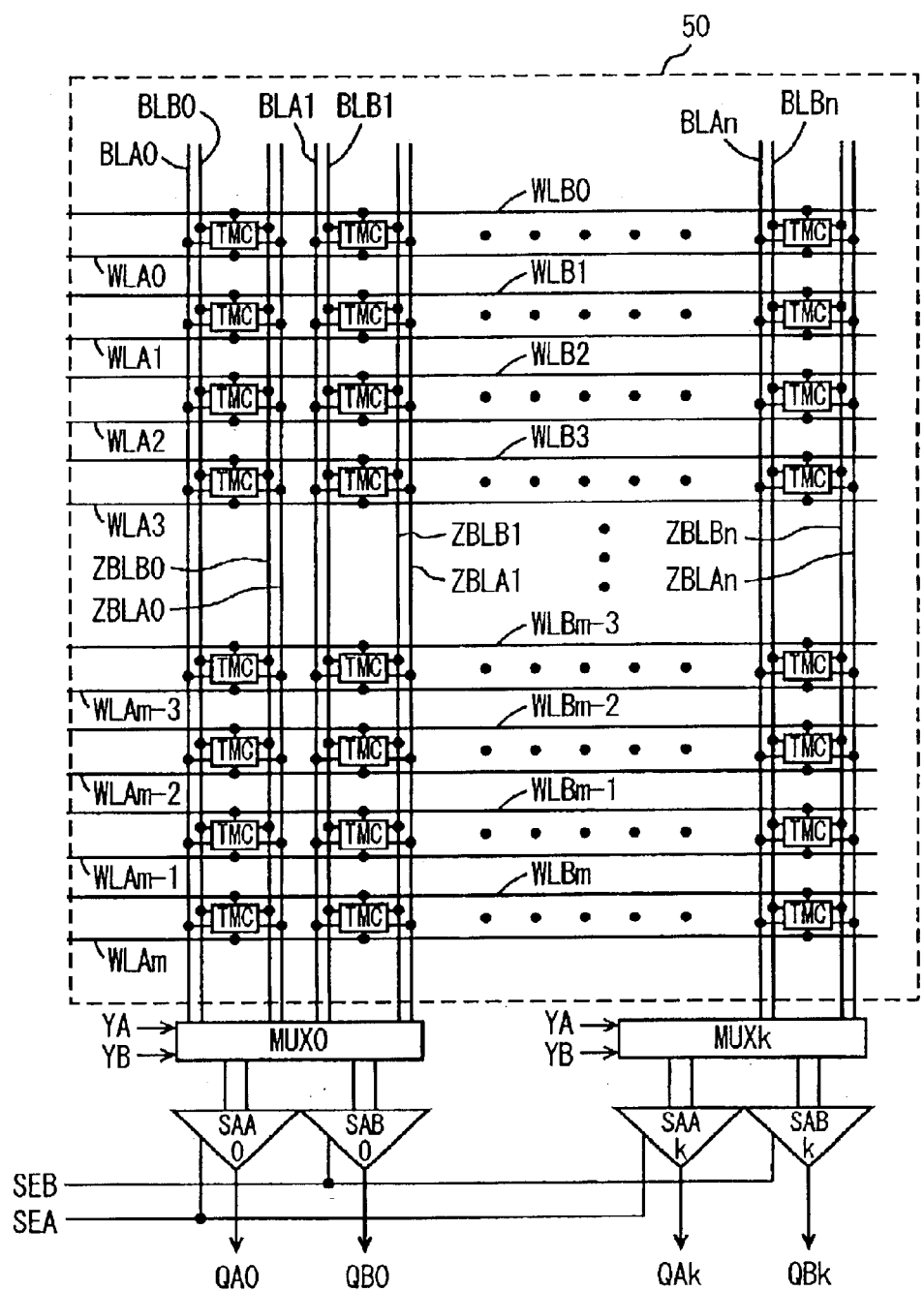
FIG. 15 is a schematic diagram showing the configuration of an array section of the semiconductor memory device according to the seventh embodiment of the present invention.

FIG. 15 is a schematic diagram showing the configuration of a memory array section included in memory circuit 35 shown in FIG. 14. In FIG. 15, 2-port SRAM cells TMC are arranged in rows and columns in a normal array 50. Each 2-port SRAM cell TMC can be individually accessed from the port A and the port B.

To access TMC from the port A, A-port word lines WLA0 to WLAn are disposed in correspondence to the respective rows of 2-port SRAM cells (hereinafter, simply referred to as "memory cells") TMC, and A-port bit lines BLA0, ZBA0 to BLAn, ZBLAn are provided in correspondence to the respective columns of memory cells TMC.

To access TMC from the port B, B-port word lines WLB0 to WLBn are disposed in correspondence to the respective rows of memory cells TMC, and B-port bit lines BLB0, ZBLB0 to BLBn, ZBLBn are provided in correspondence to the respective columns of memory cells TMC.

Memory cells TMC are divided into a plurality of column blocks, and multiplexers MUX0 to MUXk are provided in correspondence to the respective column blocks. Each of multiplexers MUX0 to MUXk includes a column select gate provided in correspondence to the memory cell column, and couples a selected column to a sense amplifier through an internal data bus in accordance with an A-port column select signal YA and a B-port column select signal YB.

An A-port sense amplifier and a B-port sense amplifier are arranged in correspondence to each of multiplexers MUX0 to MUXk. With the configuration shown in FIG. 15, an A-port sense amplifier SAA0 and a B-port sense amplifier SAB0 are provided in correspondence to multiplexer MUX0, and an A-port sense amplifier SAAk and a B-port sense amplifier SABk are provided in correspondence to multiplexer MUXk.

Figure 35:
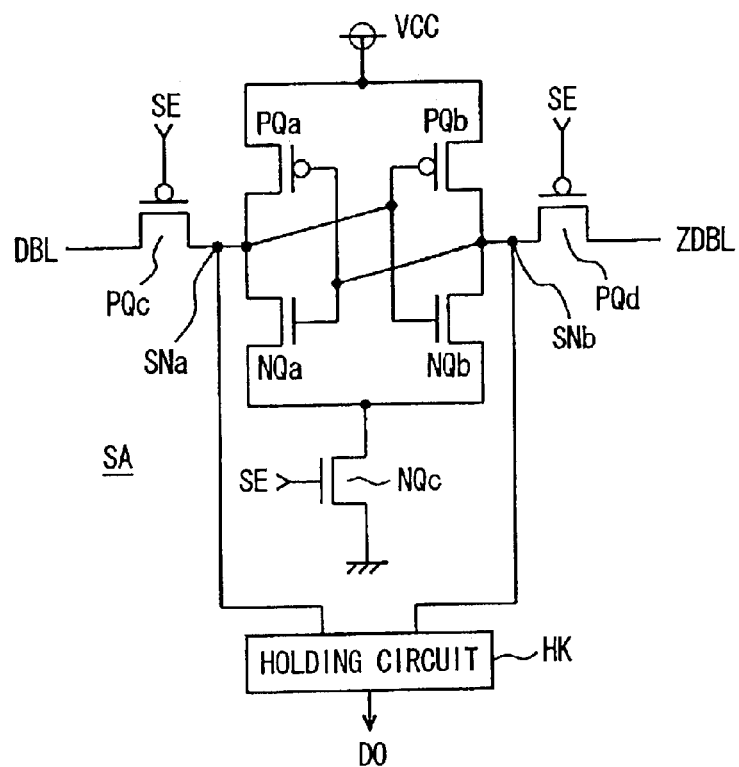
FIG. 35 shows an example of the configuration of a latch type sense amplifier shown in FIG. 34.
Figure 36:
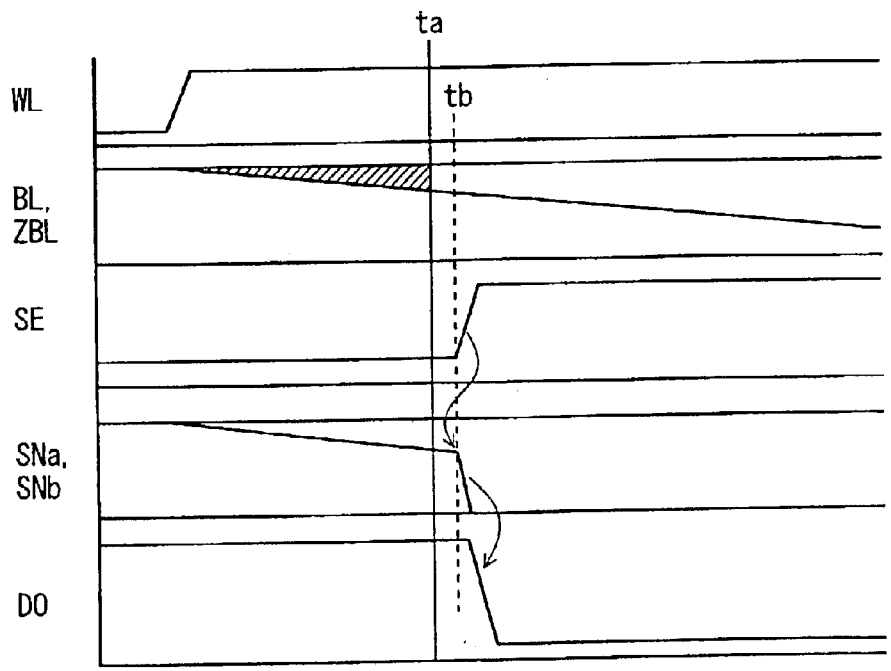
FIG. 36 is a signal waveform diagram representing an operation of the semiconductor memory device shown in FIG. 34.

A-port sense amplifiers SAA0 to SAAk are activated in response to the activation of an A-port sense enable signal SEA, and B-port sense amplifiers SAB0 to SABk are activated in response to the activation of a B-port sense enable signal SEB. Each of sense amplifiers SAA0 to SAAk and SAB0 to SABk has the configuration of the latch type sense amplifier as shown in FIG. 35. Internal data QA0 to QAk are outputted from sense amplifiers SAA0 to SAAk, and internal data QB0 to QBk are outputted from sense amplifiers SAB0 to SABk, respectively.

Sense enable signals SEA and SEB are activated in data access from the corresponding ports, respectively. Therefore, sense amplifiers SAA0 to SAAk are activated in access from the A port, and sense amplifiers SAB0 to SABk are activated in access from the B port. Accordingly, it is possible to access memory cell TMC at the same address from the A port and the B port simultaneously in data read. However, if data is written and read to and from the memory cell at the same address simultaneously, an arbitration processing is performed. Normally, access permission is given to the port from which memory cell TMC of interest is accessed faster. In this case, an arbitration processing may be also performed when data is read from memory cell TMC at the same address from the A port and the B port simultaneously.

Figure 16:
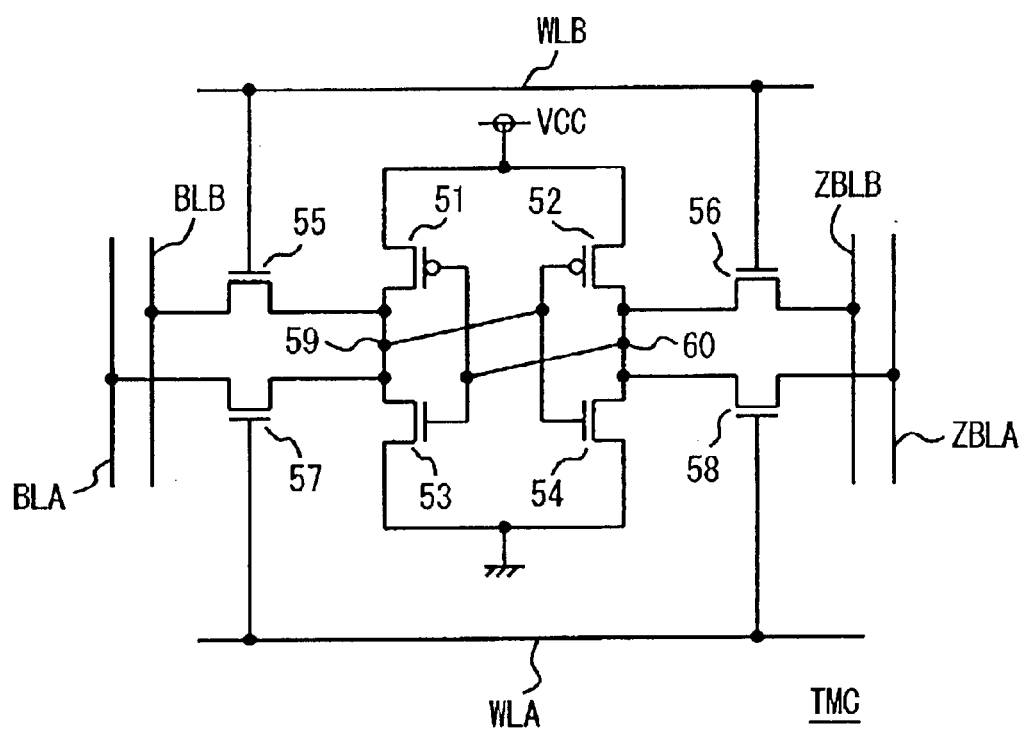
FIG. 16 shows an example of the configuration of a 2-port memory cell shown in FIG. 15.

FIG. 16 shows an example of the configuration of memory cell TMC. In FIG. 16, memory cell TMC includes: a P-channel MOS transistor 51 connected between a power supply node and a storage node 59 and having a gate connected to a storage node 60; a P-channel MOS transistor 52 connected between the power supply node and storage node 60 and having a gate connected to storage node 59; an N-channel MOS transistor 53 connected between storage node 59 and a ground node and having a gate connected to storage node 60; and an N-channel MOS transistor 54 connected between storage node 60 and the ground node and having a gate connected to storage node 59. Storage nodes 59 and 60 store complementary data, respectively, and can be accessed from the port A and the port B.

Memory cell TMC further includes; N-channel MOS transistors 57 and 58 that connect storage nodes 59 and 60 to A-port bit lines BLA and ZBLA in response to a signal on an A-port word line WLA, respectively; and N-channel MOS transistors 55 and 56 that connect storage nodes 59 and 60 to B-port bit lines BLB and ZBLB in response to a signal on a B-port word line WLB, respectively.

When data is accessed from the A port, A-port word line WLA is driven into a selected state, MOS transistors 57 and 58 are made conductive, and storage nodes 59 and 60 are electrically coupled to A-port bit lines BLA and ZBLA, respectively. When data is accessed from the B port, B-port word line WLB is driven into a selected state, MOS transistors 55 and 56 are made conductive, and storage nodes 59 and 60 are electrically coupled to B-port bit lines BLB and ZBLB, respectively.

Figure 17:
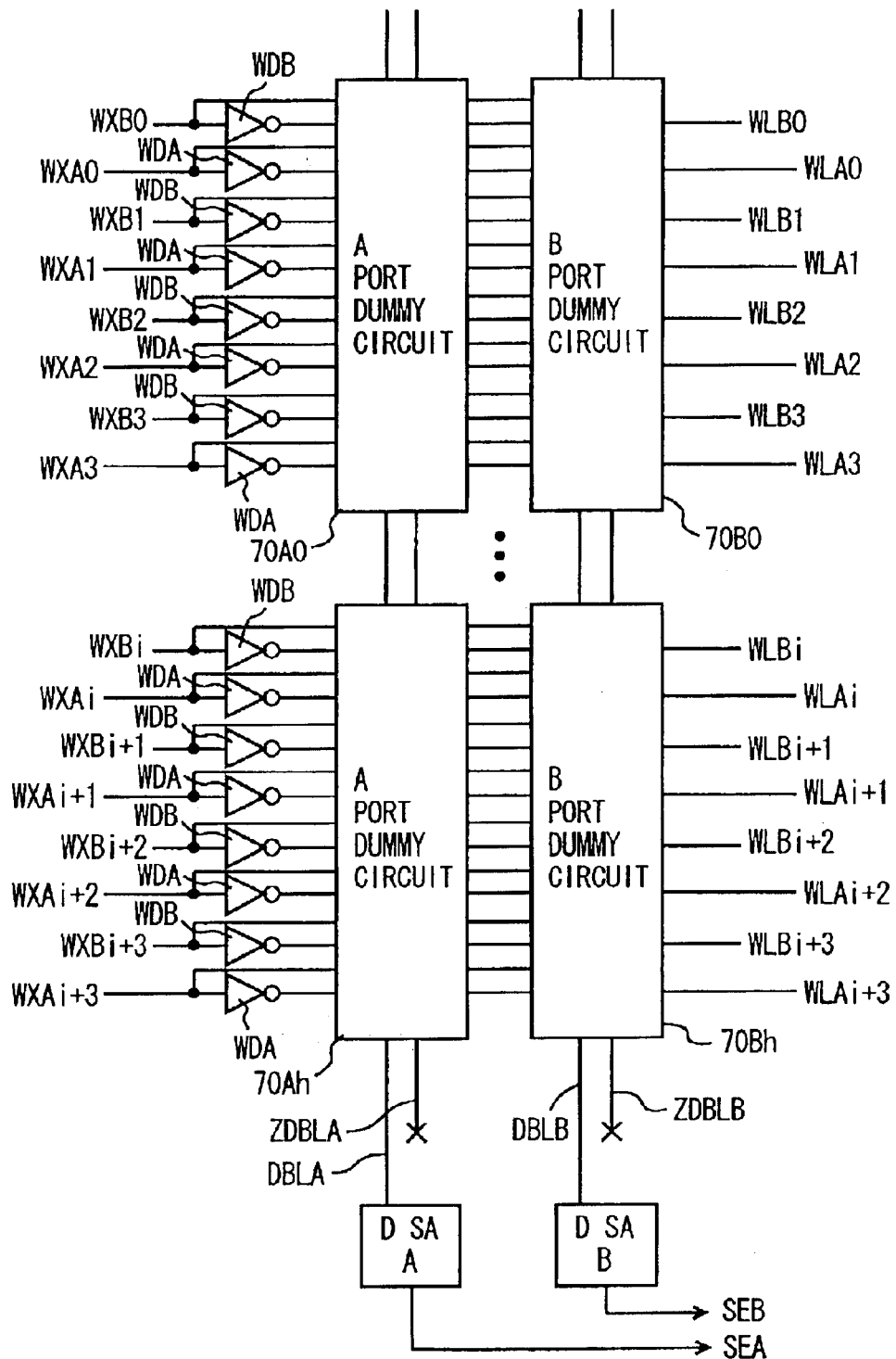
FIG. 17 is a schematic diagram showing the configuration of a part for generating sense enable signals according to the seventh embodiment of the present invention.

FIG. 17 is a schematic diagram showing a part for generating sense enable signals SEA and SEB. In FIG. 17, an A-port dummy circuit 70A0 and a B-port dummy circuit 70B0 are provided in correspondence to A-port word lines WLA0 to WLA3 and B-port word lines WLB0 to WLB3, and an A-port dummy circuit 70Ah and a B-port dummy circuit 70Bh are provided in correspondence to A-port word lines WLAi to WLAi+3 and B-port word lines WLBi to WLBi+3. A-port dummy circuit 70A (which generically represents A-port dummy circuit 70A0, 70Ah and others) is coupled to dummy bit lines DBLA and ZDBLA, and B-port dummy circuit 70B (which generically represents B-port dummy circuit 70B0, 70Bh and others) is coupled to dummy bit lines DBLB and ZDBLB.

A-port word lines WLA0 to WLA3 are driven by word drivers WDA that receive word line select signals WXA0 to WXA3, respectively, and B-port word lines WLB0 to WLB3 are driven by word drivers WDB that receive word line select signals WXB0 to WXB3, respectively.

A-port word lines WLAi to WLAi+3 are driven by word drivers WDA that receive word line select signals WXAi to WXAi+3, respectively, and B-port word lines WLBi to WLBi+3 are driven by word drivers WDB that receive word line select signals WXBi to WXBi+3, respectively.

A-port dummy circuit 70A0 drives dummy bit lines DBLA and ZDBLA in accordance with A-port word line select signals WXA0 to WXA3 and B-port word line select signals WXB0 to WXB3. Likewise, A-port dummy circuit 70Ah drives A-port dummy bit lines DBLA and ZDBLA in accordance with word line select signals WXAi to WXAi+3, WXBi+3, and WXBi to WXBi+3.

A-port dummy bit lines DBLA and ZDBLA are commonly provided to the A-port dummy circuits 70A, and precharged at power supply voltage level by a precharge circuit, not shown, in a standby state.

Likewise, B-port dummy circuit 70B0 drives b-port dummy bit lines DBLB and ZDBLB in accordance with word line select signals WXA0 to WXA3 and WXB0 to WXB3. B-port dummy circuit 70Bh drives B-port dummy bit lines DBLB and ZDBLB in accordance with word line select signals WXAi to WXAi+3. B-port dummy bit lines DBLB and ZDBLB are commonly provided to the B-port dummy circuits 70B, and precharged to power supply voltage level by a precharge circuit, not shown.

Dummy sense amplifiers DSAA and DSAB are provided in correspondence to dummy bit lines DBLA and DBLB, respectively. Sense enable signals SEA and SEB are outputted from dummy sense amplifiers DSAA and DSAB, respectively. One end of each of dummy bit lines ZDBLA and ZDBLB is kept in an open state. When the same row is accessed from the A port and B port, the dummy bit lines ZDBLA and ZDBLB are driven by A-port dummy circuit 70A and B-port dummy circuit 70B, respectively. In data access, while an arbitration is made for accesses to the same address, an access to memory cells TMC in different columns in the same row is permitted. Accordingly, there occurs the case that the same row is simultaneously accessed from the A port and the B port.

In the configuration of memory cell TMC shown in FIG. 16, if storage node 59 stores L-level data, both bit lines BLA and BLB are discharged by MOS transistor 53. Therefore, when the A-port word line and the B-port word line on the same row are simultaneously selected, the discharging of bit lines BLA and BLB are rate-determined by MOS transistor 53. As a result, compared with accesses to different rows, the potential changing rates of the bit lines are slow. To reflect a change in bit line potential changing rate in the simultaneous access to the same row, dummy bit lines ZDBLA and ZDBLB are provided for A-port dummy circuit 70A and B-port dummy circuit 70B, thereby slowing down the potential changing rates of dummy bit lines DBLA and DBLB.

In other words, A-port dummy circuit 70A for detecting a sense timing in an access from the A port and B-port dummy circuit 70B for determining a sense timing in an access from the B port are each arranged in correspondence to memory cells TMC on four rows. Therefore, dummy cells are arranged in four rows and one column in each of A-port dummy circuit 70A and B-port dummy circuit 70B.

Figure 18:
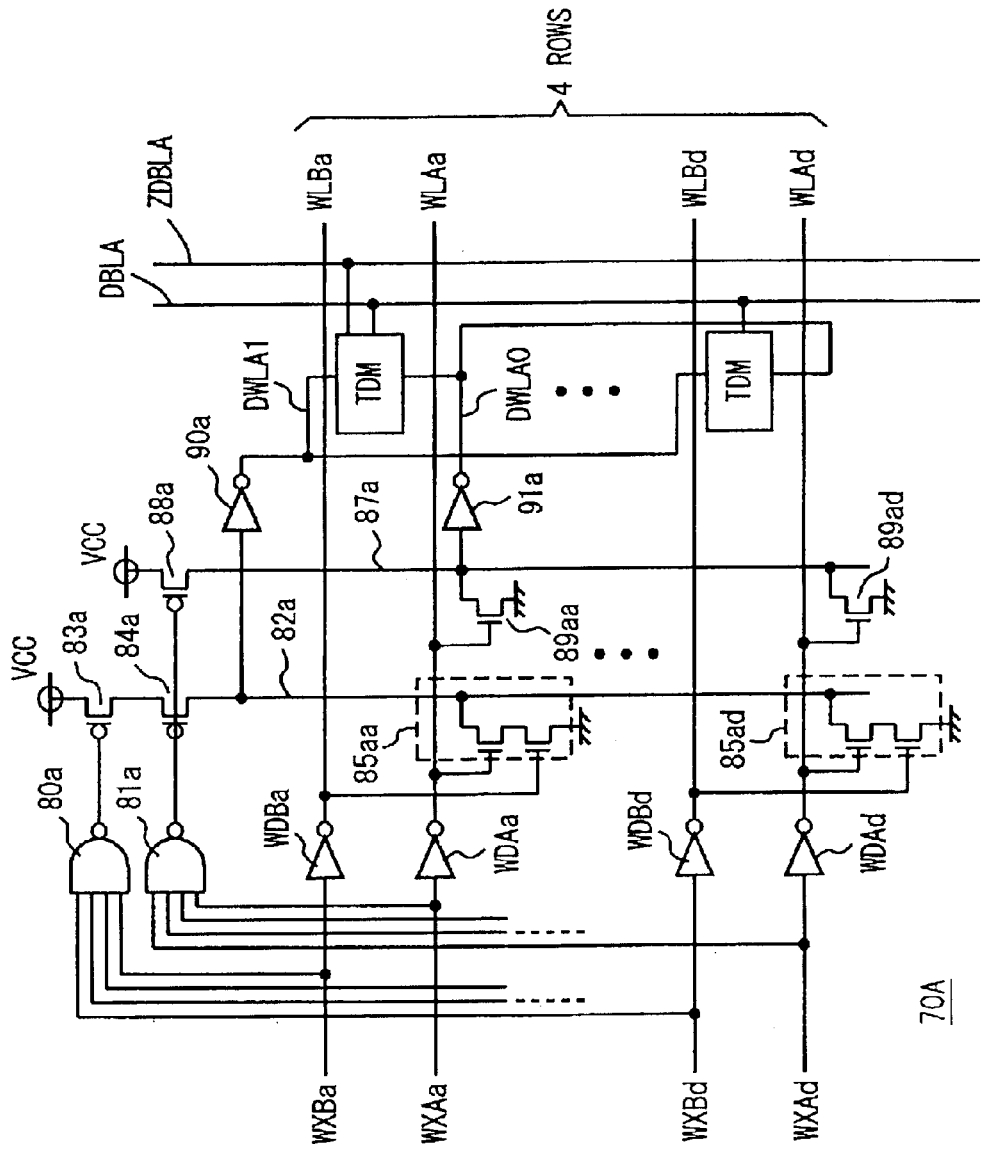
FIG. 18 shows the configuration of an A-port dummy circuit shown in FIG. 17.

FIG. 18 shows an example of the configuration of A-port dummy circuit 70A shown in FIG. 17. In FIG. 18, the configuration of A-port dummy circuit 70A which is arranged to word lines WLAa to WLAd and WLBa to WLBd arranged for memory cells TMC on four rows, is shown.

A-port word lines WLAa to WLAd are selectively driven into a selected state by word line drivers WDAa to WDAd that receive A-port word line select signals WXAa to WXAd, respectively. B-port word lines WLBa to WLBd are selectively driven into a selected state by word line drivers WDBa to WDBd that receive A-port word line select signals WXBa to WXBd, respectively.

A-port dummy circuit 70A includes: 2-port dummy cells TDM arranged in four rows and one column in correspondence to the memory cells in four rows, respectively; a logic circuit 81a receiving A-port word line select signals WXAa to WXAd; a logic circuit 80a receiving B-port word line select signals WXBa to WXBd; P-channel MOS transistors 83a and 84a connected in series between a signal line 82a and a power supply node and receiving the output signals of logic circuits 80a and 81a at their respective gates; a P-channel MOS transistor 88a selectively made conductive in accordance with the output signal of logic circuit 81a and precharging a signal line 87a to power supply voltage VCC level when conductive; dummy word lines DWLA0 and DWLA1 each commonly connected to dummy cells TDM in four rows; an inversion circuit 90a driving dummy word line DWLA1 in accordance with a potential on signal line 82a; and an inversion circuit 91a driving dummy word line DWLA0 in accordance with a potential on signal line 87a.

Logic circuit 80a and 81a, each formed of a NAND circuit or a circuit equivalent to the NAND circuit, and output H-level signals when one of word line select signals WXBa to WXBb and one of word line select signals WXAa to WXAd are driven into a selected state, respectively.

A-port dummy circuit 70A further includes: same row select detection circuits 85aa to 85ad for discharging signal line 82a to ground voltage level when sets of word lines WLAa, WLBa to WLAd, WLBd arranged in correspondence to the common memory cell rows are selected, respectively; and N-channel MOS transistors 89aa to 89ad arranged in correspondence to word lines WLAa to WLAd and discharging signal line 87a to ground voltage level when corresponding A-port word lines are selected, respectively.

Each of same row select detection circuits 85aa to 85ad includes N-channel MOS transistors which are connected in series between signal line 82a and a ground node, and the gates of MOS transistors are coupled to the corresponding A-port word line and B-port word line. Therefore, when both the A-port word line and the B-port word line arranged in correspondence to the memory cells in the same row are driven into a selected state, signal line 82a is discharged to ground voltage level. Signal line 87a is driven to ground voltage level when one of A-port word lines WLAa to WLAd is driven into a selected state.

Figure 19:
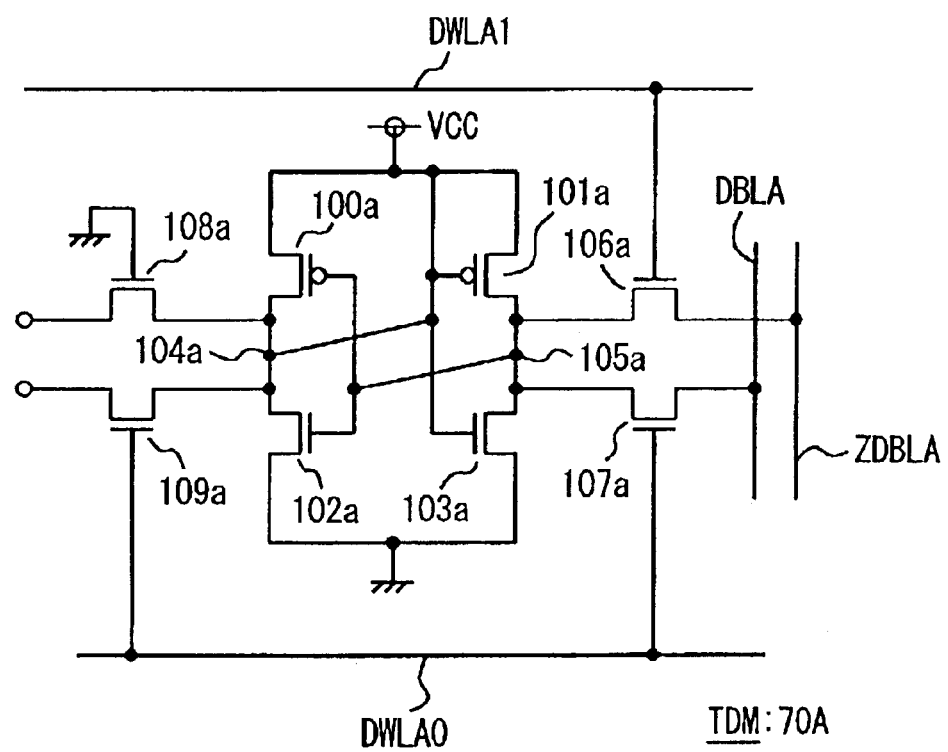
FIG. 19 shows an example of the configuration of a 2-port dummy cell shown in FIG. 18.

FIG. 19 shows an example of the configuration of 2-port dummy cell TDM included in A-port dummy circuit 70A shown in FIG. 18. In FIG. 19, 2-port dummy cell TDM includes: a P-channel MOS transistor 100a connected between a power supply node and a node 104a and having a gate connected to a node 105a; a P-channel MOS transistor 101a connected between the power supply node and node 105a and having a gate connected to a node 104a; an N-channel MOS transistor 102a connected between node 104a and a ground node and having a gate connected to node 105a; and an N-channel MOS transistor 103a connected between node 105a and ground node and having a gate connected to node 104a.

By connecting the gates of MOS transistors 101a and 103a to the power supply node through interconnection, node 105a can be fixed to ground voltage level to store L-level data as fixed data.

2-port dummy cell TDM further includes: an N-channel MOS transistor 107a electrically connecting node 105a to dummy bit line DBLA in response to a signal on dummy word line DWLA0; and an N-channel MOS transistor 106a electrically connecting node 105a to complementary dummy bit line (sub-dummy bit line) ZDBLA in response to a signal on dummy word line DWLA1. Dummy bit line DBLA is electrically coupled to dummy sense amplifier DSA. One end of dummy bit line ZDBLA is kept in an open state.

Further, 2-port dummy cell TDM includes N-channel MOS transistors 108a and 109a provided for node 104a. A ground voltage is applied to the gates of N-channel MOS transistors 108a and 109a, whereby N-channel MOS transistors 108a and 109a are always kept nonconductive. Alternatively, N-channel MOS transistors 108a and 109a may have their respective gates coupled to dummy word lines DWLA1 and DWLA0 and their respective source terminals connected to a power supply line.

In 2-port dummy cell TDM shown in FIG. 19, when dummy word line DWLA1 is driven into a selected state, i.e., A-port word line WLA and B-port word line WLB arranged in the same row are simultaneously driven into a selected state as shown in FIG. 18, MOS transistor 106a is made conductive and node 105a is electrically coupled to sub-dummy bit line ZDBLA. In this case, dummy word line DWLA0 is also driven into a selected state, whereby MOS transistor 107a is made conductive and node 105a is electrically connected to dummy bit line DBLA. Therefore, a current flows from dummy bit lines DBLA and ZDBLA to the ground node through MOS transistor 103a. It is thereby possible to generate, on the dummy bit line DBLA, a potential change reflecting the potential change on the normal bit lines when the word lines on the same row in the normal memory cells are selected simultaneously and data is read.

Figure 20:
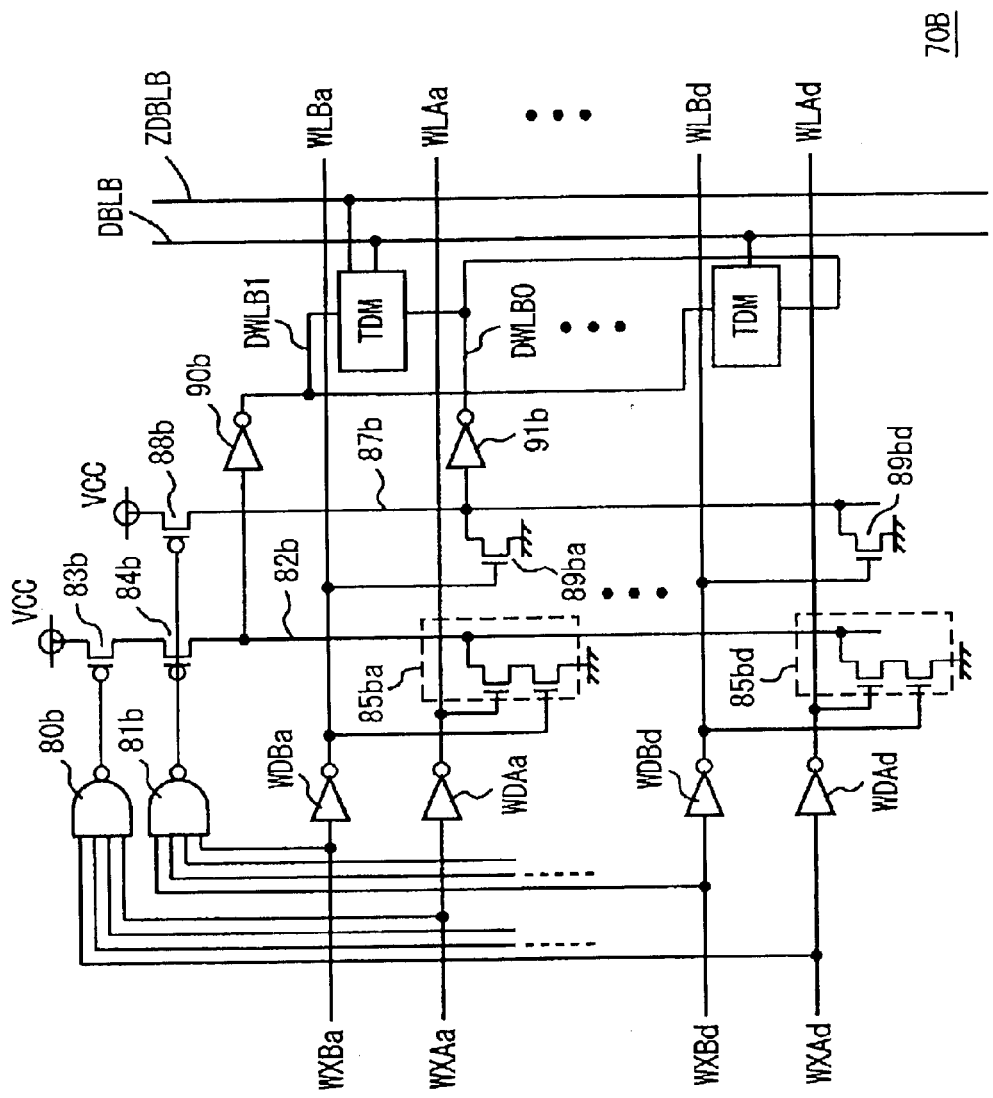
FIG. 20 shows the configuration of a B-port dummy circuit shown in FIG. 19.

FIG. 20 shows an example of the configuration of B-port dummy circuit 70B shown in FIG. 17.

B-port dummy circuit 70B shown in FIG. 20 is equivalent in configuration to A-port dummy circuit 70A shown in FIG. 18. Dummy word lines DWLB0 and ZDWLB1 are commonly connected to 2-port dummy cells TDM arranged in four rows and one column. 2-port dummy word cells TDM are selected in accordance with signal potentials on dummy word lines DWLB0 and DWLB1, and dummy bit lines DBLB and ZDBLB are driven. In the configuration of B-port dummy circuit 70B shown in FIG. 20, the corresponding components of the components in A-port dummy circuit 70A shown in FIG. 18 are denoted by the same reference numerals while a first subscript "a" is replaced by subscript "b" so as to show the correspondence and the detailed description of the configuration will not be repeated.

Logic circuits 80b and 81b output H-level signals when one of A-port word line select signals WXAa to WXAb is selected and when one of B-port word line select signals WXBa to WXBb is selected, respectively. When conductive, MOS transistors 83b and 84b charge the signal line 82b to power supply voltage VCC level. Therefore, in the B-port dummy circuit, when A-port and B-port word lines in the same row are simultaneously selected, MOS transistors 83b and 84b turn nonconductive. In this state, signal line 82b is discharged to ground voltage level by one of same row select detection circuits 85ba to 85bb.

If either of B-port word line select signals WXBa to WXBd is selected, MOS transistor 88b turns nonconductive and the precharging of signal line 87b to power supply voltage level is completed. In this case, one of discharging N-channel MOS transistors 89ba to 89bd provided to word lines WLBa to WLBd, respectively, is turned on, and signal line 87b is discharged to ground voltage level. The signal potentials of signal lines 82b and 87b are inverted by inversion circuits 90b and 91b, which in turn drive dummy word lines DWLB1 and DWLB0, respectively. Therefore, when either of word lines WLBa to WLBd is driven into a selected state during an access from this B-port, dummy word line DWLB0 is driven into a selected state. When the word lines on the same row are concurrently driven into a selected state, dummy word line DWLB1 is driven into a selected state.

FIG. 21 shows the configuration of 2-port dummy cell TDM included in B-port dummy circuit 70B shown in FIG. 20. 2 port dummy cell TDM shown in FIG. 21 is the same in configuration as 2 port dummy cell TDM included in A-port dummy circuit 70A shown in FIG. 19 except that the dummy word lines and dummy bit lines are denoted by different reference names from those shown in FIG. 19. Therefore, in order to clarify that dummy bit line DBLB is driven in an access from the B port, the corresponding components in the configuration of dummy cell shown in FIG. 21 are denoted by the same reference numerals as those shown in FIG. 19 while subscript "a" is replaced by subscript "b", the detailed description thereof will not be repeated.

In 2 port dummy cell TDM shown in FIG. 21, when dummy word line DWLB0 is driven into a selected state, MOS transistor 107b is made conductive and node 105b is coupled to dummy bit line DBLB. When dummy word line DWLB1 is driven into a selected state, MOS transistor 106b is made conductive and node 105b is electrically coupled to complementary dummy bit line (sub-dummy bit line) ZDBLB. Now, the operation of the semiconductor memory device shown in FIGS. 15 to 21 will be described.

The basic operation is the same as that of a single port SRAM in which data is accessed through a single port. However, since the A port and the B port operate independently of each other, in some cases, the operations of the A and B ports interfere with each other in accordance with each operation timing and each access target address. While taking an access conflict, or the interference of the operations into consideration, two operation states will be individually described.

(a) In the case of no concurrent accesses to the same row:

Most of access operations are performed under this operation state. That is, in this operation state, the A-port word line and the B-port word line in the same row are not simultaneously driven into a selected state. Viewed from memory cell TMC, corresponding two word lines are not driven into a selected state simultaneously and concurrently.

FIG. 22 is a operation timing chart focusing on the port A in the case of no such concurrent selection. It is assumed here that the port B operates under the condition that the port B does not interfere with the operation of the port A.

In response to an access from the port A, A-port word line WLA is driven into a selected state. At this time, B-port word line WLB on the same row as selected A-port word line WLA is kept in an unselected state. In response to selection of A-port word line WLA, access transistors 57 and 58 of each memory cell TMC shown in FIG. 16 are made conductive and storage nodes 59 and 60 are electrically connected to bit lines BLA and ZBLA, respectively.

At the same time, the output signal of logic circuit 81a shown in FIG. 18 attains H level and MOS transistor 88a shown in FIG. 18 turns nonconductive. On the other hand, either of MOS transistors 89aa to 89ad shown in FIG. 18 is made conductive, signal line 87a is driven to ground voltage level, and the voltage level of dummy word line DWLA0 is raised by the output signal of inversion circuit 91a shown in FIG. 18. Accordingly, MOS transistor 107a shown in FIG. 19 is made conductive, dummy bit line DBLA is discharged through MOS transistor 103a and the voltage level of dummy bit line DBLA lowers. Dummy sense amplifier DSAA provided to dummy bit line DBLA raises its output signal to H level and sense enable signal SEA is driven to H level when the voltage level of dummy bit line DBLA reaches VCC/2.

Concurrently with the selection of A-port word line WLA, a column select operation is performed. When bit line potentials of selected columns are transmitted to sense amplifiers SAA0 to SAAk shown in FIG. 15 through multiplexers MUX0 to MUXk, respectively, sense amplifiers SAA0 to SAAk differentially amplify the potential differences in response to activation of sense enable signal SEA and generate internal read data QA (QA0 to QAk).

Where the A port and the B port do not access the word lines on the same row simultaneously, the circuitry related to the access operation from the B port does not affect the access from the A port. Therefore, 2-port SRAM performs the same operation as that of a single-port SRAM, whereby it is possible to detect the potential of dummy bit line DBLA and to set a sense timing for the A port access.

In case of this 2-port SRAM, similarly to the single-port SRAM, in the A-port dummy circuit, in word line selection, four dummy cells TDM are simultaneously driven into a selected state. It is therefore possible to lower the potential of dummy bit line DBLA at a rate four times as fast as that of normal bit line BLA or ZBLA, to reduce a bit line swing and to perform a sensing operation as in the case of the single port SRAM.

In B-port dummy circuit 70B related to the B port, in an access from the B port, by employing signals related to the B port in place of those related to the A port in the signal waveform diagram shown in FIG. 22, the operation waveforms of B-port dummy circuit 70B can be obtained.

(b) In the case of occurrence of concurrent access to the same row from the A port and the B port:

In many cases, 2-port RAM is prohibited from performing an operation of simultaneously accessing the same address (row and column addresses) from different ports. This is because if the same address is accessed from the A port and the B port, data at the access target address is would be destructed in high probability. However, since it is only prohibited to simultaneously access the same address, a state in which word lines in the same row are simultaneously (concurrently) driven into a selected state can possibly occur.

Concurrent accesses to the word lines in the same row would cause the worst condition in terms of circuit operation. The reason why this circuit operation is performed under the worst condition will be described below.

Figure 23:
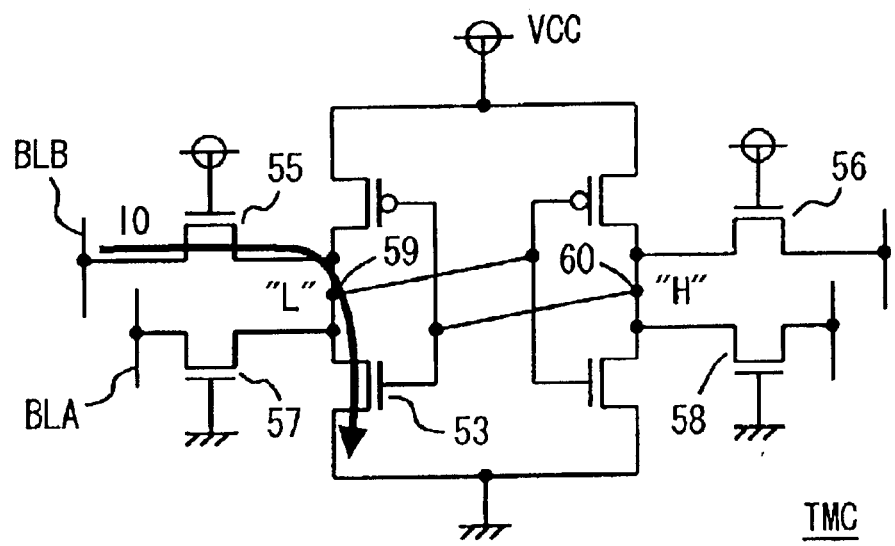
FIG. 23 shows a bit line current in single port access.

FIG. 23 shows a flow of a bit line current in the case when memory cell TMC is accessed from one port. In FIG. 23, the respective components of memory cell TMC are denoted by the same reference numerals as those of the corresponding components of memory cell TMC shown in FIG. 16. A case will be considered where an access is made from the port B and the B-port word line is driven into a selected state. In this case, access transistors 55 and 56 receive signals at power supply voltage level at the gates thereof and turn conductive. On the other hand, since the A-port word line is unselected, the gate voltages of access transistors 57 and 58 are at ground voltage level. It is assumed here that storage node 59 stores L-level data and storage node 60 stores H-level data. In this case, a current flows from B-port bit line BLB through MOS transistors 55 and 53. The magnitude of a current I0 flowing through bit line BLB is determined by the current driving ability of driving MOS transistor 53 of memory cell TMC.

Figure 24:
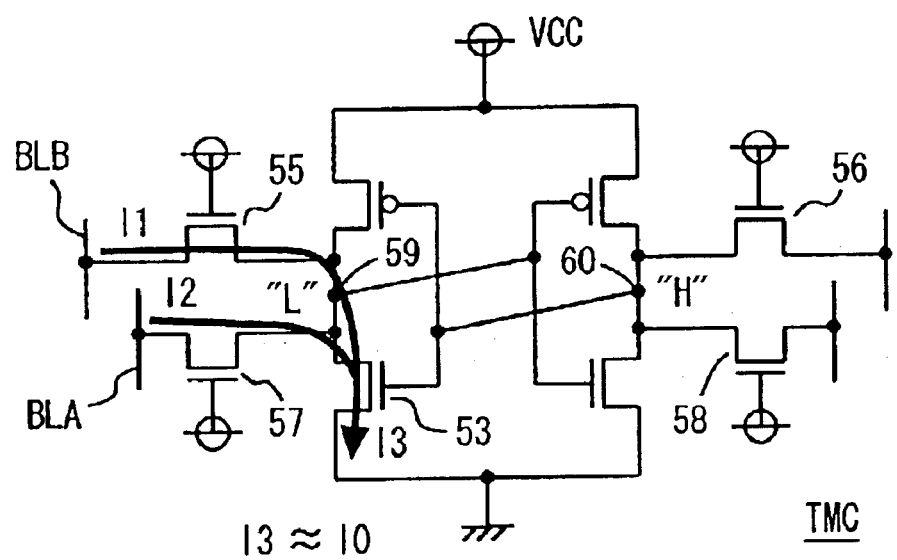
FIG. 24 shows a bit line current when the same row is selected simultaneously.

FIG. 24 shows a state of memory cell TMC in the case when accesses to the same row from the A port and the B port simultaneously occur. When the A port and the B port select the same row, access transistors 55 and 56 receive power supply voltages at the gates thereof and are made conductive and access transistors 57 and 58 similarly receive power supply voltages at the gates thereof and are made conductive in memory cell TMC. Storage nodes 59 and 60 store L-level data and H-level data, respectively. In this case, in memory cell TMC, a current I1 flows in from B-port bit line BLB and a current I2 flows in from A-port bit line BLA. The sum of currents I1 and I2 provides a current I3 that flows through MOS transistor 53.

The sum I3 of currents I0 and I2 is equal to drive current I3 of MOS transistor 53. Therefore, when the same row is simultaneously accessed from the A port and the B port, bit line currents I1 and I2 are rate-determined by the current driving ability of MOS transistor 53. In this case, the following relationship is normally satisfied.

$$I1+I2=I3<2\cdot I0$$

When the same row is simultaneously accessed from the port A and the port B, current I3 flowing through MOS transistor 53 is substantially equal to current I0 shown in FIG. 23. Therefore, if the same row is simultaneously accessed from the port A and the port B, each of bit line currents I1 and I2 is smaller than current I0. That is, the current extracting speed of a bit line per access transistor becomes slow if the same row is simultaneously accessed from the port A and the port B as shown in FIG. 24. Therefore, if a sense enable timing is designed on the assumption of simultaneous accesses to the same row, a sense timing for a signal port access which is normally performed more frequently is made unnecessarily delayed. In this case, the delay of the sense timing causes the potential difference between the bit lines to be further developed, resulting in an increased current consumption.

Accordingly, if the bit line potential changing rate is slowed down in the simultaneous accesses to the same row, dummy bit lines DBL (DBLA, DBLB) and ZDBL (ZDBLA, ZDBLB) are both connected to the same internal (storage) node of the dummy cell, whereby it is possible to adjust the potential changing rates of the dummy bit lines.

Figure 25:
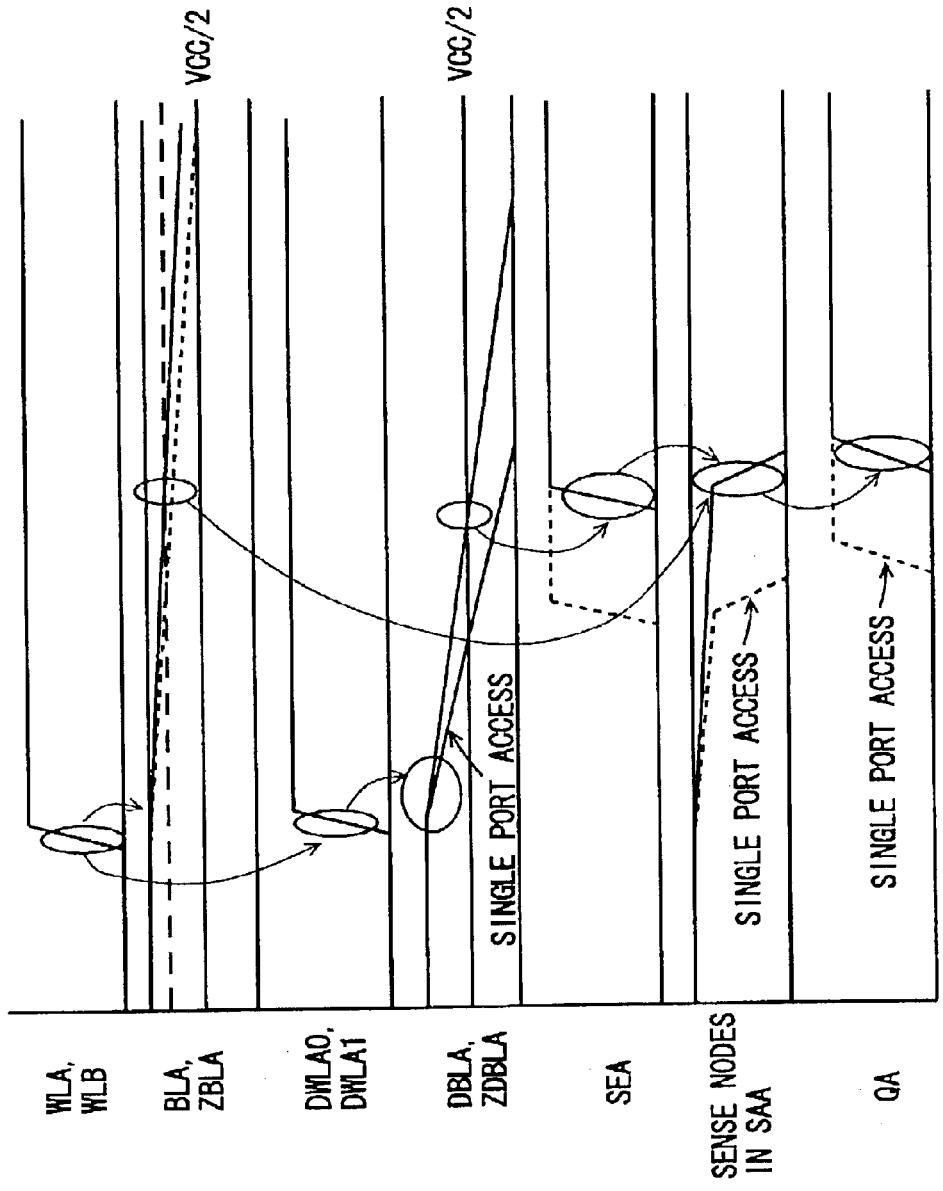
FIG. 25 is a signal waveform diagram representing an operation of the semiconductor memory device according to the seventh embodiment of the present invention when the same row is simultaneously selected.

FIG. 25 is a signal waveform diagram representing an operation of in the case of the simultaneous access to the same row. In FIG. 25, signal waveforms are shown focusing on the A port.

First, in response to accesses to the same row from the A port and the B port, both A-port world line WLA and B-port word line WLB are driven to H level. In response to driving of A-port word line WLA to a selected state, all the access transistors of memory cells TMC connected to selected A-port word line WLA turn conductive. Specifically, in memory cell TMC shown in FIG. 16, all of access transistors 55 to 58 become conductive. Accordingly, the potential of one of bit lines BLA and ZBLA lowers according to the stored data of the corresponding memory cell. In this case, as already described with reference to FIG. 24, the potential of this bit line lowers more slowly than in the single port access.

If both A-port word line WLA and B-port word line WLB are driven into a selected state, output signals of logic circuits 80a and 81a shown in FIG. 18 attain H level and an operation of charging signal lines 82a and 87a is completed in A-port dummy circuit 70A. In this state, since the word lines in the same row are simultaneously selected, both of signal lines 82a and 87a are discharged to ground voltage level and the voltage levels of dummy word lines DWLA0 and DWLA1 are raised to H level, accordingly.

If both of dummy word lines DWLA0 and DWLA1 attain H level, access transistors 106a and 105a of dummy cell TDM shown in FIG. 19 are made conductive and the potentials of dummy bit lines DBLA and DBLB lower. In this case, since dummy bit lines DBLA and ZDBLA are discharged through MOS transistor 103a shown in FIG. 19 in dummy cell TDM, the potential decreasing rates of the bit lines are lower than in an access from a single port. When the potential of dummy bit line DBLA reaches, for example, intermediate voltage VCC/2, then sense enable signal SEA from sense amplifier DSAA shown in FIG. 17 rises to H level, sense amplifiers SAA0 to SAAk shown in FIG. 15 are each activated to differentially amplify the potential differences between the internal nodes, and generate internal read data QA.

Therefore, even if the potential decreasing rates of bit lines BLA and ZBLA are slow in the case of simultaneous access to the same row, the potential decreasing rate of dummy bit line DBLA is similarly lowered by commonly connecting dummy bit line ZDBL to the internal node of dummy cell TDM. It is therefore possible to discharge each dummy bit line at a potential changing rate that reflects a decrease in bit line potential changing rate. It is thereby possible to activate sense enable signal SEA accurately when the potential difference between bit lines BLA and ZBLA, i.e., the potential difference between the sense nodes in sense amplifier SAA is increased to an appropriate voltage level, and it is possible to perform an accurate sensing operation.

In the operation shown in FIG. 25, bit lines BLB, ZBLB and dummy bit line DBLB related to the B port cause the similar potential change. Therefore, whichever port makes an access, it is possible to perform a sensing operation at an accurate timing.

Furthermore, dummy bit lines DBLB and ZDBLB are employed to slow down the potential decreasing rates of the dummy bit lines in the case of simultaneous access to the same row. These dummy bit lines are precharged at power supply voltage VCC level in a standby state by a load circuit, not shown, as in the case of normal bit lines BLA, ZBLA.

By providing A-port dummy circuit 70A and B-port dummy circuit 70B, it is possible to accurately activate the A-port sense amplifier and the B-port sense amplifier in an access from the A port and in an access from the B port. Further, even if the same row is simultaneously accessed, it is possible to adjust the activation timings of sense enable signals SEA and SEB in accordance with the potential decreasing rates of the bit lines, respectively.

In the configuration of B-port dummy circuit 70B shown in FIG. 20, for example, when A-port word line WLAa and B-port word line WLBd are simultaneously selected, the output signals of logic circuits 80b and 81b attain H level and signal lines 82b and 87b have the charging operation thereon stopped. In this state, however, the circuits 85ba to 85bd for detecting the simultaneous selection of the same row are nonconductive, signal line 82b is not discharged, but only signal line 87b is discharged. As a result, dummy word line DWLB0 is driven into a selected state while dummy word line DWLB1 is kept unselected. Therefore, as in the case of the single port access, dummy bit line DBLB is discharged by dummy cells TDM of 4 bits at a rate four times as fast as the discharging rate of the normal bit lines. The similar operation is performed in A-port dummy circuit 70A. Accordingly, if the different columns on the same word line are accessed, it is possible to discharge the dummy bit lines at the similar rate to that in the single port access.

Therefore, only when the A-port word line and the B-port word line arranged in the same row are simultaneously selected, complementary dummy bit lines ZDBLB and ZDBLA are electrically commonly coupled to the internal node of dummy cell TDM, making it possible to slow down the potential decreasing rates of the dummy bit lines.

As described above, according to the seventh embodiment of the present invention, the dummy circuits are provided for the A port and the B port, respectively, in 2-port SRAM. When the same row is accessed from the A port and the B port, the internal storage nodes of the dummy cells included in the dummy circuits are electrically coupled to the complementary dummy bit lines. Therefore, even in the case of simultaneous access to the same row in 2-port SRAM, it is possible to accurately adjust the potential changing rates of the dummy bit lines in accordance with the potential changes of the normal bit lines, and it is accordingly possible to accurately generate a sense enable timing, irrespectively of the array architecture and the operation states.

Eighth Embodiment

Figure 26:
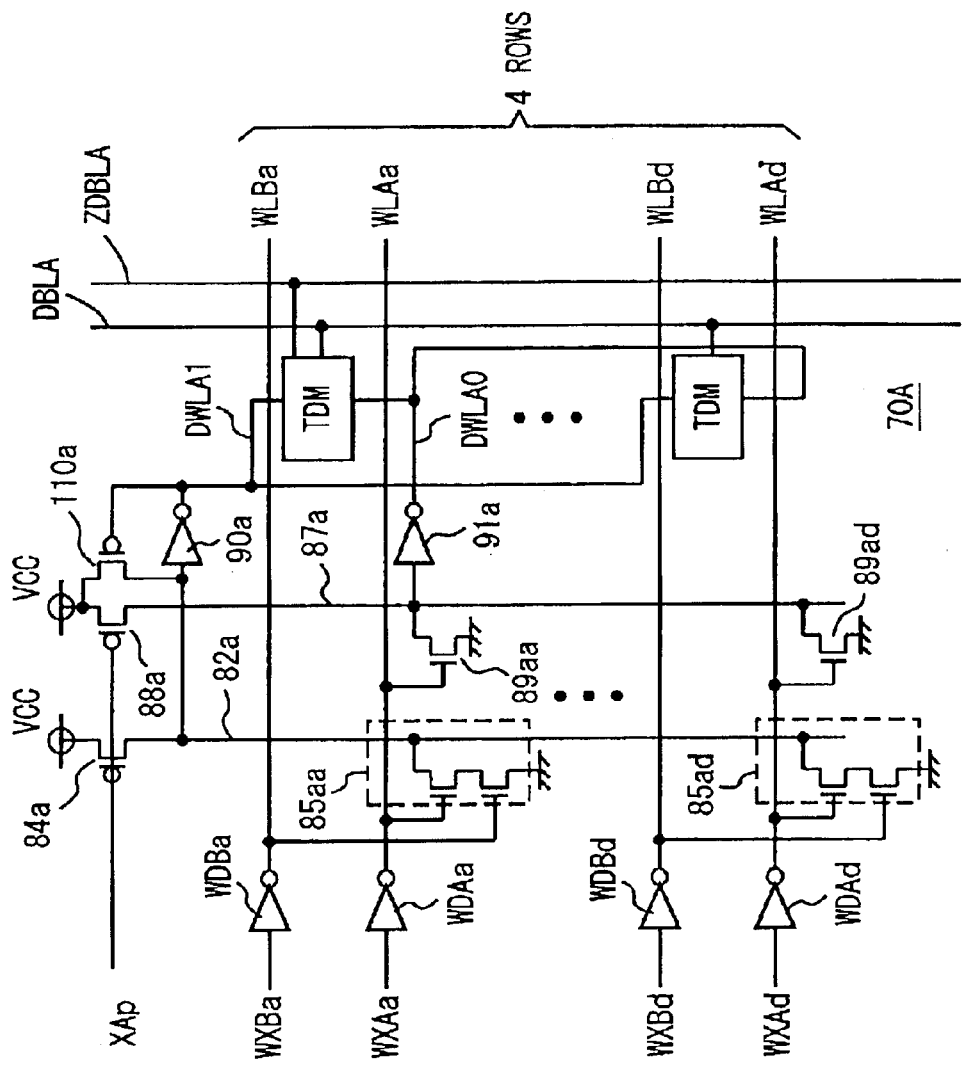
FIG. 26 shows the configuration of a dummy circuit according to an eighth embodiment of the present invention.

FIG. 26 shows the configuration of A-port dummy circuit 70A according to an eighth embodiment of the present invention. The configuration of A-port dummy circuit 70A shown in FIG. 26 differs from that A-port dummy circuit 70A shown in FIG. 18 in the following points. Signal line 82a is coupled to a power supply node through MOS transistor 84a. A-port word line group select signal XAp (predecode signal) is applied to the gates of MOS transistors 84a and 88a. Signal line 82a is also coupled to a power supply node through a P-channel MOS transistor 110a receiving the output signal of inversion circuit 90a at a gate thereof.

A-port word line group select signal XAp corresponds to word line group select signal Xp shown in FIG. 7, and is driven into a selected state when either of A-port word lines WLa to WLd is selected.

The other components of A-port dummy circuit 70A shown in FIG. 26 are the same as those of A-port dummy circuit 70A shown in FIG. 18. The corresponding components are denoted by the same reference numerals as those in FIG. 18, and the detailed description will not be repeated.

In the configuration of A-port dummy circuit 70A shown in FIG. 26, A-port word line group select signal XAp is employed to control the charging of signal lines 82a and 87a. Therefore, logic circuits 80a and 81a shown in FIG. 18 are unnecessary, making it possible to decrease an area occupied by A-port dummy circuit 70A.

When A-port word line group select signal XAp attains H level of a selected state, either one of A-port word lines WLAa to WLAd is driven into a selected state. In this case, signal line 87a is discharged by either of MOS transistors 89aa to 89ad. Accordingly, dummy word line DWLA0 is driven to H level by inversion circuit 91a, and dummy bit line DBLA is discharged. If all of B-port word lines WXBa to WXBd are unselected, signal line 82a is not discharged. This is because same row select detection circuits 85aa to 85ad are all nonconductive. In this state, the output signal of inversion circuit 90a is at L level, MOS transistor 110a is maintained conductive, and signal line 82a is kept at power supply voltage VCC level.

When the same row is accessed from the A port and the B port, then signal line 82a is discharged, dummy word line DWLA1 is driven into a selected state, dummy bit line ZDBLA is discharged, and the discharging rate of dummy bit line DBLA is decreased.

In the configuration shown in FIG. 26 as well, when an operation cycle is short and even if the signal line turns into a floating state, the leak current in signal line 82a in the floating state is small to cause a negligible voltage drop thereon, and no malfunction occurs, it is unnecessary to provide MOS transistor 110a.

Furthermore, an A-port precharge signal may be employed in place of A-port word line group select signal XAp.

As for B-port dummy circuit 70B, a B-port word line group select signal is merely employed in place of A-port word group select signal in the configuration shown in FIG. 20. In this case, the configuration of B-port dummy circuit 70B is obtained by replacing the signals related to the A port by those related to the B port in the configuration of A-port dummy circuit 70A shown in FIG. 26.

With the configuration shown in FIG. 26, the similar operation is performed to that in the seventh embodiment and the similar effects to those in the seventh embodiment can be achieved.

As described above, according to the eighth embodiment of the present invention, the port word line group select signal is utilized to control the charging of the signal lines for detecting whether a word line is selected or unselected. It becomes unnecessary to detect whether a word line is selected or unselected on the basis of the word line select signal or word line drive signal, making it possible to decrease an area occupied by each port dummy circuit.

It is noted that A-port word line group select signal XAp can be generated using a similar configuration to that in the fourth embodiment.

Ninth Embodiment

Figure 27:
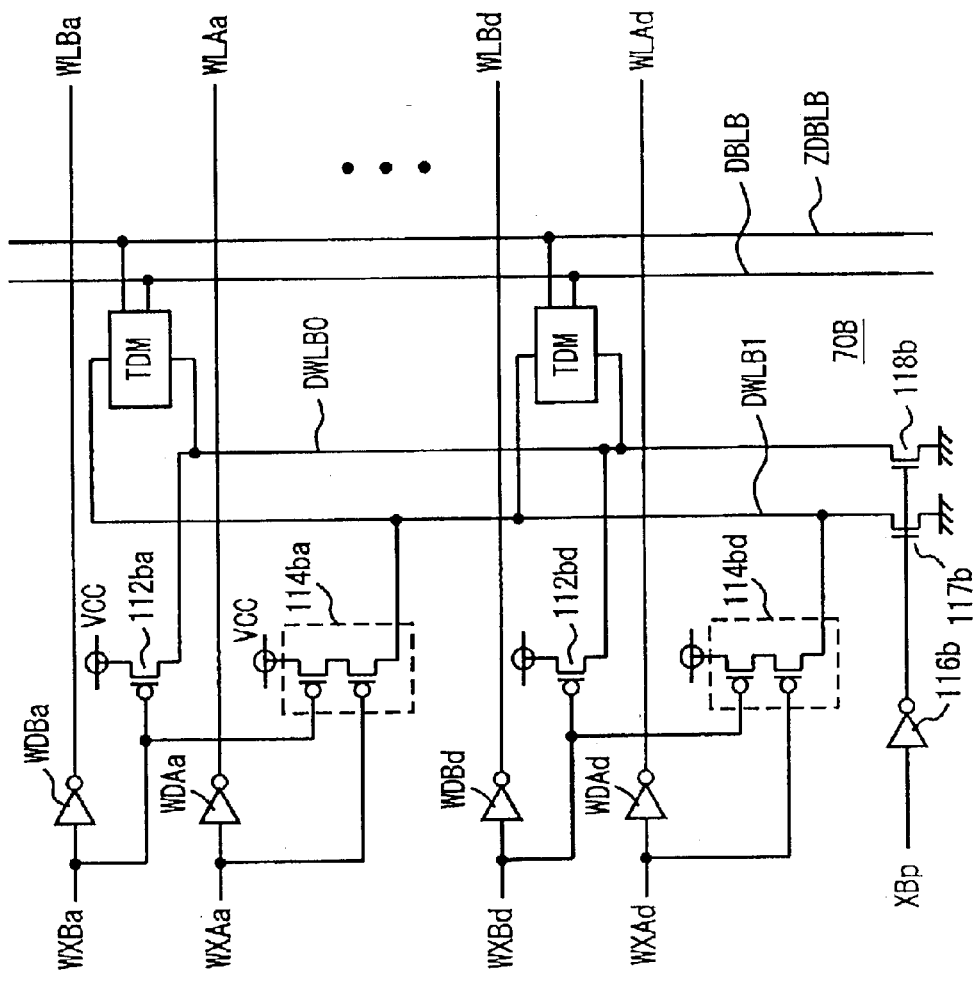
FIG. 27 shows the configuration of a B-port dummy circuit according to a ninth embodiment of the present invention.

FIG. 27 is a schematic diagram showing the configuration of B-port dummy circuit 70B according to a ninth embodiment of the present invention. In the configuration shown in FIG. 27 as well, word lines WLAa to WLAd and WLBa to WLBd are provided for B-port dummy circuit 70B. That is, 2-port dummy cells TDM are arranged in four rows and one column in correspondence to normal memory cells in four rows. 2-port dummy cells TDM of 4 bits are commonly coupled to dummy word lines DWLB0 and DWLB1. The connection of dummy wordlines DWLB0 and DWLB1 to 2-port dummy cells TDM is the same as that for the dummy cells shown in FIG. 19.

Word lines WLAa to WLAd are driven by word line drivers WDAa to WDAd receiving A-port word line select signals WXAa to WXAd, respectively. Word lines WLBa to WLBd are driven by word line drivers WDBa to WDBd receiving B-port word line select signals WXBa to WXBd, respectively.

P-channel MOS transistors 112ba to 112bd that are made conductive, when B-port word line select signals WXBa to WXBd are selected, to charge dummy word line DWLB0 to power supply voltage VCC level, are provided in correspondence to B-port word lines WLBa to WLBd, respectively. In addition, same row select detection circuits 114ba to 114bd, which are each made conductive, when word line select signals for word lines in the same row are simultaneously selected, to charge dummy word line DWLB1 to power supply voltage VCC level, are provided in correspondence to the respective memory cell rows.

Dummy word lines DWLB1 and DWLB0 are coupled to ground nodes through N-channel MOS transistors 117b and 118b that are selectively made conductive in accordance with the output signal of an inversion circuit 116b receiving a B-port word line group select signal XBp.

In the configuration of B-port dummy circuit 70B shown in FIG. 27, when either one of B-port word lines WLBa to WLBd is selected, dummy word line DWLB0 is driven to power supply voltage level by corresponding MOS transistor 112b (either of transistors 112ba to 112bd), and dummy bit line DBLB is responsively discharged by 2-port dummy cells TDM of 4 bits.

At this time, when word lines in the same row are simultaneously selected, either of same row select detection circuits 114ba to 114bd charge dummy word line DWLB1 to power supply voltage VCC level and complementary dummy word line ZDBLB is similarly discharged by 2-port dummy cells TDM of 4 bits.

With the configuration of B-port dummy circuit 70b shown in FIG. 27 as well, therefore, the similar operation to that of the dummy circuit described in the seventh embodiment is performed and the similar effects to those in the seventh embodiment can be achieved.

With the circuit configuration shown in FIG. 27, dummy word lines DWLB0 and DWLB1 are charged in accordance with word line select signals WXBa to WXBd and WXAa to WXAd. Therefore, no loads are connected to word lines WLBa to WLBd and WLAa to WLAd, making it possible to charge and discharge word lines WLBa to WLBd and WLAa to WLAd at high speed.

Furthermore, since dummy word lines DWLB0 and DWLB1 are driven directly in accordance with the word line select detection result, a signal line for detecting word line selection is unnecessary, making it possible to decrease a circuit occupying area. Besides, since there is no charging and discharging of the signal line for detecting word line selection, it is possible to reduce current consumption.

In the configuration of B-port dummy circuit 70B shown in FIG. 27 as well, word line group select signal XBp may be replaced by the precharge signal. In addition, if there is a possibility that dummy word line DWLB1 turns into a floating state to cause the voltage level thereof to be unstable in a single port access, such a feedback path is provided that N-channel MOS transistor selectively rendered conductive in accordance with an inverted signal of the output signal of inversion circuit 116b is used to maintain dummy word line DWLB1 at ground voltage level.

When B-port word lines WLBa to WLBd are exchanged in position with A-port word lines WLAa to WLAd in the configuration of B-port dummy circuit 70B shown in FIG. 27, it is possible to obtain the configuration for an A-port dummy circuit.

As described above, according to the ninth embodiment of the present invention, the potentials of the dummy word lines are made to be driven in accordance with the select signals. Therefore, the loads of the word lines are mitigated and high speed operation can be achieved.

Furthermore, since the signal line for detecting word line selection is unnecessary, it is possible to decrease a circuit occupying area and to decrease current consumption.

Tenth Embodiment

Figure 28:
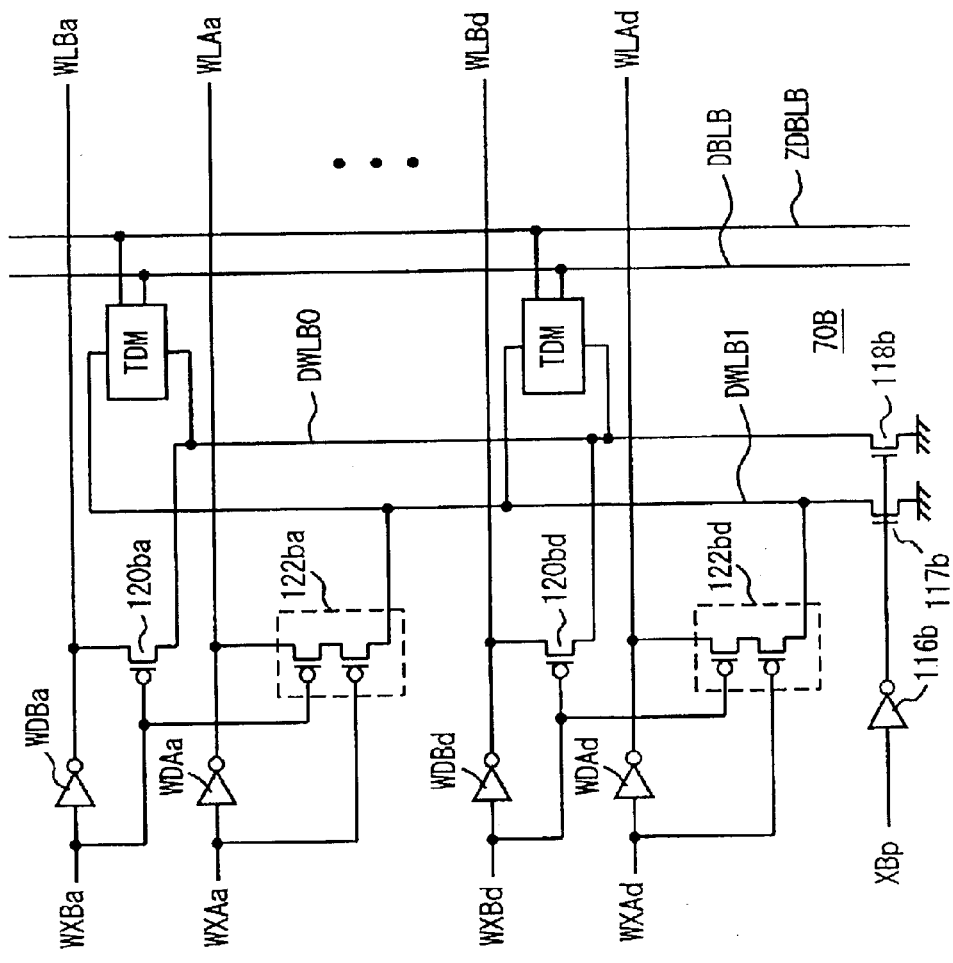
FIG. 28 shows the configuration of a B-port dummy circuit according to a tenth embodiment of the present invention.

FIG. 28 shows the configuration of B-port dummy circuit 70B according to a tenth embodiment of the present invention. In FIG. 28, word lines WLAa to WLAd and WLBa to WLBd are provided for B-port dummy circuit 70B.

Word lines WLBa to WLBd are driven by word line drivers WDBa to WDBd that receive B-port word line select signals WXBa to WXBd, respectively. Word lines WLAa to WLAd are driven by word line drivers WDAa to WDAd that receive A-port word line select signals WXAa to WXAd, respectively.

B-port dummy circuit 70B includes: 2-port dummy cells TDM arranged in four rows and one column; dummy word lines DWLB0 and DWLB1 commonly coupled to 2-port dummy cells TDM; P-channel MOS transistors 120*ba* to 120*bd* selectively made conductive in response to B-port word line select signals WXBa to WXBd, and coupling corresponding word lines WLBa to WLBd to dummy word line DWLB0 when conductive, respectively; and same row select detection circuits 122*ba* to 122*bd* electrically coupling A-port word lines WLAa to WLAd to dummy word line DWB1 in accordance with word line select signals for the same rows, respectively. Same row select detection circuits 122*ba* to 122*bd* are formed of series bodies of P-channel MOS transistors receiving, at the gates, corresponding word line select signals WXBa, WXAa to WXBd, WXAd, respectively.

Dummy word lines DWLB0 and DWLB1 are coupled to ground node, respectively, through N-channel MOS transistors 118*b* and 117*b* that are selectively made conductive in response to the output signal of inversion circuit 116*b* receiving B-port word line select signal XBp.

In the configuration of B-port dummy circuit 70B shown in FIG. 28, when either one of word lines WLBa to WLBd is selected, the selected B-port word line is electrically coupled to dummy word line DWLB0. Therefore, it is possible to set the potential change of dummy word line DWLB0 to be equal to that of the selected B-port word line. When word lines in the same row are simultaneously selected, dummy word line DWLB1 is electrically coupled to the selected A-port word lines and it is possible to set the potential change of dummy word line DWLB1 to be equal to the potential change of the selected A-port word line.

Therefore, even if the bit and word configuration of the memory array is changed, the potentials of dummy word lines DWLB0 and DWLB1 can be changed accurately following the potential changes of the word lines. Driving timings for driving dummy bit lines DBLB and ZDBLB by dummy cells TDM can be made equal to those for driving normal bit lines by normal memory cells.

Moreover, by exchanging B-port word lines WLBa to WLBd in position with A-port word lines WLAa to WLAd in the configuration of B-port dummy circuit 70B shown in FIG. 28, the configuration of an A-port dummy circuit can be obtained. It is noted that subscript "b" is added to each reference numeral of each components in FIG. 28, so as to indicate that these components are those in B-port dummy circuit 70B.

Further, in the configuration shown in FIG. 28, B-port word line group select signal XBp can be replaced by the precharge signal.

In addition, P-channel MOS transistors 120*ba* to 120*bd* each can be replaced by a CMOS transmission gate and same row select detection circuits 122*ba* to 122*bd* each can be formed of CMOS transmission gates connected in series.

As described above, according to the tenth embodiment of the present invention, upon selection of a word line, a selected word line is electrically coupled to the dummy word line and therefore, the voltage change of the dummy word line can be made equal to that of the selected word line. Even if the potential changing rate of the word line changes according to the change of the array architecture, the potential of the dummy word line can be changed in accordance with the potential change of the selected word line. Thus, driving timing for driving dummy bit lines by dummy cells can be made accurately equal to the driving timing for driving the normal bit lines.

Eleventh Embodiment

Figure 29:
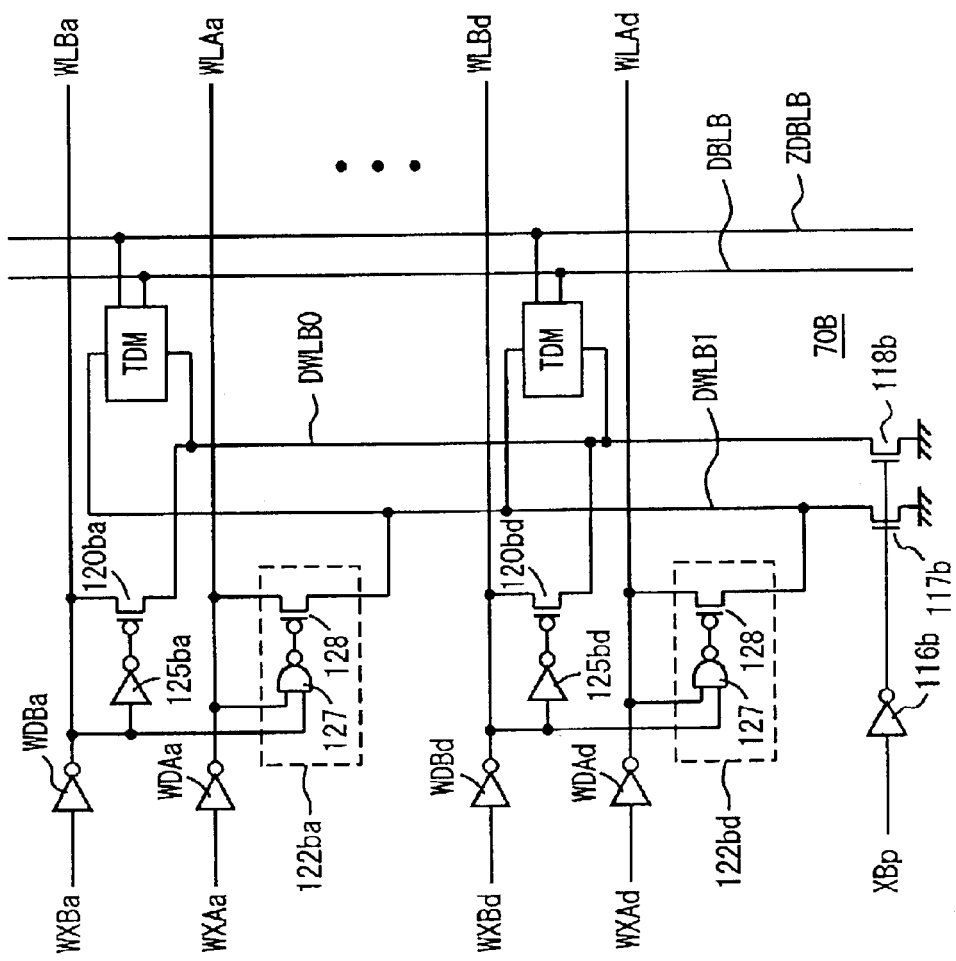
FIG. 29 shows the configuration of a B-port dummy circuit according to an eleventh embodiment of the present invention.

FIG. 29 shows the configuration of B-port dummy circuit 70B according to an eleventh embodiment of the present invention. The configuration of B-port dummy circuit 70B shown in FIG. 29 differs from B-port dummy circuit 70B shown in FIG. 28 in the following points. The output signals of inversion circuits 125*ba* to 125*bd* that receive word line drive signals on B-port word lines WLBa to WLBd are applied to the gates of P-channel MOS transistors 120*ba* to 129*bd* that couple dummy word line DWLB0 to B-port word lines WLBa to WLBd, respectively.

Further, each of same row select detection circuits 122*ba* to 122*bd* includes: a NAND circuit 127 receiving a word line drive signal on a word line in a corresponding row; and a P-channel MOS transistor 128 selectively made conductive in accordance with an output signal of NAND circuit 127 and coupling a corresponding one of A-port word lines WXAa to WXAd to dummy word line DWLB1 when conductive.

The other components of B-port dummy circuit 70B shown in FIG. 29 are the same to those shown in FIG. 28. The corresponding parts are denoted by the same reference numerals as those in FIG. 28, and the detailed description thereof will not be repeated.

In the configuration of B-port dummy circuit 70B shown in FIG. 29, when word lines in the same row are simultaneously selected, the selected A-port word line (any of WLAa to WLAd) is electrically coupled to dummy word line DWLB1 through one MOS transistor 128. Therefore, it is possible to reduce a parasitic resistance between the selected A-port word line and dummy word line DWLB1, and therefore, dummy word line DWLB1 can be driven accurately following the potential change of the selected A-port word line.

It is noted that the operation of B-port dummy circuit 70B shown in FIG. 29 is the same as that of B-port dummy circuit 70B shown in FIG. 28 and the similar effects to those in the tenth embodiment can be achieved. Besides, the tracability of the potential of dummy word line DWLB1 on the potential of the selected A-port word line can be further improved.

Inversion circuits 125*ba* to 125*bd* are provided for matching the delay of the driving of dummy word line DWLB0 with the gate delays of NAND circuits 127 of same row select detection circuits 122*ba* to 122*bd* and to adjust the logic levels of control signals to MOS transistors 120*ba* to 120*bd*.

B-port word line select signals WXBa to WXBd, instead of output signals of inversion circuits 125*ba* to 125*bd*, may be applied to P-channel MOS transistors 120*ba* to 120*bd*, respectively in the configuration shown in FIG. 29. In addition, corresponding sets of word line select signals in word line select signals WXAa, WXBa to WXBd, WXAd may be applied to same row select detection circuits 122*ba* to 122*bd*, respectively.

By exchanging in position word lines WLBa to WLBd with A-port word lines WLAa to WLAd in the configuration shown in FIG. 29, the configuration for an A-port dummy circuit can be obtained.

Modification

Figure 30:
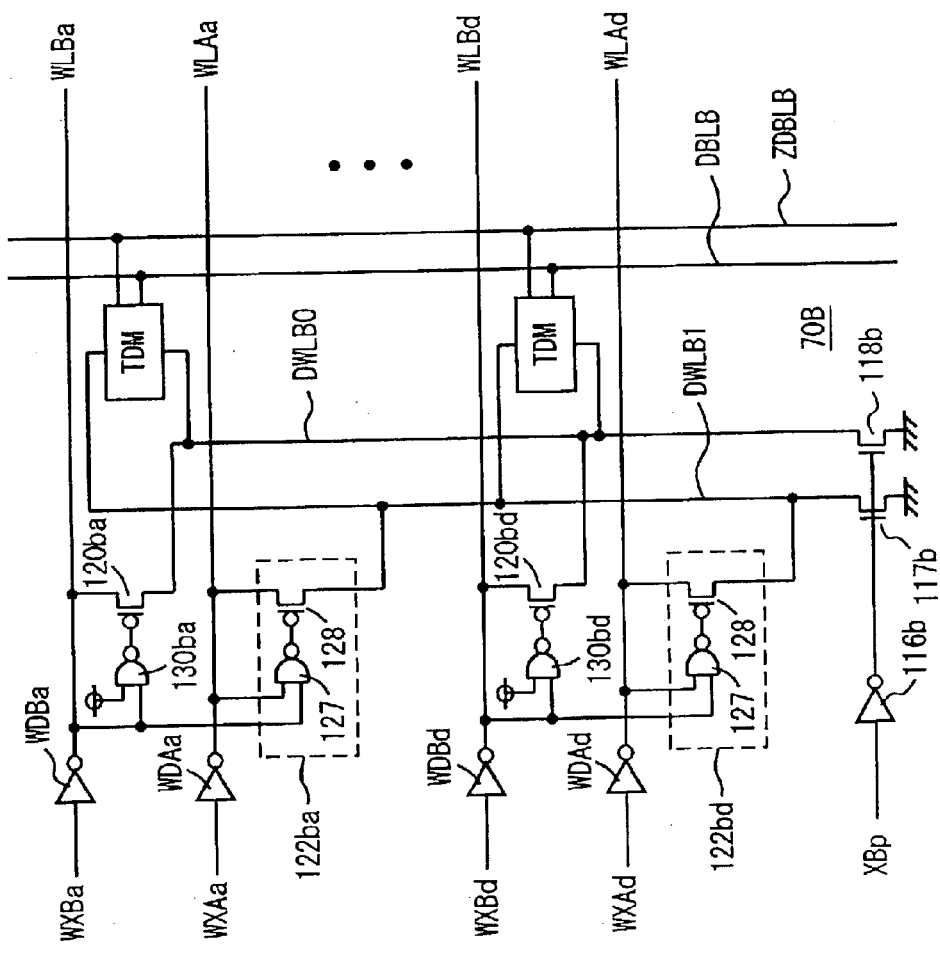
FIG. 30 shows an example modification of the B-port dummy circuit according to the eleventh embodiment of the present invention.

FIG. 30 shows the configuration of B-port dummy circuit 70B according to a modification of the eleventh embodiment of the present invention. The configuration of B-port dummy circuit 70B shown in FIG. 30 differs from that of B-port dummy circuit 70B shown in FIG. 29 in the following points. Inversion circuits 125*ba* to 125*bd* receiving word line drive signals on B-port word lines WLBa to WLBd are replaced by 2-input NAND circuits 130ba to 130bd having first inputs coupled to power supply node and second inputs receiving corresponding word line drive signals, respectively. The other components of B-port dummy circuit 70B shown in FIG. 30 are the same as those shown in FIG. 29. Corresponding components are denoted by the same reference numerals as those in FIG. 29 and the detailed description thereof will not be repeated.

In the configuration of B-port dummy circuit 70B shown in FIG. 30, NAND circuits 130ba to 130bd are coupled to B-port word lines WLBa to WLBd, and NAND circuits 127 are coupled to A-port word lines WLAa to WLAd, respectively. Therefore, the loads of word lines WLBa to WLBd and WLAa to WLAd are equal to each other, so that the potential change of a selected word line can be made equable whichever of the A port and the B port makes an access.

In this configuration, word line select signals, instead of the word line drive signals, may be employed as dummy word line drive control signals.

Figure 31:
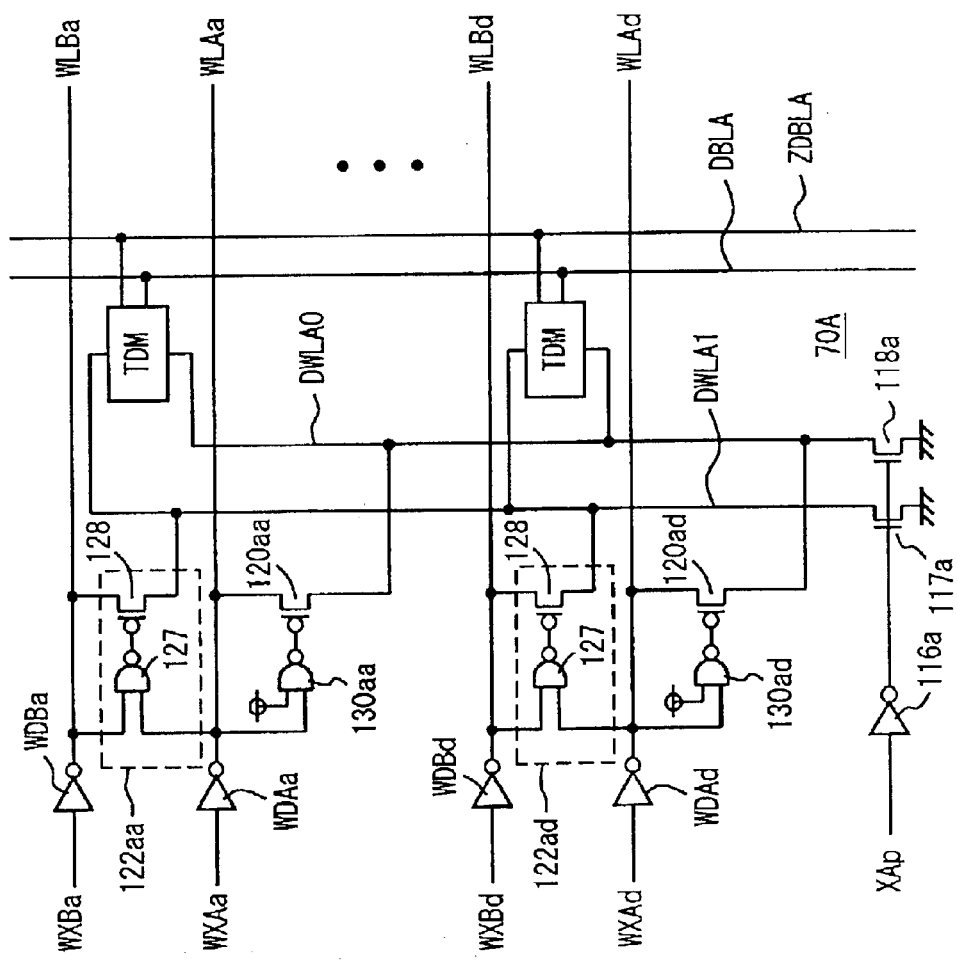
FIG. 31 shows the configuration of an A-port dummy circuit according to an example modification of the eleventh embodiment of the present invention.

FIG. 31 shows the configuration of A-port dummy circuit 70A according to the modification of the eleventh embodiment of the present invention. In FIG. 31, A-port dummy circuit 70A includes: 2-port dummy cells TDM arranged in four rows and one column; dummy word lines DWLA0 and DWLA1 commonly provided to 2-port dummy cells TDM of 4 bits; and dummy bit lines DBLA and ZDBLA commonly coupled to all dummy cells TDM. The connection of 2-port dummy cells TDM to dummy word lines DWLA0, DWLA1 and to dummy bit lines DBLA and ZDBLA is the same to that shown in FIG. 19.

In A-port dummy circuit 70A, a same row select detection circuit 122aa is provided in correspondence to a set of word lines WLBa and WLAa, and a same row select detection circuit 122ad is provided in correspondence to a set of word lines WLBd and WLAd. Each of same row select detection circuits 122aa and 122ad includes: NAND circuit 127 receiving a word line drive signal on a corresponding word line; and a P-channel MOS transistor 128 selectively made conductive in accordance with an output signal of NAND circuit 127 and coupling the word line drive signal on the corresponding B-port word line to dummy word line DWLA1 when made conductive.

A-port dummy circuit 70A further includes: NAND circuits 130aa to 130ad receiving, at first inputs, the word line drive signals on corresponding A-port word lines WLAa to WLAd, and coupled, at second inputs, electrically to a power supply node; and P-channel transistors 120aa to 120ad electrically coupling corresponding A-port word lines WLAa to WLAd to dummy word line DWLA0 in accordance with output signals of NAND circuits 130aa to 130ad, respectively.

Dummy word line DWLA0 is coupled to a ground node through an N-channel MOS transistor 118a selectively made conductive in response to the output signal of an inversion circuit 116a which in turn receives A-port word line group select signal XAp. Dummy word line DWLA1 is coupled to a ground node through an N-channel MOS transistor 117a selectively made conductive in response to the output signal of inversion circuit 116a.

In the configuration of A-port dummy circuit 70A shown in FIG. 31, A-port word lines WLAa to WLAd are driven by word line drivers WDAa to WDAd receiving A-port word line select signals WXAa to WXAd, and B-port word lines WLBa to WLBd are driven by word line drivers WDBa to WDBd receiving B-port word line select signals WXBa to WXBd, respectively, as in B-port dummy circuit 70B.

When either of A-port word lines WLAa to WLAd is selected, the selected A-port word line is coupled to dummy word line DWLA0 through a corresponding one of MOS transistors 120aa to 120ad. In addition, since the output signal of inversion circuit 116a is at L level and MOS transistor 118a is nonconductive, the voltage level of dummy word line DWLA0 rises. Accordingly, dummy bit line DBLA is discharged by 2-port dummy cells TDM of 4 bits.

If the same row is accessed from the B port and the A port, one of same row select detection circuits 122aa to 122ad couple the selected B-port word line to dummy word line DWLA1. As a result, dummy bit line ZDBLA is discharged by 2-port dummy cells TDM of 4 bits.

Therefore, A-port dummy circuit 70A is the same in circuit configuration to B-port dummy circuit 70B shown in FIG. 30. By changing interconnection connection, both of A-port dummy circuit 70A and B-port dummy circuit 70B can be formed.

In the configuration of the modification as well, word line select signals may be employed for detecting word line selection, in place of the word line drive signals.

As described above, according to the eleventh embodiment of the present invention, simultaneous selection of the B-port word line and the A-port word line arranged in the same row is detected and according to the detection result, a word line of counterpart word line is connected to the dummy word line to couple the storage node of a 2-port dummy cell to the complementary dummy bit lines. Therefore, the potential change of the dummy word line can be made to follow the potential change of the selected word line, and accordingly, the potential change start timing for the dummy bit line can be made equal to the potential change start timing of the normal bit lines, to allow accurate detection of a sense timing.

Twelfth Embodiment

Figure 32:
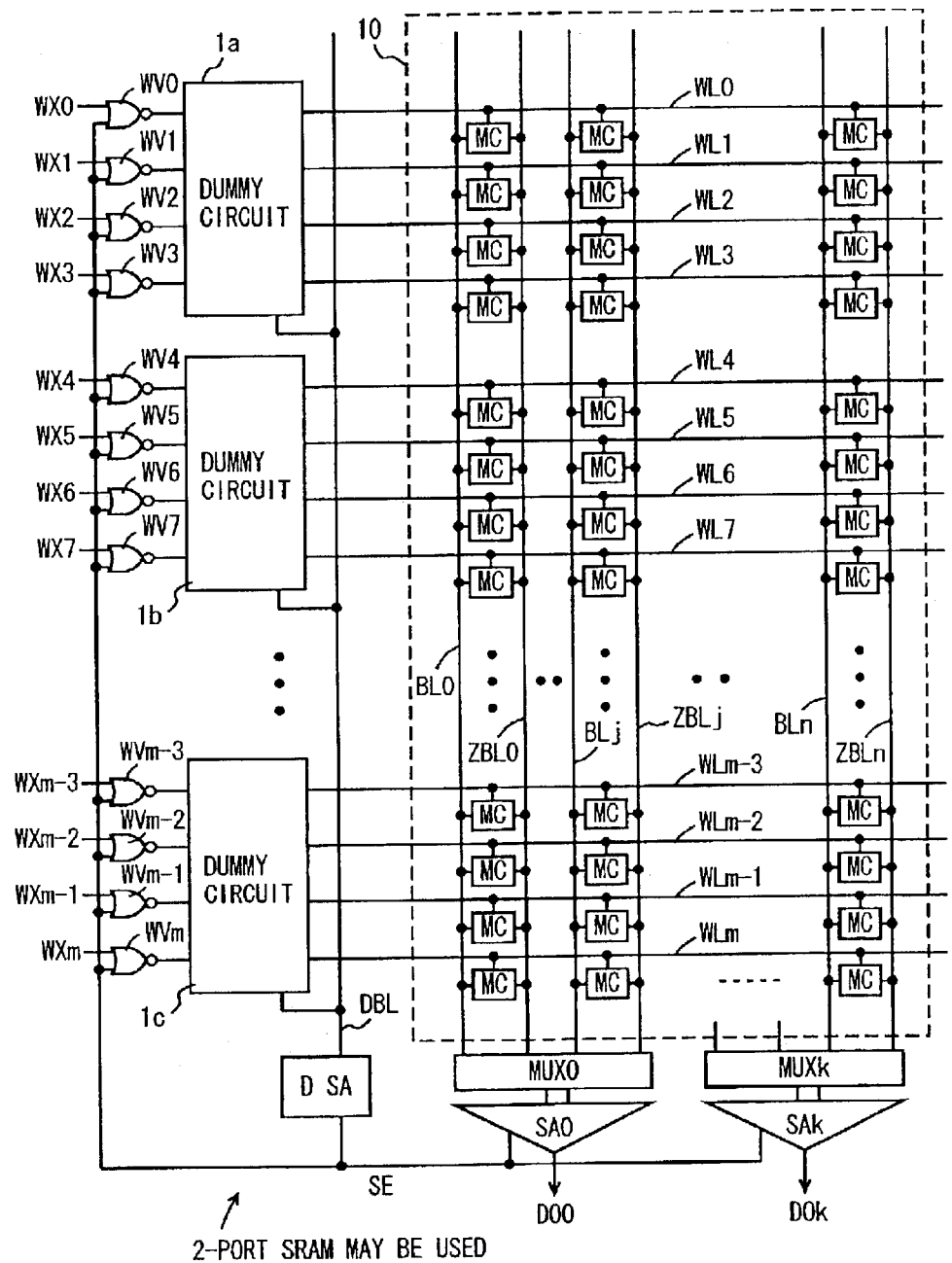
FIG. 32 is a schematic diagram showing the configuration of a main part of a semiconductor memory device according to a twelfth embodiment of the present invention.

FIG. 32 is a schematic diagram showing the configuration of a semiconductor memory device according to a twelfth embodiment of the present invention. The configuration of the semiconductor memory device shown in FIG. 32 differs from that of the semiconductor memory device shown in FIG. 1 in the following points. Word line drivers WV0 to WVm arranged in correspondence to word lines WL0 to WLm are formed of NOR circuits receiving corresponding word line select signals WX0 to WXm at first inputs, respectively, and sense enable signal SE from dummy sense amplifier DSA at second inputs. Since the other components of the semiconductor memory device shown in FIG. 32 are the same as those shown in FIG. 1, corresponding parts are denoted by the same reference numerals, respectively and detailed description thereof will not be repeated.

Word line drivers WV0 to WVm, similarly to word line drivers WD0 to WDm shown in FIG. 1, operate as inverters when sense enable signal SE is deactivated. When sense enable signal SE rises to H level, word line drivers WV0 to WVm drive their output signals to L level, irrespectively of the states of the corresponding word line select signals, and the selected word line is driven into an unselected state, accordingly.

Figure 33:
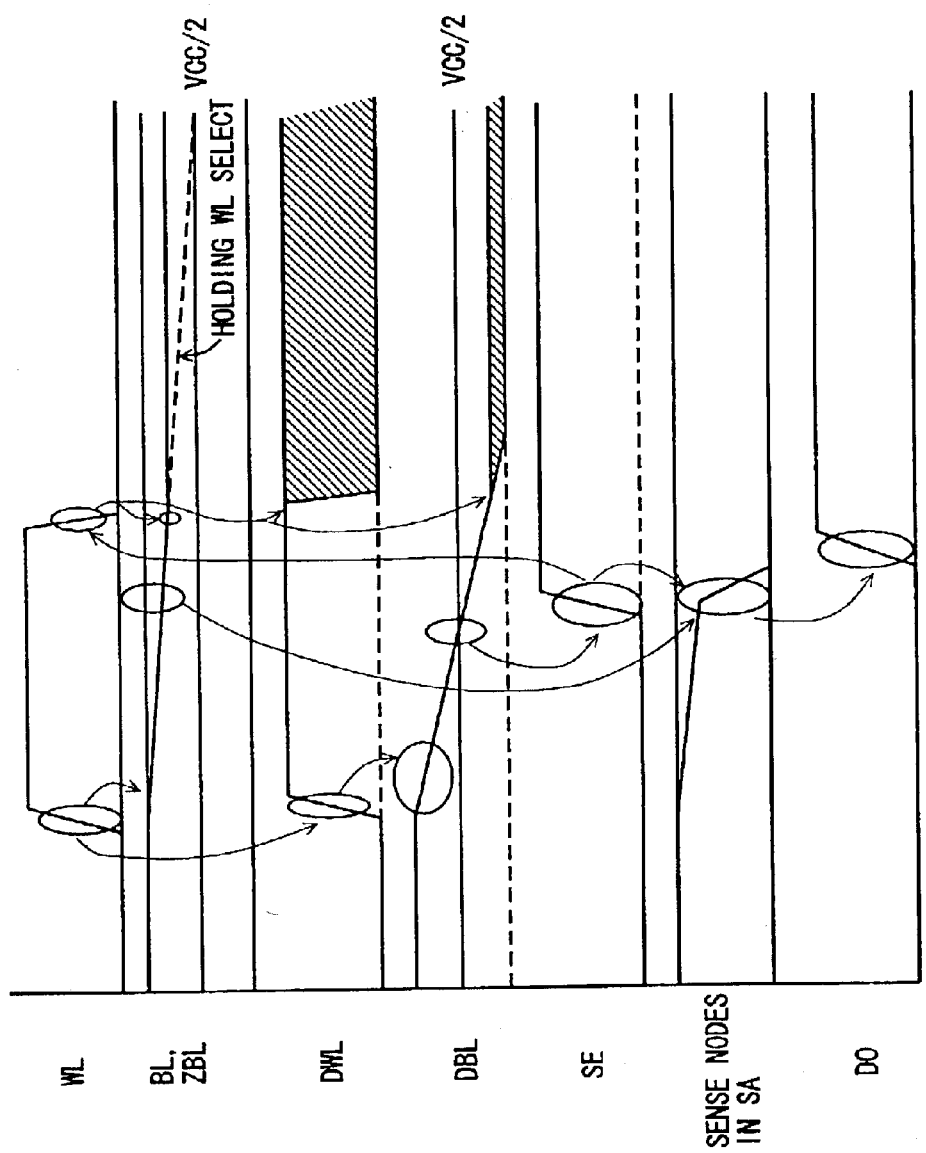
FIG. 33 is a signal waveform diagram representing an operation of the semiconductor memory device shown in FIG. 32.
Figure 34:
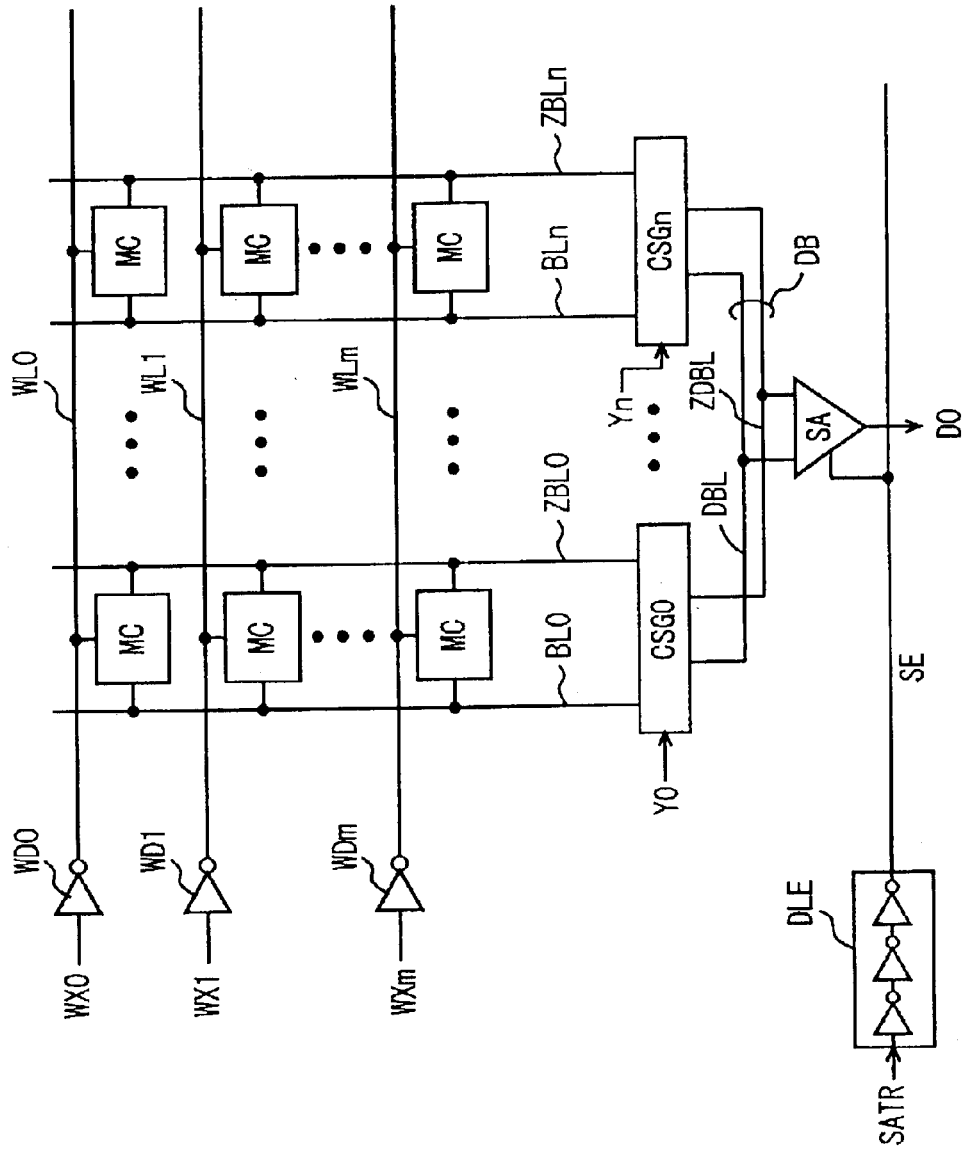
FIG. 34 is a schematic diagram showing the configuration of a main part of a conventional SRAM.

FIG. 33 is a signal waveform diagram representing an operation of the semiconductor memory device shown in FIG. 32. Referring to FIG. 33, the operation of the semiconductor memory device shown in FIG. 32 will be described.

In a standby state, sense enable signal SE is at Le level and word line drivers WV0 to WVm operate as inverters. In the standby state, word line selects signals WX0 to WXm are all at H level and word lines WL0 to WLm are in an unselected state. Dummy bit line DBL and normal bit lines BL, ZBL are precharged to power supply voltage VCC level by precharge circuits, not shown.

When a clock signal, for example, rises and a memory select cycle starts, either one of word line select signals WX0 to WXm is driven into a selected state in accordance with an applied X address signal. Accordingly, the output signal (word line drive signal) of word driver arranged corresponding to the selected row among the word line drivers WV0 to WVm attains H level, and the voltage levels of word line WL (one of WL0 to WLm) arranged in correspondence to the selected row rises, accordingly. Subsequent to the potential rise of selected word line WL, the storage nodes of memory cells MC in one row connected to selected word line WL are coupled to bit lines BL and ZBL and the potential of one of normal bit lines BL and ZBL lowers according to the stored data.

On the other hand, in accordance with the selection of word line WL, dummy word line DWL is driven into a selected state in the dummy circuit arranged in correspondence to the selected row, dummy bit line DBL is driven by a plurality of dummy cells and the potential of dummy bit line DBL lowers faster than the potential of the normal bit line lowers.

When the voltage level of dummy bit line DBL reaches the predetermined voltage level (e.g., VCC/2), sense enable signal SE from dummy sense amplifier DSA attains H level.

The potential changes of bit line pairs in the selected columns are transmitted to sense amplifiers SA0 to SAk by corresponding multiplexers MUX0 to MUXk, respectively In accordance with sense enable signal SE, sense amplifiers SA0 to SAk are activated, whereby sense amplifiers SA0 to SAk differentially amplify and latch the potential differences between the associated sense nodes and generate internal read data DO0 to DOk in accordance with the latched data, respectively.

On the other hand, in response to the activation of sense enable signal SE, the output signals of word line drivers WV0 to WVm are fixed to L level, the voltage level of selected word line WL lowers to L level, the storage nodes of the memory cells connected to the selected word line are disconnected from normal bit lines BL and ZBL. In this case, therefore, a drop in the potentials of normal bit lines BL and ZBL are stopped and the potentials of normal bit lines BL and ZBL are kept at voltage level when selected word line WL transitions into an unselected state.

The voltages of dummy word line DWL and dummy bit line DBL are changed in various manners depending on the circuit configuration of dummy circuits 1a to 1c. For example, dummy word line DWL is maintained in a selected state and dummy bit line DBL is continuously discharged. Alternatively, dummy word line DWL transitions into an unselected state in accordance with transition of selected word line WL into an unselected state, and accordingly, the discharging of dummy bit line DBL is stopped.

In any case, the potential dropping on normal bit lines BL and ZBL are stopped. Therefore, in transition to the precharge state by activation of the precharge signal after completion of memory cell selecting operation, bit line BL or ZBL can be precharged to power supply voltage VCC level at high speed. In addition, the potential amplitudes of normal bit lines BL and ZBL can be decreased to reduce the charging currents of the bit lines and therefore current consumption.

Further, FIG. 32 shows the configuration of a single-port SRAM. However, by controlling the A-port word line drivers and the B-port word line drivers using the A-port sense enable signal and the B-port sense enable signal, respectively, the similar effects to those in single-port SRAM can be achieved in 2-port SRAM.

Therefore, the configuration of driving the selected word line into an unselected state in response to activation of the sense enable signal can be similarly applied to each of the first to eleventh embodiments.

Further, a delay adjustment circuit which adjusts a timing for driving the selected word line into an unselected state may be arranged at the output of dummy sense amplifier DSA.

As described above, according to the twelfth embodiment of the present invention, the selected word line is driven into an unselected state in response to activation of the sense enable signal. It is therefore possible to decrease the potential differences of at least the normal bit lines and to thereby reduce current consumption required in charging the bit lines.

Other Application

In the above description, an SRAM is described as a semiconductor memory device. However, the present invention is applicable to any semiconductor memory device, provided that the potential change of a bit line generated by current flowing through bit lines is detected using the sense amplifier in such memory device. As such a semiconductor memory device, for example, a nonvolatile semiconductor memory device can be considered in which the amount of a current flowing through bit line differs according to the storage data of a memory cell, and memory cell data is read by detecting the potential of the bit line in data read.

Further, in the dummy circuit, dummy bit lines are driven utilizing the dummy cells arranged in four rows and one column. However, the number of dummy cells included in one dummy circuit can be any. It suffices that a timing for activating a sense amplifier can be set at the optimum bit line potential difference among the bit line potential differences which can be sensed by the sense amplifier.

Furthermore, the potential detected by the dummy sense amplifier for activating the sense amplifier is not limited to the intermediate potential of VCC/2, but may be other potential.

As described above, according to the present invention, the dummy cells are arranged in correspondence to the respective rows and the dummy bit line is driven in accordance with a selected normal word line in a unit of a predetermined number of dummy cells. The timing for activating the sense amplifier is determined according to the potential of the dummy bit line. Therefore, it is possible to activate the sense amplifier at an optimum timing, irrespectively of the memory array architecture.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
   a plurality of normal memory cells arranged in rows and columns;
   a plurality of normal word lines, arranged in correspondence to the rows of normal memory cells, each having the normal memory cells on a corresponding row connected;
   a plurality of dummy cells, arranged corresponding to and separate from the normal word lines and arranged in alignment in at least one column in a column direction, each for storing data of a predetermined logic level;

at least one dummy bit line arranged in correspondence to the at least one column of said plurality of dummy cells, and connecting to the dummy cells on corresponding column(s);

a plurality of dummy cell select circuits each arranged in correspondence to a predetermined number of the normal word lines, each for driving, when any of corresponding normal word lines of the predetermined number is selected, the predetermined number of the dummy cells arranged correspondingly into a selected state; and a dummy sense circuit for detecting a potential of the dummy bit line, and generating a sense activation signal providing a timing for sensing data of selected normal memory cells in accordance with a result of detection.

2. The semiconductor memory device according to claim 1, wherein each of the dummy cell select circuits includes:

a dummy word line commonly coupled to the predetermined number of the corresponding dummy cells arranged correspondingly; and a dummy word line drive circuit for driving said dummy word line into a selected state in accordance with select signals for corresponding normal word lines.

3. The semiconductor memory device according to claim 2, wherein said dummy word line drive circuit includes a logic gate receiving signals on the corresponding normal word lines of the predetermined number.

4. The semiconductor memory device according to claim 2, wherein said dummy word line drive circuit includes a logic gate receiving word line select signals for selecting the corresponding predetermined number of the normal word lines.

5. The semiconductor memory device according to claim 2, wherein said dummy word line drive circuit includes:

a precharge circuit for driving a signal line to a first voltage level when the corresponding predetermined number of the normal word lines are in an unselected state;

a select detection circuit for driving said signal line to a second voltage level when either one of said corresponding predetermined number of the normal word lines is selected; and a select circuit for driving said dummy word line into a selected state in accordance with a signal of said second voltage level on said signal line.

6. The semiconductor memory device according to claim 5, wherein said select detection circuit includes a drive transistor arranged in correspondence to each of the corresponding predetermined number of the normal word lines, for driving said signal line to said second voltage level when a corresponding normal word line is selected.

7. The semiconductor memory device according to claim 1, wherein each dummy cell select circuit includes:

a signal line;

a dummy word line commonly arranged to the predetermined number of dummy cells arranged correspondingly;

a precharge circuit for driving said signal line to a first voltage level in accordance with a normal word line block select signal for selecting a set of the corresponding predetermined number of normal word lines;

a select circuit for driving said signal line to a second voltage level when either one of said corresponding predetermined number of the normal word line is selected; and a driver for driving said dummy word line into a selected state in accordance with a signal of the second voltage level on said signal line.

8. The semiconductor memory device according to claim 7, wherein said select circuit includes a drive transistor arranged in correspondence to each of the predetermined number of the normal word lines, for driving said signal line to said second voltage level when a corresponding normal word line is selected.

9. The semiconductor memory device according to claim 1, wherein each dummy cell select circuit includes:

a dummy word line commonly arranged to corresponding predetermined number of dummy cells;

a precharge circuit for setting a signal line at a first voltage level in accordance with an operation cycle defining signal;

a select circuit for driving said signal line to a second voltage level when either one of corresponding predetermined number of the normal word line is selected; and a driver for selectively driving said dummy word line into a selected state in accordance with a signal on said signal line.

10. The semiconductor memory device according to claim 9, wherein said operation cycle defining signal is a bit line precharge instruction signal for instructing precharging bit lines arranged corresponding to the columns of the normal memory cells to a predetermined potential.

11. The semiconductor memory device according to claim 9, wherein said each dummy cell select circuit further includes a latch transistor for maintaining said signal line at said first voltage level in accordance with the signal on said dummy word line.

12. The semiconductor memory device according to claim 1, wherein each dummy cell select circuit includes:

a dummy word line commonly arranged to said predetermined number of dummy cells arranged correspondingly, and connecting to said predetermined number of the dummy cells; and a signal transmission circuit for electrically coupling a selected normal word line of said predetermined number of the normal word lines arranged correspondingly to said dummy word line.

13. The semiconductor memory device according to claim 12, wherein said signal transmission circuit includes a pass transistor arranged in correspondence to each of said predetermined number of the normal word lines arranged correspondingly, for coupling a corresponding normal word lines to said dummy word line when the corresponding normal word line is selected.

14. The semiconductor memory device according to claim 12, wherein said each dummy cell select circuits further includes a reset circuit for maintaining said dummy word line in an unselected state when said predetermined number of the normal word lines arranged correspondingly are unselected.

15. The semiconductor memory device according to claim 1, further comprising:

a circuit for setting the normal word lines into an unselected state in response to said sense activation signal.

16. A semiconductor memory device accessible through a plurality of ports, comprising:

a plurality of normal memory cells arranged in rows and columns;

a plurality of first port normal word lines arranged in correspondence to the rows of the normal memory cells and connecting to the normal memory cells on corresponding rows, the first port normal word lines being selected in accordance with an address signal in an access through a first port among said plurality of ports;

a plurality of second port normal word lines arranged in correspondence to the rows of the normal memory cells and connecting to the normal memory cells on corresponding rows, the second port normal word lines being selected in accordance with an address signal in an access through a second port among said plurality of ports;

a plurality of first dummy cells arranged corresponding to and separate from the respective first port normal word lines, and arranged in alignment in at least one column in a column direction;

a plurality of second dummy cells arranged corresponding to and separate from the respective second port normal word lines, and arranged in alignment in at least one column in the column direction;

a first dummy bit line arranged in correspondence to the first dummy cells aligned on the one column, and connecting commonly to said first dummy cells on corresponding rows;

a second dummy bit line arranged in correspondence to the second dummy cells on the one column, and connecting to the second dummy cells being commonly connected to the second dummy bit line;

a plurality of first dummy cell select circuits each arranged in correspondence to a predetermined number of the first port normal word lines, and each for driving a corresponding set of the first dummy cells of the predetermined number into a selected state when either one of corresponding first port normal word lines is selected, to drive said first dummy bit line;

a plurality of second dummy cell select circuits each arranged in correspondence to a predetermined number of the second port normal word lines, and each driving a corresponding set of the second dummy cells of the predetermined number into the selected state when either one of corresponding second port normal word lines is selected, to drive said second dummy bit line;

a first dummy sense circuit responsive to a voltage on said first dummy bit line, for generating a first sense amplifier activation signal for activating a first sense amplifier for reading normal memory cell data accessed through said first port; and a second dummy sense circuit responsive to a voltage on the second dummy bit line, for generating a second sense amplifier activation signal for activating a second sense amplifier for reading normal memory cell data accessed through said second port.

17. The semiconductor memory device according to claim 16, wherein each first dummy cells includes first and second port access transistors coupled to corresponding first and second dummy word lines, respectively, the first and second dummy word lines are commonly coupled to the predetermined number of the first dummy cells, each first dummy cell select circuits includes:

a select circuit for coupling a storage node of each corresponding first dummy cell to said first dummy bit line through the first port access transistors when either one of the predetermined number of the corresponding first port normal word lines is selected; and a circuit for coupling said storage node to a first sub-dummy bit line through the second port access transistor of each of the predetermined number of corresponding first dummy cells when a first port normal word line and a second port normal word line on a common row in corresponding sets of the first and second normal word lines are both selected, said first sub-dummy bit line being commonly arranged to said plurality of first dummy cells.

18. The semiconductor memory device according to claim 16, wherein each second dummy cells includes first and second port access transistors coupled to corresponding first and second dummy word lines, respectively, the first and second dummy word lines are commonly coupled to the predetermined number of the second dummy cells, each second dummy cell select circuits includes:

a select circuit for coupling a storage node of each corresponding second dummy cell to said second dummy bit line through the second port access transistors when either one of the predetermined number of the corresponding second port normal word lines is selected; and a circuit for coupling said storage node to a second sub-dummy bit line through the first port access transistor of each of the predetermined number of corresponding second dummy cells when a first port normal word line and a second port normal word line on a common row in corresponding sets of the first and second normal word lines are both selected, said second sub-dummy bit line being commonly arranged to said plurality of second dummy cells.

19. The semiconductor memory device according to claim 16, wherein each first dummy cell select circuits includes:

first and second dummy word lines commonly coupled to corresponding predetermined number of first dummy cells;

a first circuit for driving the first dummy word line into a selected state when either one of corresponding first port normal word lines is selected; and a second circuit for driving the second dummy word line into the selected state when a first port normal word line and a second port normal word line arranged on a common row in corresponding predetermined number of first port normal word lines and corresponding predetermined number of second port normal word lines are both selected, each first dummy cells includes:

a first access transistor for coupling a storage node to said first dummy bit line when said first dummy bit line is driven into a selected state; and a second access transistor for coupling said storage node to a sub-dummy bit line when said second dummy word line is driven into the selected state, said sub-dummy bit line being commonly coupled to said plurality of first dummy cells.

20. The semiconductor memory device according to claim 16, wherein each second dummy cell select circuits includes:

first and second dummy word lines commonly coupled to corresponding predetermined number of second dummy cells;

a first circuit for driving the second dummy word line into a selected state when either one of corresponding second port normal word lines is selected; and a second circuit for driving the second dummy word line into the selected state when a first port normal word line and a second port normal word line arranged on a common row in corresponding predetermined number of first port normal word lines and corresponding predetermined number of second port normal word lines are both selected, each second dummy cells includes:

a first access transistor for coupling a storage node to said second dummy bit line when said first dummy bit line is driven into a selected state; and a second access transistor for coupling said storage node to a sub-dummy bit line when said second dummy word line is driven into the selected state, said sub-dummy bit line being commonly coupled to said plurality of second dummy cells.

* * * * *